US012635218B2

(12) United States Patent
Na et al.

(10) Patent No.: US 12,635,218 B2
(45) Date of Patent: May 19, 2026

(54) SEMICONDUCTOR DEVICE COMPRISING ALIGNMENT KEY

(71) Applicant: Samsung Electronics Co., Ltd., Suwon-si (KR)

(72) Inventors: Hyungjoo Na, Suwon-si (KR); Woo Bin Song, Suwon-si (KR); Jin-Wook Yang, Suwon-si (KR); Cheoljin Yun, Suwon-si (KR); Yoshinao Harada, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 360 days.

(21) Appl. No.: 18/224,864

(22) Filed: Jul. 21, 2023

(65) Prior Publication Data

US 2024/0204068 A1    Jun. 20, 2024

(30) Foreign Application Priority Data

Dec. 14, 2022    (KR) ......................... 10-2022-0174700

(51) Int. Cl.
*H10D 64/23*        (2025.01)
*H01L 23/48*        (2006.01)
(Continued)

(52) U.S. Cl.
CPC ......... *H10D 64/258* (2025.01); *H01L 23/481* (2013.01); *H10D 30/43* (2025.01); (Continued)

(58) Field of Classification Search
CPC ........... H10D 30/6735; H10D 30/6757; H10D 62/121; H10D 64/258; H10D 30/43; (Continued)

(56) References Cited

U.S. PATENT DOCUMENTS 7,656,008 B2 *  2/2010  Hwang ................ H10D 84/811
                                                257/536
9,362,355 B1 *  6/2016  Cheng ................... H01L 21/283
(Continued)

FOREIGN PATENT DOCUMENTS

KR     10-2022-0109897 A      8/2022

*Primary Examiner* — Maliheh Malek
(74) *Attorney, Agent, or Firm* — Sughrue Mion, PLLC

(57)    ABSTRACT

A semiconductor device includes a substrate including an active pattern, a channel pattern on the active pattern, the channel pattern including a plurality of semiconductor patterns that are spaced apart from each other and are vertically stacked, a source/drain pattern connected to the plurality of semiconductor patterns, a through pattern penetrating the source/drain pattern, a metal-semiconductor compound layer between the source/drain pattern and the through pattern, a gate electrode on the plurality of semiconductor patterns, the gate electrode including inner electrodes between adjacent semiconductor patterns of the plurality of semiconductor patterns and an outer electrode on an uppermost semiconductor pattern of the plurality of semiconductor patterns, an active contact on the through pattern, and a first metal layer on the active contact, the first metal layer including a power wiring and first wirings connected to the active contact.

20 Claims, 42 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/66* | (2025.01) |
| *H10D 84/85* | (2025.01) |

(52) U.S. Cl.
CPC ..... *H10D 30/6729* (2025.01); *H10D 30/6735* (2025.01); *H10D 30/6757* (2025.01); *H10D 62/121* (2025.01); *H10D 64/665* (2025.01); *H10D 64/668* (2025.01); *H10D 84/85* (2025.01)

(58) Field of Classification Search
CPC ............. H10D 30/6729; H10D 64/665; H10D 64/668; H10D 30/014; H10D 62/151; H10D 64/251; H10D 64/254; H10D 64/256; H10D 84/017; H10D 30/6713; H10D 62/378; H10D 64/529; H10D 84/40–409; H10D 84/80–859; H10D 84/0109; H10D 84/0123–0195; H01L 23/485; H01L 21/76831; H01L 23/535; H01L 21/743; H01L 23/528; H01L 2225/1052; H01L 2225/06548; H01L 23/481; H01L 21/28518; H01L 21/76805; H01L 21/76897; H01L 21/76898; H01L 23/5286; H01L 23/5226; H01L 23/5283
See application file for complete search history.

(56) References Cited

U.S. PATENT DOCUMENTS

| | | | | |
|---|---|---|---|---|
| 9,773,913 | B1 * | 9/2017 | Balakrishnan ..... | H10D 30/6757 |
| 9,972,692 | B2 * | 5/2018 | Choi ................. | H10D 84/0186 |
| 10,096,688 | B2 * | 10/2018 | Tak ..................... | H10D 30/014 |
| 10,170,638 | B1 * | 1/2019 | Reznicek ............ | H10D 62/151 |
| 10,217,816 | B2 * | 2/2019 | Bhuwalka ........... | H10D 30/014 |
| 10,325,840 | B2 * | 6/2019 | Nelson ............... | H01L 23/5286 |
| 10,559,656 | B2 * | 2/2020 | Bourjot ............. | H10D 30/6713 |
| 10,580,788 | B2 * | 3/2020 | Zhu ................... | H01L 21/76802 |
| 10,699,956 | B2 * | 6/2020 | Chiang ............... | H10D 30/797 |
| 10,714,579 | B2 * | 7/2020 | Lee .................. | H10D 64/018 |
| 10,714,585 | B2 * | 7/2020 | Zhou .................. | H01L 21/0214 |
| 10,714,592 | B2 * | 7/2020 | Cheng ................. | H10D 84/038 |
| 10,879,379 | B2 * | 12/2020 | Chung .................. | H10D 64/01 |
| 10,892,215 | B2 | 1/2021 | Nelson et al. | |
| 10,930,649 | B2 * | 2/2021 | Kang ............... | H10D 30/43 |
| 11,158,543 | B2 * | 10/2021 | Wu .................. | H01L 21/26513 |
| 11,211,457 | B2 * | 12/2021 | Choi .................. | H10D 62/314 |
| 11,264,393 | B2 * | 3/2022 | Chen ................ | H01L 21/76816 |
| 11,349,004 | B2 * | 5/2022 | Yu .................. | H10D 30/014 |
| 11,574,922 | B2 * | 2/2023 | Zhang .................. | H10B 43/27 |
| 11,677,010 | B2 * | 6/2023 | Chiang ............... | H10D 62/151 |
| | | | | 438/85 |
| 11,715,712 | B2 * | 8/2023 | Hwang ................ | H01L 23/562 |
| | | | | 257/777 |
| 11,923,363 | B2 * | 3/2024 | Frougier ............... | H10D 88/00 |
| 11,978,770 | B2 * | 5/2024 | Ko ..................... | H10D 30/6757 |
| 12,154,988 | B2 * | 11/2024 | Jung ................... | H10D 64/017 |
| 12,159,911 | B2 * | 12/2024 | Kim .................. | H10D 30/6713 |
| 12,211,941 | B2 * | 1/2025 | Yeom ................ | H10D 30/6713 |
| 12,295,133 | B2 * | 5/2025 | Xie ................... | H01L 23/5286 |
| 12,295,141 | B2 * | 5/2025 | Kim ...................... | H10B 41/10 |
| 12,328,921 | B2 * | 6/2025 | Cho ................... | H10D 62/151 |
| 12,356,697 | B2 * | 7/2025 | Yoon ................. | H10D 62/151 |
| 12,396,253 | B2 * | 8/2025 | Park ..................... | H10D 88/00 |
| 2012/0181602 | A1 * | 7/2012 | Fukuzumi .............. | H10B 43/27 |
| | | | | 257/326 |

| | | | | |
|---|---|---|---|---|
| 2014/0353574 | A1 * | 12/2014 | Li ...................... | H10D 62/8503 |
| | | | | 438/284 |
| 2017/0179151 | A1 * | 6/2017 | Kai ................... | H01L 23/5226 |
| 2017/0365604 | A1 * | 12/2017 | Suh ........................ | H10D 84/85 |
| 2019/0305104 | A1 * | 10/2019 | Xie ...................... | H10D 62/121 |
| 2020/0027959 | A1 * | 1/2020 | Cheng ................. | H10D 64/679 |
| 2020/0091288 | A1 * | 3/2020 | Lee ..................... | H10D 62/121 |
| 2020/0126798 | A1 * | 4/2020 | Lin ..................... | H10D 30/014 |
| 2020/0168742 | A1 * | 5/2020 | Wang ................. | H01L 21/02532 |
| 2020/0194373 | A1 * | 6/2020 | Baek ...................... | H10B 43/10 |
| 2021/0035975 | A1 * | 2/2021 | Kim ....................... | H10D 88/00 |
| 2021/0104612 | A1 * | 4/2021 | Bae ................... | H10D 30/6219 |
| 2021/0202758 | A1 * | 7/2021 | Yeong ............... | H10D 84/834 |
| 2021/0217861 | A1 * | 7/2021 | Song ................. | H10D 64/258 |
| 2021/0399099 | A1 * | 12/2021 | Chu .................. | H01L 21/28525 |
| 2021/0408246 | A1 * | 12/2021 | Ganguly ........... | H01L 21/76898 |
| 2021/0408249 | A1 * | 12/2021 | Yu ...................... | H10D 30/6219 |
| 2022/0052044 | A1 * | 2/2022 | More ............... | H10D 84/0147 |
| 2022/0069076 | A1 * | 3/2022 | Yu ...................... | H10D 30/0213 |
| 2022/0069078 | A1 * | 3/2022 | Yu ..................... | H10D 64/251 |
| 2022/0115500 | A1 * | 4/2022 | Choi .................. | H10D 62/314 |
| 2022/0149176 | A1 * | 5/2022 | More ............... | H10D 30/6713 |
| 2022/0223523 | A1 * | 7/2022 | Lee .................. | H01L 23/5286 |
| 2022/0223526 | A1 * | 7/2022 | Min ................... | H10D 62/118 |
| 2022/0238689 | A1 * | 7/2022 | Yoon ................. | H10D 64/679 |
| 2022/0310639 | A1 * | 9/2022 | Chung ................. | H10B 41/35 |
| 2022/0359678 | A1 * | 11/2022 | Kim .................. | H10D 84/038 |
| 2022/0367622 | A1 * | 11/2022 | Lin ................... | H10D 84/0167 |
| 2022/0406775 | A1 * | 12/2022 | Kim ................... | H10D 64/017 |
| 2023/0109987 | A1 * | 4/2023 | Yeom ................. | H10D 30/6735 |
| | | | | 257/288 |
| 2023/0133567 | A1 * | 5/2023 | Jung ...................... | H01L 24/20 |
| | | | | 257/738 |
| 2023/0317792 | A1 * | 10/2023 | Kim ...................... | H10D 30/43 |
| | | | | 257/347 |
| 2023/0326848 | A1 * | 10/2023 | Lee .................. | H01L 21/76849 |
| 2024/0096887 | A1 * | 3/2024 | Bao .................. | H10D 30/701 |
| 2024/0113110 | A1 * | 4/2024 | Cho .................. | H10D 30/6735 |
| 2024/0113163 | A1 * | 4/2024 | Kim .................... | H10D 64/017 |
| 2024/0128161 | A1 * | 4/2024 | Lee ................... | H01L 23/5286 |
| 2024/0128332 | A1 * | 4/2024 | Jang ............... | H01L 21/76897 |
| 2024/0145345 | A1 * | 5/2024 | Kim ................... | H01L 23/5286 |
| 2024/0162311 | A1 * | 5/2024 | Oh ...................... | H01L 23/485 |
| 2024/0170372 | A1 * | 5/2024 | Lee ................... | H01L 23/481 |
| 2024/0178230 | A1 * | 5/2024 | Hwang ............... | H10D 84/907 |
| 2024/0203989 | A1 * | 6/2024 | Kim ................... | H10D 62/151 |
| 2024/0234551 | A1 * | 7/2024 | Park ............... | H10D 84/0109 |
| 2024/0250001 | A1 * | 7/2024 | Tang ................. | H10D 30/6755 |
| 2024/0258176 | A1 * | 8/2024 | Kim ............... | H10D 84/0149 |
| 2024/0266256 | A1 * | 8/2024 | Lee .................. | H10D 62/364 |
| 2024/0266350 | A1 * | 8/2024 | Kim ................. | H10D 84/0151 |
| 2024/0282708 | A1 * | 8/2024 | Yoo .................. | H10D 64/017 |
| 2024/0312914 | A1 * | 9/2024 | Seo .................... | H01L 23/5226 |
| 2024/0355883 | A1 * | 10/2024 | Yoo .................. | H10D 62/121 |
| 2024/0363536 | A1 * | 10/2024 | Park ............... | H10D 84/038 |
| 2024/0413252 | A1 * | 12/2024 | Song ................. | H10D 64/018 |
| 2024/0421070 | A1 * | 12/2024 | Lee ................... | H10D 64/256 |
| 2025/0040245 | A1 * | 1/2025 | Yang ................ | H10D 62/121 |
| 2025/0048699 | A1 * | 2/2025 | Kim ................... | H10D 64/518 |
| 2025/0063763 | A1 * | 2/2025 | Chung ................. | H01L 23/485 |
| 2025/0081559 | A1 * | 3/2025 | Lee ................... | H10D 62/151 |
| 2025/0107185 | A1 * | 3/2025 | Byeon ................. | H10D 64/017 |
| 2025/0132228 | A1 * | 4/2025 | Lee ................... | H01L 23/53295 |
| 2025/0140711 | A1 * | 5/2025 | Kim ................... | H10D 64/256 |
| 2025/0185294 | A1 * | 6/2025 | Kim ................... | H10D 62/121 |
| 2025/0185295 | A1 * | 6/2025 | Kim ................... | H10D 30/6757 |
| 2025/0194186 | A1 * | 6/2025 | Xu ...................... | H10D 84/017 |
| 2025/0201700 | A1 * | 6/2025 | Yoo ...................... | H10D 84/83 |
| 2025/0203929 | A1 * | 6/2025 | Shin ................. | H10D 30/6729 |
| 2025/0234590 | A1 * | 7/2025 | Yang ................ | H10D 30/501 |
| 2025/0248084 | A1 * | 7/2025 | Song ................. | H10D 62/822 |
| 2025/0248085 | A1 * | 7/2025 | Lee ................... | H10D 62/121 |
| 2025/0254922 | A1 * | 8/2025 | Kim ................... | H10D 64/017 |

* cited by examiner

SEMICONDUCTOR DEVICE COMPRISING ALIGNMENT KEY

CROSS-REFERENCE TO RELATED APPLICATIONS

This application is based on and claims priority to Korean Patent Application No. 10-2022-0174700, filed on Dec. 14, 2022, in the Korean Intellectual Property Office, the disclosure of which is incorporated herein by reference in its entirety.

BACKGROUND

1. Field

Example embodiments of the disclosure relate to a semiconductor device, and more particularly, to a semiconductor device including a field effect transistor.

2. Description of Related Art

A semiconductor device may include an integrated circuit including metal-oxide-semiconductor field effect transistors (MOSFETs). As sizes and design rules of semiconductor devices have been reduced, sizes of MOSFETs have also been scaled down. Operating characteristics of semiconductor devices may be deteriorated by the scaling down of the MOSFETs. Thus, further research is conducted for semiconductor devices to overcome limitations caused by a high integration density and to improve performance.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a semiconductor device having improved electrical characteristics and improved reliability.

Additional aspects will be set forth in part in the description which follows and, in part, will be apparent from the description, or may be learned by practice of the presented embodiments.

According to an aspect of an example embodiment, a semiconductor device may include a substrate including an active pattern, a channel pattern on the active pattern, the channel pattern including a plurality of semiconductor patterns that are spaced apart from each other and are vertically stacked, a source/drain pattern connected to the plurality of semiconductor patterns, a through pattern penetrating the source/drain pattern, an interlayer insulating layer on the source/drain pattern, a metal-semiconductor compound layer between the source/drain pattern and the through pattern, a gate electrode on the plurality of semiconductor patterns, the gate electrode including inner electrodes between adjacent semiconductor patterns of the plurality of semiconductor patterns and an outer electrode on an uppermost semiconductor pattern of the plurality of semiconductor patterns, an active contact on the through pattern, and a first metal layer on the active contact, the first metal layer including a power wiring and first wirings connected to the active contact, where an upper surface of the through pattern is lower than an upper surface of the interlayer insulating layer.

According to an aspect of an example embodiment, a semiconductor device may include a substrate including an active pattern, a channel pattern on the active pattern, the channel pattern including a plurality of semiconductor patterns that are spaced apart from each other and are vertically stacked, a source/drain pattern connected to the plurality of semiconductor patterns, a through pattern penetrating the source/drain pattern, a metal-semiconductor compound layer between the source/drain pattern and the through pattern, an active contact on the through pattern, and a buried connector in the substrate and connected to the through pattern, where the active contact may be aligned with the through pattern and may be connected to an upper surface of the through pattern and the buried connector may be aligned with the through pattern and may be connected to a bottom surface of the through pattern.

According to an aspect of an example embodiment, a semiconductor device may include a substrate including an active region, a device isolation layer defining an active pattern on the active region, a source/drain pattern on the active pattern, a channel pattern on the active pattern, the channel pattern including a plurality of semiconductor patterns that are spaced apart from each other and are vertically stacked, a gate electrode on the plurality of semiconductor patterns, the gate electrode including inner electrodes between adjacent semiconductor patterns of the plurality of semiconductor patterns and an outer electrode on an uppermost semiconductor pattern of the plurality of semiconductor patterns, a gate insulating layer between the adjacent semiconductor patterns and the gate electrode, a gate spacer on a sidewall of the gate electrode, a gate capping pattern on an upper surface of the gate electrode, a gate cutting pattern penetrating the gate electrode, a through pattern penetrating the source/drain pattern and connected to the source/drain pattern, a metal-semiconductor compound layer between the source/drain pattern and the through pattern, an interlayer insulating layer at least partially covering the source/drain pattern, the gate capping pattern, and the through pattern, an active contact penetrating the interlayer insulating layer such that the active contact is connected to the through pattern, a gate contact penetrating the interlayer insulating layer and the gate capping pattern such that the gate contact is connected to the gate electrode, a first metal layer on the interlayer insulating layer, the first metal layer including a power wiring and first wirings connected to the active contact and the gate contact, respectively, a second metal layer on the first metal layer, the second metal layer including second wirings connected to the first metal layer, a buried connector extending from the through pattern toward a bottom surface of the substrate, buried spacers on sides of the buried connector, a backside interconnection layer on the bottom surface of the substrate, the backside interconnection layer being connected to the buried connector and a power transmission network layer on a bottom surface of the backside interconnection layer, where the active contact, the through pattern, and the buried connector may be aligned with each other in a direction perpendicular to a surface of the substrate.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
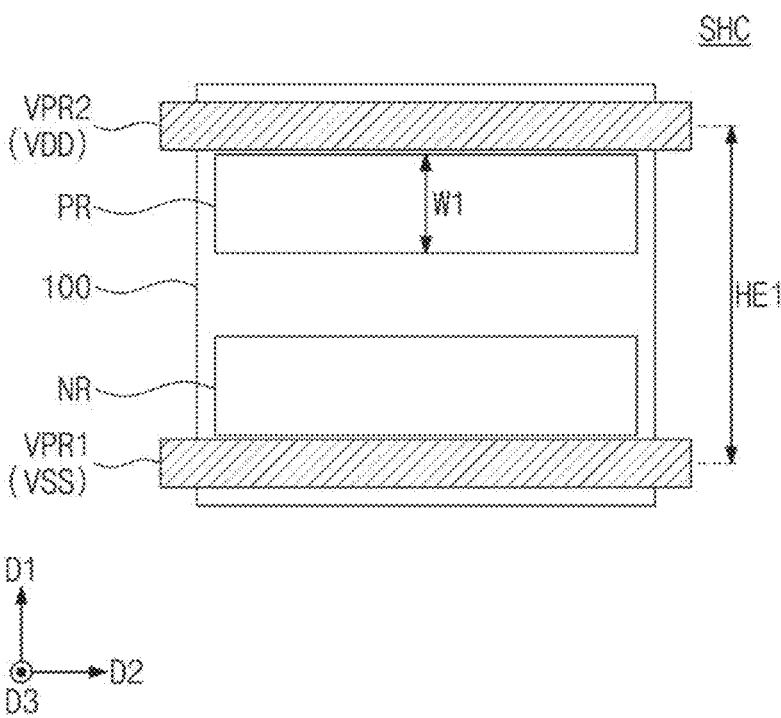
FIGS. 1, 2 and 3 are diagrams illustrating logic cells of a semiconductor device according to embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
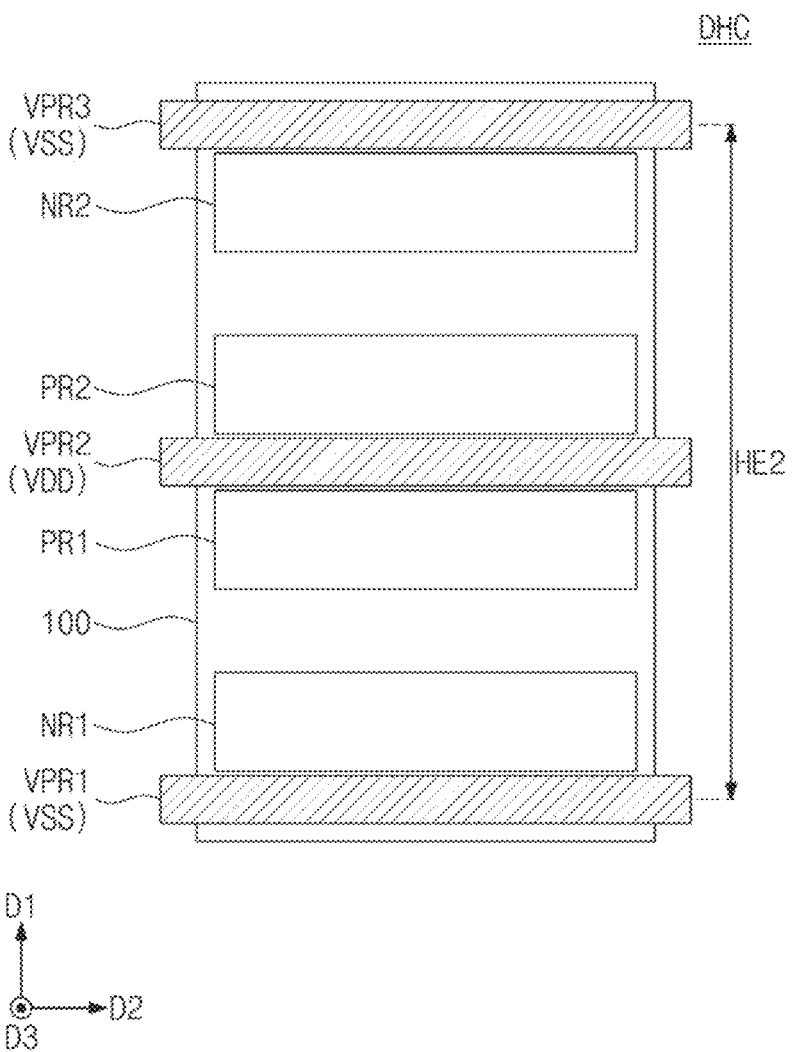
Figure 3:
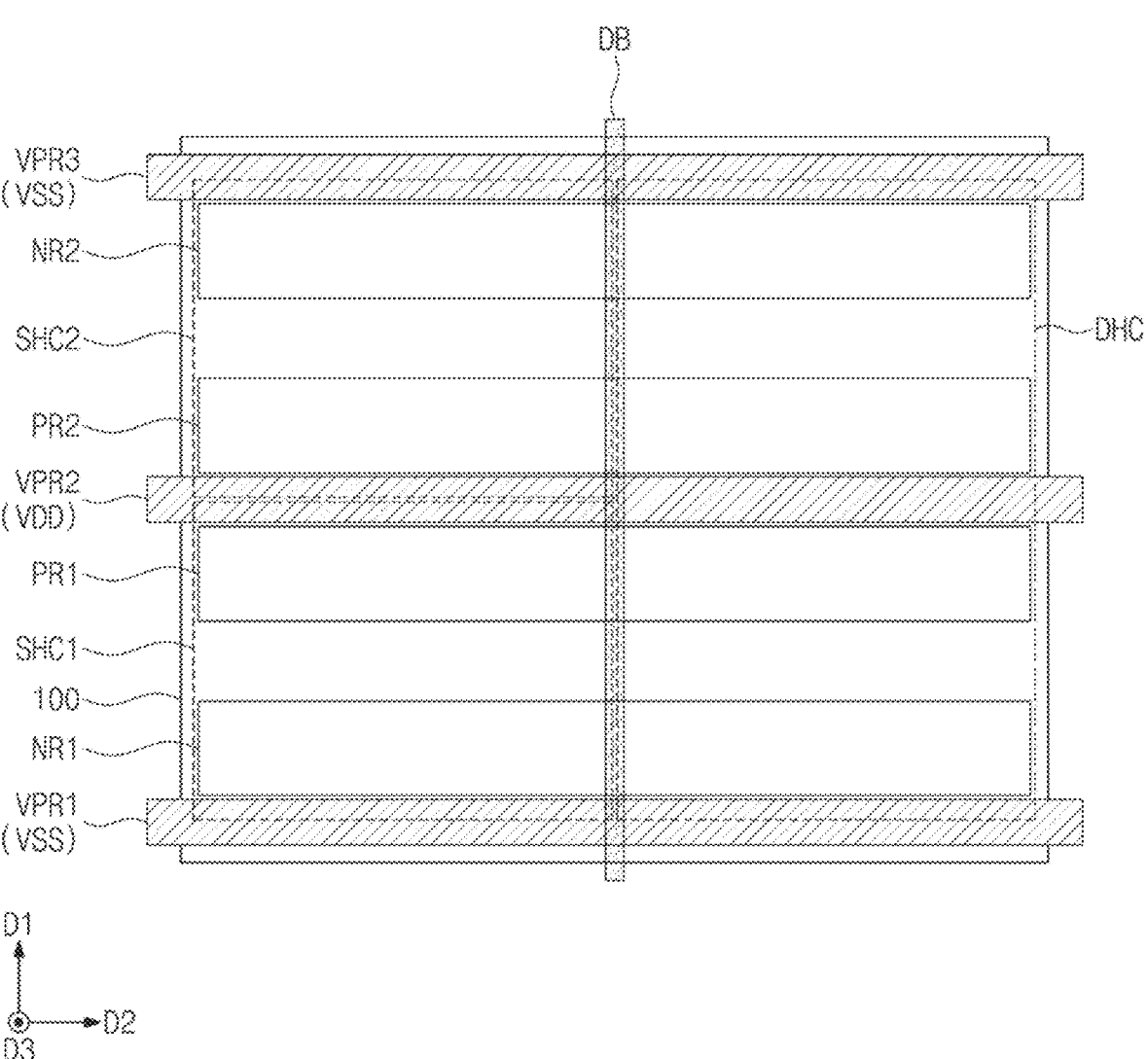

FIGS. 1, 2 and 3 are diagrams illustrating logic cells of a semiconductor device according to embodiments of the disclosure.

Referring to FIG. 1, a single height cell SHC may be provided. A first lower power wiring VPR1 and a second lower power wiring VPR2 may be provided on a lower portion of a substrate 100. The first lower power wiring VPR1 may be a passage through which a source voltage VSS (for example, a ground voltage) is provided. The second lower power wiring VPR2 may be a passage through which a drain voltage VDD (for example, the power voltage) is provided.

The single height cell SHC may be defined between the first lower power wiring VPR1 and the second lower power wiring VPR2. The single height cell SHC may include one p-type metal-oxide-semiconductor field effect transistor (MOSFET) (PMOSFET) region PR and one n-type MOSFET (NMOSFET) region NR. That is, the single height cell SHC may have a complementary metal-oxide semiconductor (CMOS) structure provided between the first lower power wiring VPR1 and the second lower power wiring VPR2.

Each of the PMOSFET region PR and the NMOSFET region NR may have a first width in a first direction D1. A length of the single height cell SHC in the first direction D1 may be defined as a first height HE1. The first height HE1 may be substantially equal to a distance (e.g., pitch) between the first lower power wiring VPR1 and the second lower power wiring VPR2.

A single height cell SHC may constitute one logic cell. A logic cell may refer to a logic element (e.g., AND, OR, XOR, XNOR, inverter, etc.) that performs a specific function. That is, the logic cell may include transistors constituting logic elements and wirings connecting the transistors to each other.

Referring to FIG. 2, a double height cell DHC may be provided. A first lower power wiring VPR1, a second lower power wiring VPR2, and a third lower power wiring VPR3 may be provided on a substrate 100. The second lower power wiring VPR2 may be disposed between the first lower power wiring VPR1 and the third lower power wiring VPR3. The third lower power wiring VPR3 may be a passage through which a source voltage VSS is provided.

The double height cell DHC may be defined between the first lower power wiring VPR1 and the third lower power wiring VPR3. The double height cell DHC may include a first PMOSFET region PR1, a second PMOSFET region PR2, a first NMOSFET region NR1, and a second NMOSFET region NR2.

The first NMOSFET region NR1 may be adjacent to the first lower power wiring VPR1. The second NMOSFET region NR2 may be adjacent to the third lower power wiring VPR3. The first and second PMOSFET regions PR1 and PR2 may be adjacent to the second lower power wiring VPR2. In a plan view, the second lower power wiring VPR2 may be disposed between the first and second PMOSFET regions PR1 and PR2.

A length of the double height cell DHC in a first direction D1 may be defined as a second height HE2. The second height HE2 may be about twice the first height HE1 of FIG. 1. The first and second PMOSFET regions PR1 and PR2 of the double height cell DHC may be grouped together to operate as one PMOSFET region. Accordingly, a channel size of the PMOS transistor of the double height cell DHC may be larger than a channel size of the PMOS transistor of the single height cell SHC of FIG. 1.

For example, a size of the channel of the PMOS transistor of the double height cell DHC may be about twice the size of the channel of the PMOS transistor of the single height cell SHC. As a result, the double height cell DHC may operate at a higher speed than that of the single height cell SHC (e.g., the SHC of FIG. 1). In the disclosure, the double height cell DHC shown in FIG. 2 may be defined as a multi-height cell. The multi-height cell may include a triple-height cell having a cell height of about three times that of a single-height cell SHC.

Referring to FIG. 3, a first single height cell SHC1, a second single height cell SHC2, and a double height cell DHC may be two-dimensionally disposed on the substrate 100. The first single height cell SHC1 may be disposed between first and second lower power wirings VPR1 and VPR2. The second single height cell SHC2 may be disposed between second and third lower power wirings VPR2 and VPR3. The second single-height cell SHC2 may be adjacent to the first single-height cell SHC1 in a first direction D1.

The double height cell DHC may be disposed between the first and third lower power wirings VPR1 and VPR3. The double height cell DHC may be adjacent to the first and second single height cells SHC1 and SHC2 in a second direction D2.

A separation structure DB may be provided between the first single height cell SHC1 and the double height cell DHC and between the second single height cell SHC2 and the double height cell DHC. An active region of the double height cell DHC may be electrically separated from an active region of each of the first and second single height cells SHC1 and SHC2 by the separation structure DB.

Figure 4:
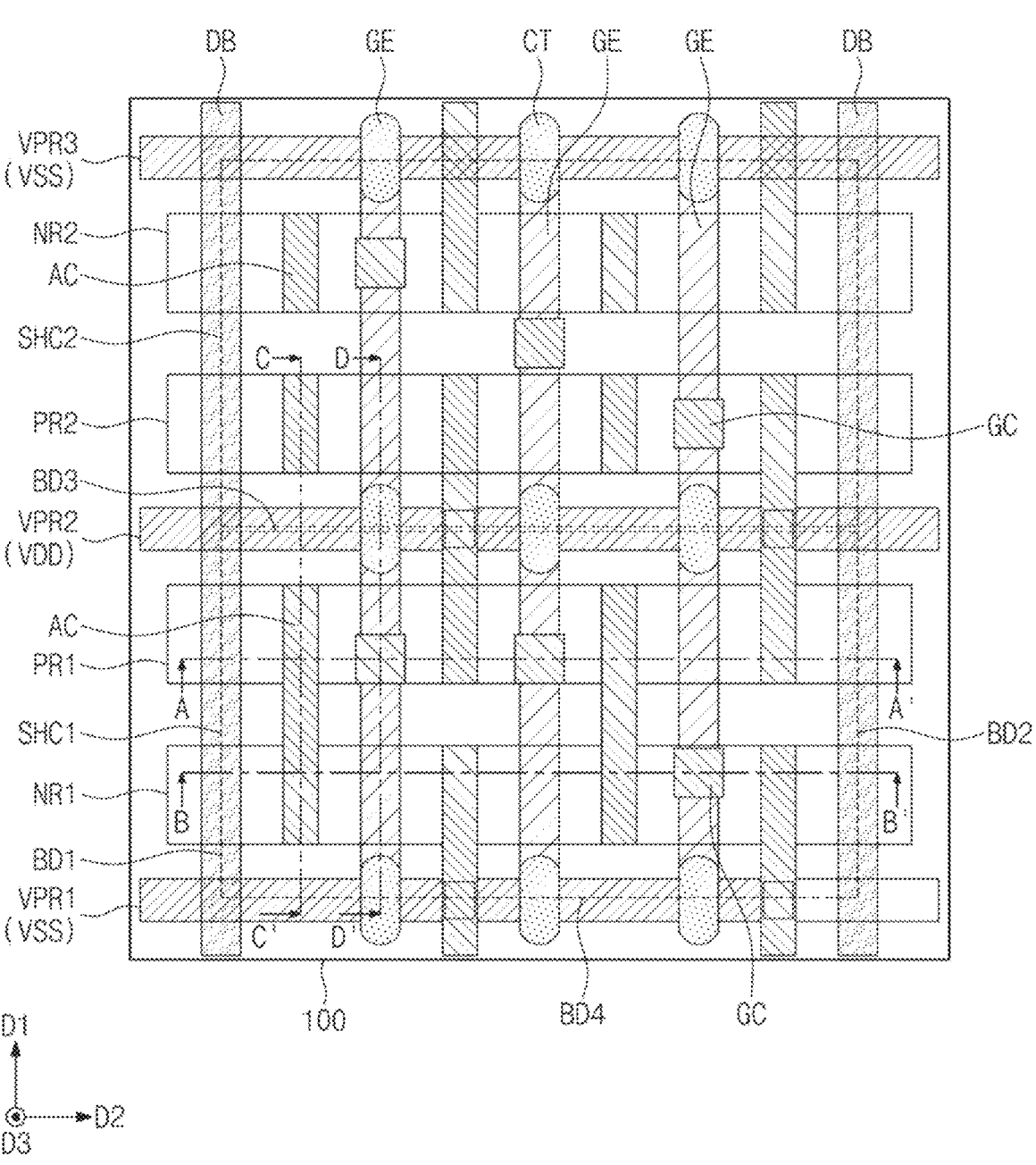
FIG. 4 is a plan view illustrating a semiconductor device according to embodiments of the disclosure.
Figure 5A:
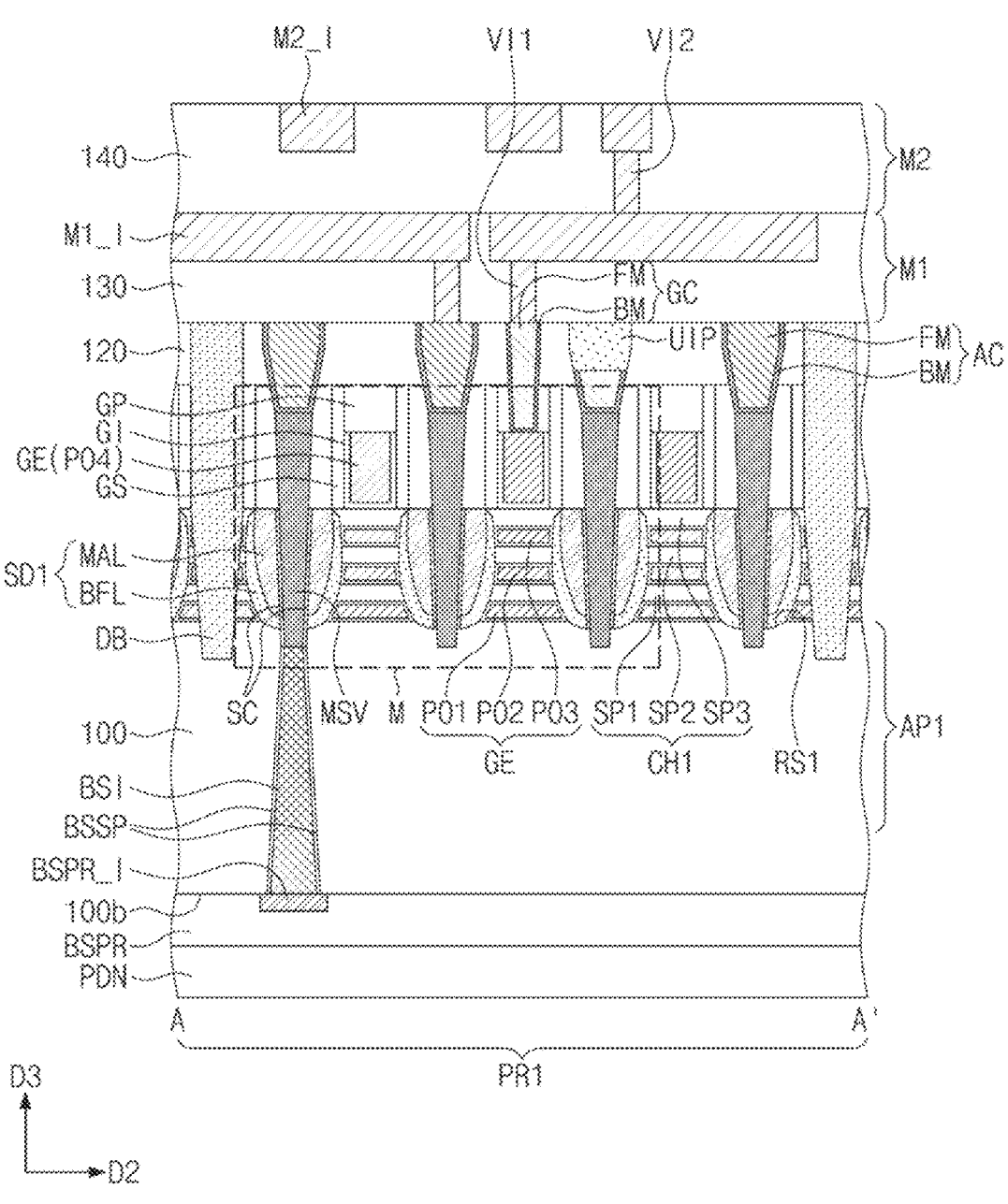
FIGS. 5A, 5B, 5C and 5D are cross-sectional views taken along lines A-A', B-B', C-C', and D-D' of FIG. 4, respectively, according to embodiments of the disclosure.

FIG. 4 is a plan view illustrating a semiconductor device according to embodiments of the disclosure. FIGS. 5A, 5B, 5C and 5D are cross-sectional views taken along lines A-A', B-B, C-C', and D-D' of FIG. 4, respectively, according to embodiments of the disclosure. The semiconductor device illustrated in FIGS. 4-5D is an example of the first and second single height cells SHC1 and SHC2 of FIG. 3 in more detail.

Referring to FIGS. 4 and 5A to 5D, first and second single height cells SHC1 and SHC2 may be provided on a substrate 100. Logic transistors constituting a logic circuit may be disposed on each of the first and second single height cells SHC1 and SHC2. The substrate 100 may be a semiconductor substrate including silicon, germanium, silicon-germanium, or the like, or a compound semiconductor substrate. For example, the substrate 100 may be a silicon substrate.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in a second direction D2. The first single height cell SHC1 may include a first NMOSFET region NR1 and a first PMOSFET region PR1, and the second single height cell SHC2 may include a second PMOSFET region PR2 and a second NMOSFET region NR2.

A first active pattern AP1 and a second active pattern AP2 may be defined by the trench TR formed on an upper surface of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be portions of the substrate 100 and may be vertically protruding portions.

A device isolation layer ST may fill the trench TR. The device isolation layer ST may include a silicon oxide layer. The device isolation layer ST may not cover first and second channel patterns CH1 and CH2.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first to third semiconductor patterns SP1, SP2, and SP3 may be spaced apart from each other in a vertical direction (i.e., in a third direction D3).

Each of the first to third semiconductor patterns SP1, SP2, and SP3 may include silicon (Si), germanium (Ge), or silicon-germanium (SiGe). For example, each of the first to third semiconductor patterns SP1, SP2, and SP3 may include crystalline silicon. Each of the first to third semiconductor patterns SP1, SP2, and SP3 may be a nanosheet.

A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between a pair of first source/drain patterns SD1. That is, the stacked first to third semiconductor patterns SP1, SP2, and SP3 may connect the pair of first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between a pair of second source/drain patterns SD2. That is, the stacked first to third semiconductor patterns SP1, SP2, and SP3 may connect the pair of second source/drain patterns SD2 to each other.

The first and second source/drain patterns SD1 and SD2 may be epitaxial patterns formed through a selective epitaxial growth (SEG) process. For example, an upper surface of each of the first and second source/drain patterns SD1 and SD2 may be positioned at substantially the same level as an upper surface of the third semiconductor pattern SP3. As another example, an upper surface of each of the first and second source/drain patterns SD1 and SD2 may be higher than an upper surface of the third semiconductor pattern SP3.

The first source/drain patterns SD1 may include a semiconductor element (e.g., SiGe) having a lattice constant greater than that of the semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

Each of the first source/drain patterns SD1 may include a buffer layer BFL and a main layer MAL on the buffer layer BFL. Referring to FIG. 5A, the buffer layer BFL may cover an inner wall of the first recess RS1. In one embodiment, the buffer layer BFL may have a substantially conformal thickness. For example, a thickness of the buffer layer BFL on a bottom of the first recess RS1 in the third direction D3 may be substantially equal to a thickness of the buffer layer BFL on an upper portion of the first recess RS1 in the second direction D2.

In another embodiment, the thickness of the buffer layer BFL may decrease from a lower portion to an upper portion. For example, the thickness of the buffer layer BFL on the bottom of the first recess RS1 in the third direction D3 may be greater than the thickness of the buffer layer BFL on the upper portion of the first recess RS1 in the second direction D2. The buffer layer BFL may have a U-shape along a profile of the first recess RS1.

The main layer MAL may fill most of the remaining region of the first recess RS1 except for the buffer layer BFL. A volume of the main layer MAL may be greater than that of a volume of the buffer layer BFL. Each of the buffer layer BFL and the main layer MAL may include silicon-germanium (SiGe). The buffer layer BFL may contain germanium (Ge) at a relatively low concentration. In another embodiment of the disclosure, the buffer layer BFL may contain only silicon (Si) excluding germanium (Ge). A concentration of germanium (Ge) in the buffer layer BFL may be about 0 at % (atomic %) to about 10 at %.

The main layer MAL may contain germanium (Ge) at a relatively high concentration. For example, a concentration of germanium (Ge) in the main layer MAL may be about 30 at % to about 70 at %. The concentration of germanium (Ge) in the main layer MAL may increase in the third direction D3. For example, the main layer MAL adjacent to the buffer layer BFL may have a germanium (Ge) concentration of about 40 at %, but an upper portion of the main layer MAL may have a germanium (Ge) concentration of about 60 at %.

Each of the buffer layer BFL and the main layer MAL may include an impurity (e.g., boron, gallium, or indium) that causes the first source/drain pattern SD1 to have a p-type. An impurity concentration of each of the buffer layer BFL and the main layer MAL may be about $1\times10^{18}$ atom/cm$^3$ to about $5\times10^{22}$ atom/cm$^3$. The impurity concentration of the main layer MAL may be greater than that of the buffer layer BFL.

The buffer layer BFL may prevent stacking faults between the substrate 100 (i.e., the first active pattern AP1) and the main layer MAL, and between the first to third semiconductor patterns SP1, SP2, SP3 and the main layer MAL. When the stacking fault occurs, channel resistance may increase. The buffer layer BFL may protect the main layer MAL during a process of replacing a second semiconductor layers SAL with first to third inner electrodes PO1, PO2, and PO3 of the gate electrode GE, which will be described later. That is, the buffer layer BFL may prevent an etching material that removes the second semiconductor layers SAL from penetrating into and etching the main layer MAL.

Each of the second source/drain patterns SD2 may include silicon (Si). The second source/drain pattern SD2 may further include an impurity (e.g., phosphorus, arsenic, or antimony) that causes the second source/drain pattern SD2 n-type. An impurity concentration of the second source/drain pattern SD2 may be about $1\times10^{18}$ atom/cm$^3$ to about $5\times10^{22}$ atom/cm$^3$.

The semiconductor device may include multiple gate electrodes GE. The gate electrodes GE may be provided to cross the first and second channel patterns CH1 and CH2 and extend in a first direction D1. The gate electrodes GE may be arranged in the second direction D2 by a first pitch. The gate electrodes GE may vertically overlap the first and second channel patterns CH1 and CH2.

Each of the gate electrodes GE may include a first inner electrode PO1 interposed between the active pattern AP1 or AP2 and the first semiconductor pattern SP1, a second inner electrode PO2 interposed between the first semiconductor pattern SP1 and the second semiconductor pattern SP2, a third inner electrode PO3 interposed between the second and third semiconductor patterns SP2 and SP3, and an outer electrode PO4 on the third semiconductor pattern SP3.

Referring to FIG. 5D, each of the gate electrodes GE (i.e., PO1-PO4 of each gate electrode GE) may be collectively provided on an upper surface TS, a bottom surface BS, and both sidewalls SW of each of the first to third semiconductor patterns SP1, SP2, and SP3. That is, a transistor according to the present embodiment may be a three-dimensional field effect transistor (FET) (e.g., multi-bridge channel FET (MBCFET), gate-all-around FET (GAAFET), etc.) in which the gate electrode surrounds the channel in three dimensions.

The first single height cell SHC1 may have a first boundary BD1 and a second boundary BD2 that face each other in the second direction D2. The first and second boundaries BD1 and BD2 may extend in the first direction D1. The first single height cell SHC1 may have a third boundary BD3 and a fourth boundary BD4 facing each other in the first direction D1. The third and fourth boundaries BD3 and BD4 may extend in the second direction D2.

Gate cutting patterns CT may be disposed on a boundary of each of the first and second single height cells SHC1 and SHC2 in the second direction D2. For example, the gate cutting patterns CT may be disposed on the third and fourth boundaries BD3 and BD4 of the first single height cell SHC1. The gate cutting patterns CT may be arranged along the third boundary BD3 by the first pitch. The gate cutting patterns CT may be arranged along the fourth boundary BD4 by the first pitch. In a plan view, the gate cutting patterns CT on the third and fourth boundaries BD3 and BD4 may be disposed to overlap each other on the gate electrodes GE. The gate cutting patterns CT may include an insulating material such as a silicon oxide layer, a silicon nitride layer, or a combination thereof.

The gate electrode GE on the first single height cell SHC1 may be separated from the gate electrode GE on the second single height cell SHC2 by the gate cutting pattern CT. The gate cutting pattern CT may be interposed between the gate electrode GE on the first single height cell SHC1 and the gate electrode GE on the second single height cell SHC2 aligned in the first direction D1. That is, a gate electrode extending in the first direction D1 may be separated into a plurality of gate electrodes GE by the gate cutting patterns CT.

A pair of gate spacers GS may be respectively disposed on both sidewalls of the outer electrode PO4. The gate spacers GS may extend in the first direction D1 along the gate electrodes GE. Upper surfaces of the gate spacers GS may be higher than upper surfaces of the gate electrodes GE. Upper surfaces of the gate spacers GS may be coplanar with an upper surface of a first interlayer insulating layer 110 to be described later. The gate spacers GS may include at least one of SiCN, SiCON, and SiN. As another example, the gate spacers GS may include a multi-layer made of at least two of SiCN, SiCON, and SiN.

A gate capping pattern GP may be provided on the gate electrode GE (e.g., on the outer electrode PO4 of the gate electrodes GE). The gate capping pattern GP may extend in the first direction D1 along the gate electrodes GE. The gate capping pattern GP may include a material having etch selectivity with respect to first and second interlayer insulating layers 110 and 120. The gate capping pattern GP may include at least one of SiON, SiCN, SiCON, and SiN.

A gate insulating layer GI may be interposed between the gate electrodes GE and the first channel pattern CH1 and between the gate electrodes GE and the second channel pattern CH2. That is, the gate insulating layer GI may include various portions that correspond to various components of the gate electrodes GE. For example, the gate insulating layer GI may include portions corresponding to each of the inner and outer electrodes (PO1-PO4) of each gate electrode GE. The gate insulating layer GI may cover the upper surface TS and the bottom surface BS and both sidewalls SW1 and SW2 of each of the first to third semiconductor patterns SP1, SP2, and SP3. The gate insulating layer GI may cover an upper surface of the device isolation layer ST under the gate electrodes GE.

In an embodiment of the disclosure, the gate insulating layer GI may include a silicon oxide layer, a silicon oxynitride layer, and/or a high-k dielectric layer. The high-k layer may include a high-k material having a higher dielectric constant than that of the silicon oxide layer. For example, the high-k material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In another embodiment, the semiconductor device of the disclosure may include a negative capacitance (NC) FET using a negative capacitor. For example, the gate insulating layer GI may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected in series and a capacitance of each capacitor has a positive value, a total capacitance is less than that of each individual capacitor. On the other hand, when at least one of the capacitances of two or more capacitors connected in series has a negative value, a total capacitance may have a positive value and may be greater than an absolute value of each individual capacitance.

When a ferroelectric material layer having a negative capacitance and a paraelectric material layer having a positive capacitance are connected in series, a total capacitance value of the ferroelectric material layer and the paraelectric material layer connected in series may increase. Using the increase in total capacitance value, a transistor including the ferroelectric material layer may have a subthreshold swing (SS) of less than 60 mV/decade at room temperature.

The ferroelectric material layer may have ferroelectric characteristics. The ferroelectric material layer may include, for example, at least one of hafnium oxide, hafnium zirconium oxide, barium strontium titanium oxide, barium titanium oxide, and lead zirconium titanium oxide. Here, as an example, hafnium zirconium oxide may be a material in which zirconium (Zr) is doped with hafnium oxide. As another example, hafnium zirconium oxide may be a compound of hafnium (Hf), zirconium (Zr), and oxygen (O).

The ferroelectric material layer may further include a doped dopant. For example, dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). Depending on a type of ferroelectric material included in the ferroelectric material layer, a type of dopant included in the ferroelectric material layer may be various.

When the ferroelectric material layer includes hafnium oxide, the dopant included in the ferroelectric material layer may include, for example, at least one of gadolinium (Gd), silicon (Si), zirconium (Zr), aluminum (Al), and yttrium (Y).

When the dopant is aluminum (Al), the ferroelectric material layer may include about 3 at % to about 8 at % of aluminum. Here, a ratio of the dopant may be a ratio of aluminum to the sum of hafnium and aluminum.

When the dopant is silicon (Si), the ferroelectric material layer may include about 2 at % to about 10 at % of silicon. When the dopant is yttrium (Y), the ferroelectric material layer may include about 2 at % to about 10 at % of yttrium. When the dopant is gadolinium (Gd), the ferroelectric material layer may include about 1 at % to about 7 at % of gadolinium. When the dopant is zirconium (Zr), the ferroelectric material layer may include about 50 at % to about 80 at % of zirconium.

The paraelectric material layer may have paraelectric characteristics. The paraelectric material layer may include, for example, at least one of silicon oxide and a metal oxide having a high dielectric constant. The metal oxide included in the paraelectric material layer may include, for example, at least one of hafnium oxide, zirconium oxide, and aluminum oxide, but is not limited thereto.

The ferroelectric material layer and the paraelectric material layer may include the same material. The ferroelectric material layer may have ferroelectric characteristics, but the paraelectric material layer may not have ferroelectric characteristics. For example, when the ferroelectric material layer and the paraelectric material layer include hafnium oxide, a crystal structure of hafnium oxide included in the ferroelectric material layer is different from a crystal structure of hafnium oxide included in the paraelectric material layer.

The ferroelectric material layer may have a thickness having ferroelectric characteristics. A thickness of the ferroelectric material layer may be, for example, about 0.5 nm to about 10 nm, but is not limited thereto. A critical thickness representing ferroelectric characteristics may be various for each ferroelectric material, and thus the thickness of the ferroelectric material layer may be various depending on the ferroelectric material.

For example, the gate insulating layer GI may include one ferroelectric material layer. As another example, the gate insulating layer GI may include a plurality of ferroelectric material layers spaced apart from each other. The gate insulating layer GI may have a multilayer structure in which a plurality of ferroelectric material layers and a plurality of paraelectric material layers are alternately stacked.

Each of the gate electrodes GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal for adjusting a threshold voltage of the transistor. A certain threshold voltage of the transistor may be achieved by adjusting thickness and composition of the first metal pattern. For example, the first to third inner electrodes PO1, PO2, and PO3 of the gate electrodes GE may be formed of the first metal pattern that is a work function metal.

The first metal pattern may include a metal nitride layer. For example, the first metal pattern may include nitrogen (N) and at least one metal selected from the group consisting of titanium (Ti), tantalum (Ta), aluminum (Al), tungsten (W), and molybdenum (Mo). Furthermore, the first metal pattern may further include carbon (C). The first metal pattern may include a plurality of stacked work function metal layers.

The second metal pattern may include a metal having lower resistance than that of the first metal pattern. For example, the second metal pattern may include at least one metal selected from the group consisting of tungsten (W), aluminum (Al), titanium (Ti), and tantalum (Ta). For example, the outer electrode PO4 of the gate electrode GE may include the first metal pattern and the second metal pattern on the first metal pattern.

Figure 5B:
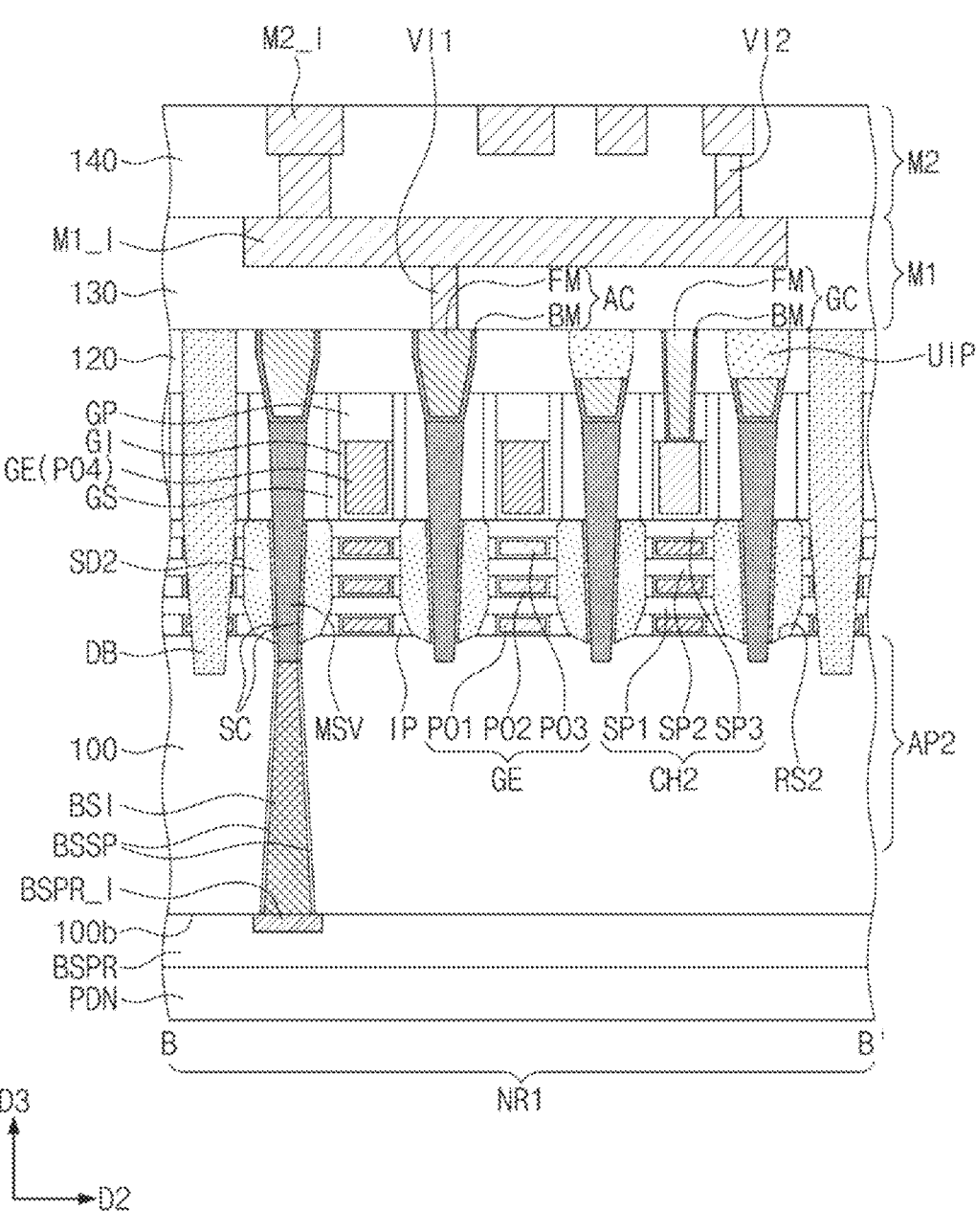

Referring to FIG. 5B, inner spacers IP may be provided on the first and second NMOSFET regions NR1 and NR2. That is, inner spacers IP may be provided on the second active pattern AP2. The inner spacers IP may be interposed between the first to third inner electrodes PO1, PO2, and PO3 of the gate electrode GE and the second source/drain pattern SD2, respectively. The inner spacers IP may directly the second source/drain pattern SD2. Each of the first to third inner electrodes PO1, PO2, and PO3 of each of the gate electrodes GE may be spaced apart from the second source/drain pattern SD2 by the inner spacer IP.

The first interlayer insulating layer 110 may be provided on the substrate 100. The first interlayer insulating layer 110 may cover the gate spacers GS and the first and second source/drain patterns SD1 and SD2. The upper surface of the first interlayer insulating layer 110 may be substantially coplanar with the upper surface of the gate capping pattern GP and the upper surface of the gate spacer GS. The second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, the first to fourth interlayer insulating layers 110 to 140 may include a silicon oxide layer.

A pair of separation structures DB facing each other in the second direction D2 may be provided on both sides of each of the first and second single height cells SHC1 and SHC2. For example, the pair of separation structures DB may be provided on the first and second boundaries BD1 and BD2 of the first single height cell SHC1, respectively. The separation structure DB may extend parallel to the gate electrodes GE in the first direction D1. A pitch between the separation structure DB and the gate electrode GE adjacent thereto may be the same as the first pitch.

The separation structure DB may pass through the first and second interlayer insulating layers 110 and 120 and extend into the first and second active patterns AP1 and AP2. The separation structure DB may pass through upper portions of each of the first and second active patterns AP1 and AP2. The separation structure DB may electrically separate active regions of the first and second single height cells SHC1 and SHC2 from active regions of adjacent cells.

Figure 5C:
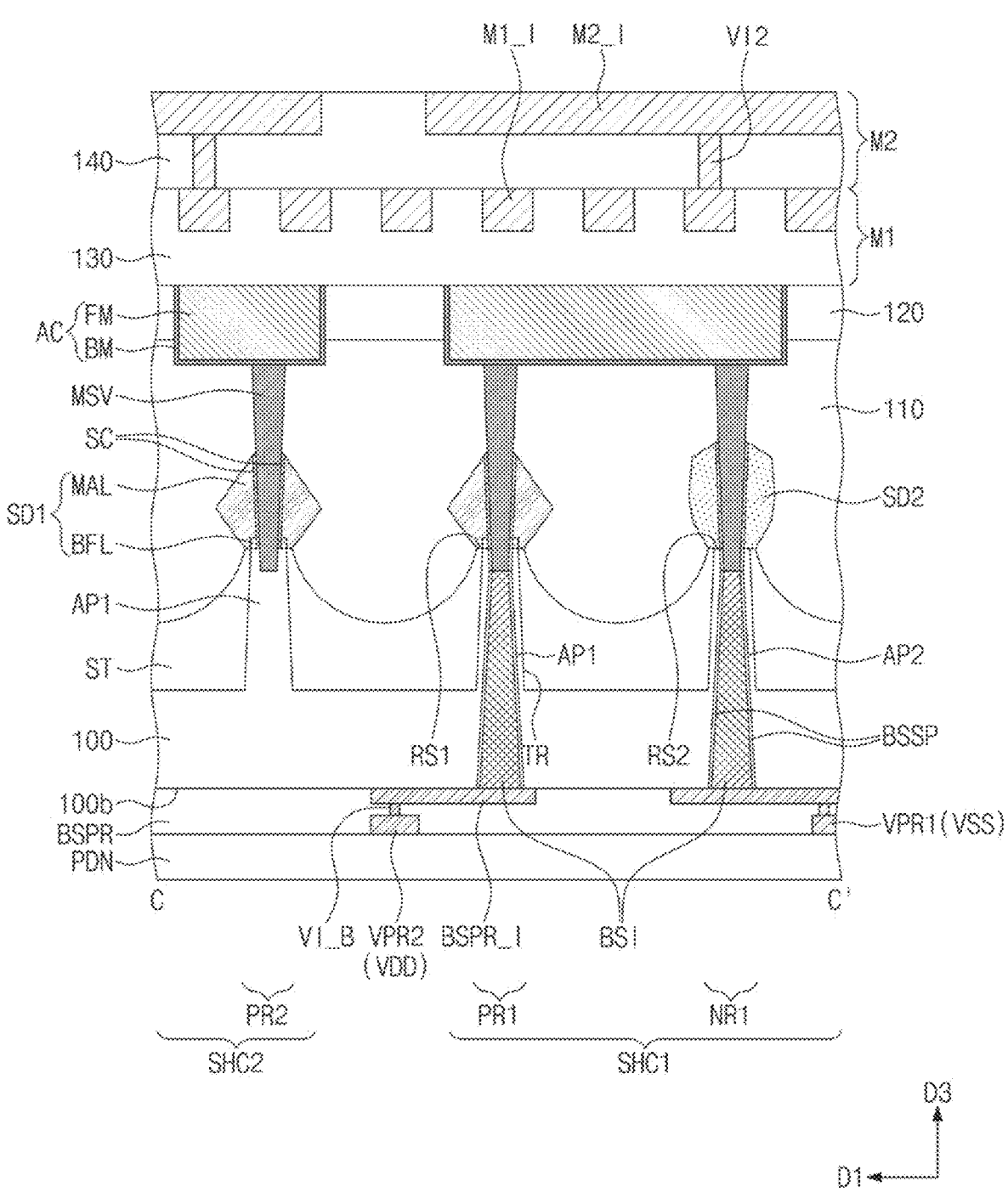
Figure 5D:
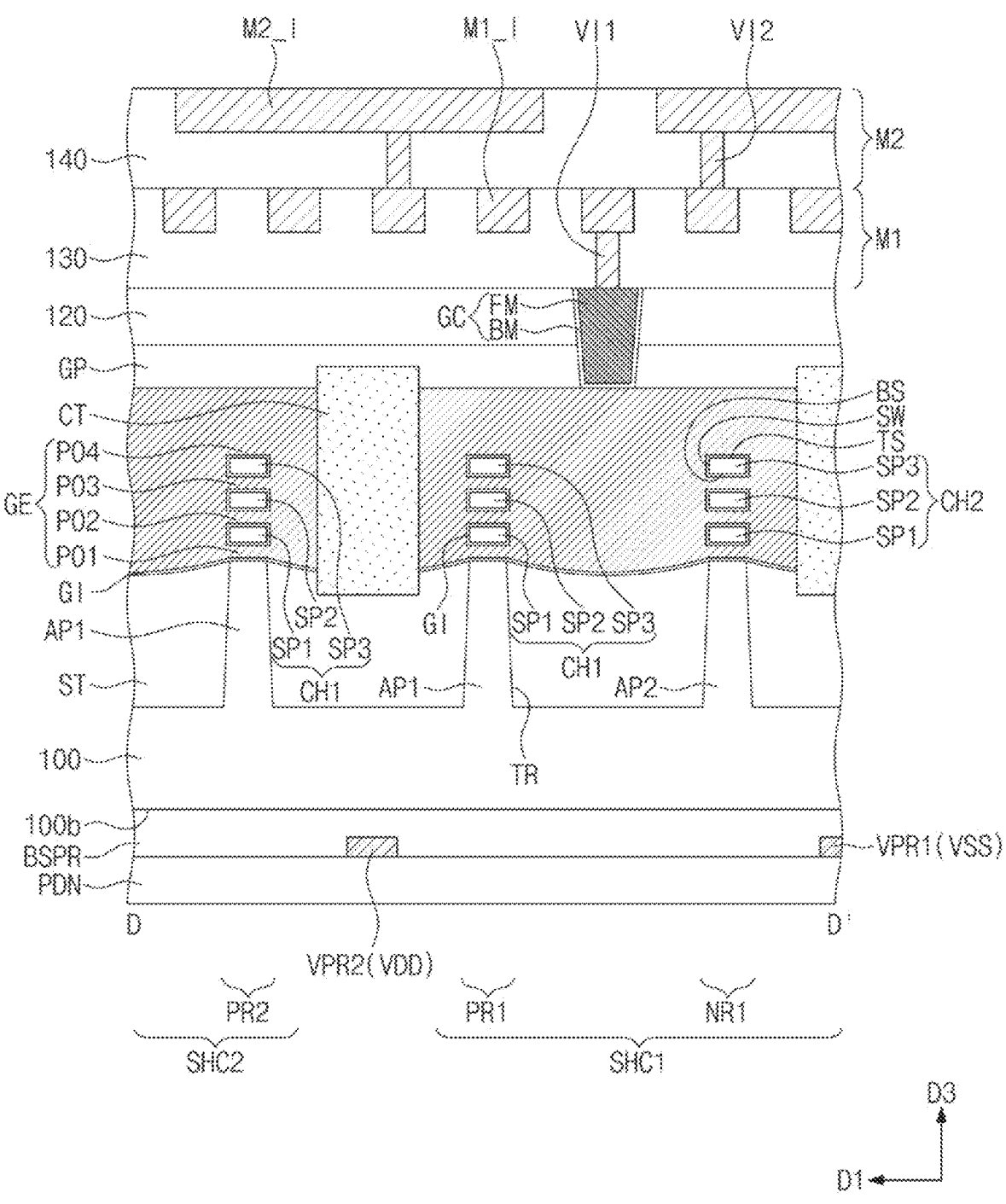

Referring to FIGS. 5A to 5C, a through pattern MSV passing through the first and second source/drain patterns SD1 and SD2 may be provided. The through pattern MSV may pass through each of the first and second source/drain patterns SD1 and SD2 and may extend in the third direction D3. That is, the through pattern MSV may extend up to the first interlayer insulating layer 110 in the third direction D3 and extend downward to the substrate 100 (i.e., the first active pattern AP1 and the active pattern AP2). The through pattern MSV may reduce contact resistance with the first and second source/drain patterns SD1 and SD2. A more detailed description of the through pattern MSV according to the disclosure will be described later with reference to FIGS. 15A to 16B.

A metal-semiconductor compound layer SC (for example, a silicide layer) may be disposed between the through pattern MSV and the first source/drain pattern SD1 and between the through pattern MSV and the second source/drain pattern SD2, respectively. That is, the metal-semiconductor compound layer SC may be formed on a surface where the through pattern MSV contacts each of the first and second source/drain patterns SD1 and SD2. The through pattern MSV may be electrically connected to the first and second source/drain patterns SD1 and SD2 through the metal-semiconductor compound layer SC. For example, the metal-semiconductor compound layer SC may include at least one of titanium-silicide, tantalum-silicide, tungsten-silicide, nickel-silicide, and cobalt-silicide.

Active contacts AC that penetrate the second interlayer insulating layer 120 and are electrically connected to the through patterns MSV inside the first interlayer insulating layer 110 may be provided. That is, a lower surface of the active contact AC may be connected to an upper surface of the through pattern MSV. A pair of active contacts AC may be provided on both sides of the gate capping pattern GP, respectively. In a plan view, the active contact AC may have a bar shape extending in the first direction D1.

The active contact AC may be a self-aligned contact. That is, the active contact AC may be formed in a self-alignment manner using the gate capping pattern GP, the gate spacer GS, and the through pattern MSV. For example, the active contact AC may cover at least a portion of the sidewall of the gate spacer GS. The active contact AC may cover an upper surface of the through pattern MSV. The active contact AC may cover a portion of the upper surface of the gate capping pattern GP. The active contact AC may be electrically connected to the through pattern MSV including a metal material.

Gate contacts GC electrically connected to the gate electrodes GE may be provided through the second interlayer insulating layer 120 and the gate capping pattern GP. In a plan view, one gate contact GC on the first single height cell SHC1 may be disposed to overlap the first PMOSFET region PR1. That is, one gate contact GC on the first single height cell SHC1 may be provided on the first active pattern AP1 (refer to FIG. 5A). In a plan view, one gate contact GC on the first single height cell SHC1 may be disposed to overlap the first NMOSFET region NR1. That is, one gate contact GC on the first single height cell SHC1 may be provided on the second active pattern AP2 (refer to FIG. 5B).

The gate contacts GC may be freely disposed on the gate electrodes GE without limiting the location of the gate contacts GC. For example, the gate contacts GC of the second single height cell SHC2 may be arranged on the second PMOSFET region PR2, the second NMOSFET region NR2, and the device isolation layer ST filling the trench TR, respectively (refer to FIG. 4).

As an embodiment of the disclosure, referring to FIGS. 5A and 5B, an upper portion of the active contact AC adjacent to the gate contact GC may be filled with an upper insulating pattern UIP. The upper insulating pattern UIP may prevent a short circuit caused by contact between the gate contact GC and the adjacent active contact AC.

Each of the active contact AC and gate contact GC may include a conductive pattern FM and a barrier pattern BM surrounding or at least partially surrounding the conductive pattern FM. For example, the conductive pattern FM may include at least one of aluminum, copper, tungsten, molybdenum, and cobalt. The barrier pattern BM may cover sidewalls and a bottom surface of the conductive pattern FM. The barrier pattern BM may include a metal layer/metal nitride layer. The metal layer may include at least one of titanium, tantalum, tungsten, nickel, cobalt, and platinum. The metal nitride layer may include at least one of a titanium nitride layer (TiN), a tantalum nitride layer (TaN), a tungsten nitride layer (WN), a nickel nitride layer (NiN), a cobalt nitride layer (CON), and a platinum nitride layer (PtN).

First to third lower power wirings VPR1, VPR2, and VPR3 may be provided on a bottom surface 100b of the substrate 100. The first to third lower power wirings VPR1, VPR2, and VPR3 may have a bar shape extending in the second direction D2.

A backside interconnection layer BSPR may be provided on the bottom surface 100b of the substrate 100. The backside interconnection layer BSPR may include first to third lower power wirings VPR1, VPR2, and VPR3 and a plurality of metal wirings BSPR_I electrically connected thereto. The backside interconnection layer BSPR may further include a rear via VI_B. Although not shown, the BSPR may include wirings for routing between cells.

The first to third lower power wirings VPR1, VPR2, and VPR3 may extend parallel to each other in the second direction D2. The first lower power wiring VPR1 may be disposed on the fourth boundary BD4 of the first single height cell SHC1. The second lower power wiring VPR2 may be disposed on the third boundary BD3 of the first single height cell SHC1. That is, the first single height cell SHC1 may be defined between the first lower power wiring VPR1 and the second lower power wiring VPR2. The second single height cell SHC2 may be defined between the second lower power wiring VPR2 and the third lower power wiring VPR3.

Referring to FIGS. 5A to 5C, the backside interconnection layer BSPR may be electrically connected to at least one through pattern MSV. For example, the backside interconnection layer BSPR may be electrically connected to the through pattern MSV on the first PMOSFET region PR1 and electrically connected to the through pattern MSV on the first NMOSFET region NR1. The backside interconnection layer BSPR may be electrically connected to the through pattern MSV through a buried connector BSI. As another example, the buried connector BSI and the backside interconnection layer BSPR may be integrally connected to each other to form one power wiring.

The buried connector BSI may pass through the substrate 100 and be connected to the lower surface of the through pattern MSV. In this case, an upper surface of the buried connector BSI may be directly connected to a lower surface of the through pattern MSV. Each of the buried connector BSI and the through pattern MSV may include the same or different metal materials. Accordingly, the metal-semiconductor compound layer may not be interposed between the buried connector BSI and the through pattern MSV.

The buried connector BSI may include a conductive pattern. For example, the buried connector BSI may include copper, molybdenum or ruthenium. In one embodiment of the disclosure, the buried connector BSI may be self-aligned with the through pattern MSV. That is, a center line of the buried connector BSI and a center line of the through pattern MSV may be aligned collinearly.

Buried spacers BSSP may be provided on both sides of the buried connector BSI. The buried spacer BSSP may be conformally deposited on both sides of the buried connector BSI. The buried spacer BSSP may include an insulating material. The insulating material may include silicon oxide, silicon nitride, silicon oxynitride, or a combination thereof. The buried spacer BSSP may insulate the substrate 100 from the buried connector BSI. Accordingly, leakage current may be prevented in the semiconductor device according to the disclosure.

A power transmission network layer PDN may be provided on a bottom surface of the backside interconnection layer BSPR. The power transmission network layer PDN may include a plurality of lower wirings electrically connected to the first to third lower power wirings VPR1, VPR2, and VPR3. For example, the power transmission network layer PDN may include a wiring network for applying a source voltage VSS to the first and third lower power wirings VPR1 and VPR3. The power transmission network layer PDN may include a wiring network for applying a drain voltage VDD to the second lower power wiring VPR2.

A first metal layer M1 may be provided in the third interlayer insulating layer 130. The first metal layer M1 may include first wirings M1_I. The first wirings M1_I of the first metal layer M1 may extend parallel to each other in the second direction D2.

According to embodiments of the disclosure, power wirings for supplying power to the single height cells SHC may be disposed below the substrate 100 in a form of lower power wirings VPR1 to VPR3. Accordingly, the power wiring may be omitted in the first metal layer M1. The first wirings M1_I for signal transmission may be disposed in the first metal layer M1. The first wirings M1_I may be arranged in the first direction D1 by a second pitch. The second pitch may be smaller than the first pitch.

The first metal layer M1 may further include first vias VI1. The first vias VI1 may be respectively provided under the first wirings M1_I of the first metal layer M1. The active contact AC and the first wiring M1_I of the first metal layer M1 may be electrically connected through the first via VI1. The gate contact GC and the first wiring M1_I of the first metal layer M1 may be electrically connected through the first via VI1.

The first wirings M1_I of the first metal layer M1 and the first via VI1 therebelow may be formed through separate processes. That is, each of the first wiring M1_I and the first via VI1 of the first metal layer M1 may be formed through a single damascene process. The semiconductor device according to example embodiments may be formed using a process of less than 20 nm.

A second metal layer M2 may be provided in the fourth interlayer insulating layer 140. The second metal layer M2 may include a plurality of second wirings M2_I. Each of the second wirings M2_I of the second metal layer M2 may have a line shape or a bar shape extending in the first direction D1. That is, the second wirings M2_I may extend parallel to each other in the first direction D1.

The second metal layer M2 may further include second vias VI2 respectively provided under the second wirings M2_I. The first wiring M1_I of the first metal layer M1 and the second wiring M2_I of the second metal layer M2 may be electrically connected through a second via VI2. For example, the second wiring M2_I of the second metal layer M2 and the second via VI2 therebelow may be formed together through a dual damascene process.

The first wiring M1_I of the first metal layer M1 and the second wiring M2_I of the second metal layer M2 may include the same or different conductive materials. For example, the first wiring M1_I of the first metal layer M1 and the second wiring M2_I of the second metal layer M2 may include at least one metal material of aluminum, copper, tungsten, molybdenum, ruthenium, and cobalt. Metal layers (e.g., M3, M4, M5, etc.) stacked on the fourth insulating interlayer 140 may be additionally disposed. Each of the stacked metal layers may include wirings for routing between cells.

FIGS. 6A, 6B, 7A, 7B, 8A, 8B, 9A, 9B, 9C, 10A, 10B, 10C, 11A, 11B, 11C, 11D, 12A, 12B, 12C, 12D, 13A, 13B, 13C, 14A, 14B and 14C are cross-sectional views illustrating a method of manufacturing a semiconductor device according to embodiments of the disclosure. FIGS. 6A, 7A, 8A, 9A, 10A, 11A, 12A, 13A, and 14A are cross-sectional views corresponding to line A-A' of FIG. 4. FIGS. 8B, 9B, 10B, 11B, 12B, 13B, and 14B are cross-sectional views corresponding to line B-B' of FIG. 4. FIGS. 9C, 10C, 11C, 12C, 13C, and 14C are cross-sectional views corresponding to line C-C' of FIG. 4. FIGS. 6B, 7B, 11D, and 12D are cross-sectional views corresponding to line D-D' of FIG. 4.

Figure 6A:
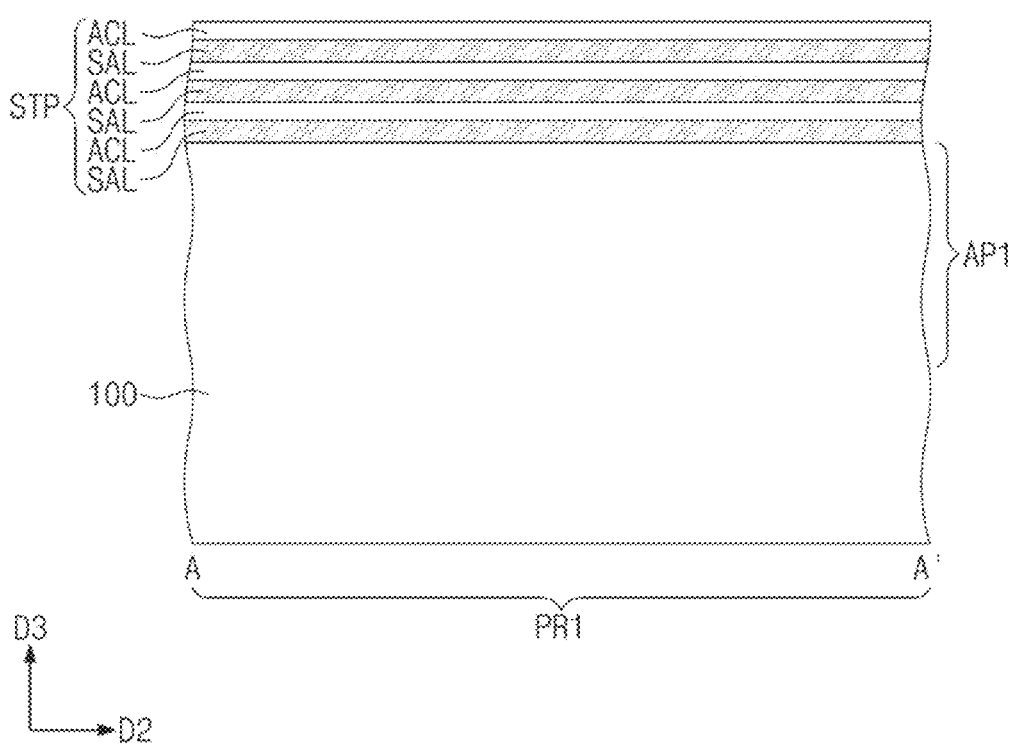
FIGS. 6A, 6B, 7A, 7B, 8A, 8B, 9A, 9B, 9C, 10A, 10B, 10C, 11A, 11B, 11C, 11D, 12A, 12B, 12C, 12D, 13A, 13B, 13C, 14A, 14B and 14C are cross-sectional views illustrating a method of manufacturing a semiconductor device according to embodiments of the disclosure.
Figure 6B:
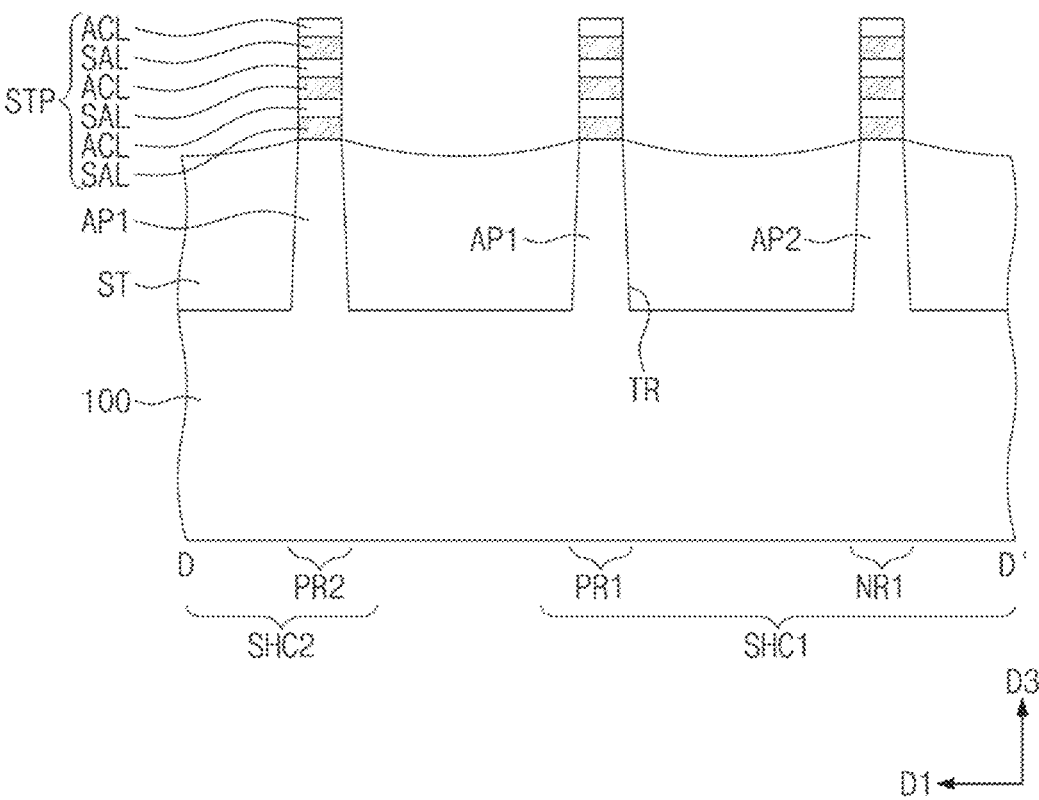

Referring to FIGS. 6A and 6B, a substrate 100 including first and second PMOSFET regions PR1 and PR2 and first and second NMOSFET regions NR1 and NR2 may be provided. First semiconductor layers ACL and second semiconductor layers SAL may be alternately stacked on the substrate 100. The first semiconductor layers ACL may include one of silicon (Si), germanium (Ge), and silicon-germanium (SiGe), and the second semiconductor layers SAL may include silicon (Si), germanium (Ge) and silicon-germanium (SiGe).

The second semiconductor layer SAL may include a material having an etch selectivity with respect to the first semiconductor layer ACL. For example, the first semiconductor layers ACL may include silicon (Si), and the second semiconductor layers SAL may include silicon-germanium (SiGe). A concentration of germanium (Ge) in each of the second semiconductor layers SAL may be about 10 at % to about 30 at %.

Mask patterns may be formed on the first and second PMOSFET regions PR1 and PR2 and the first and second NMOSFET regions NR1 and NR2 of the substrate 100, respectively. The mask pattern may have a line shape or a bar shape extending in a second direction D2.

A patterning process may be performed using the mask patterns as an etch mask to form a trench TR defining first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2. In a plan view, the first and second active patterns AP1 and AP2 may have a line shape extending parallel to each other in the second direction D2.

A stacked pattern STP may be formed on each of the first and second active patterns AP1 and AP2. The stacking pattern STP may include first semiconductor layers ACL and second semiconductor layers SAL that are alternately stacked with each other. The stacked pattern STP may be formed together with the first and second active patterns AP1 and AP2 during the patterning process.

A device isolation layer ST may be formed to fill the trench TR. An insulating layer may be formed on the entire surface of the substrate 100 to cover the first and second active patterns AP1 and AP2 and the stacked patterns STP. The device isolation layer ST may be formed by recessing the insulating layer until the stacked patterns STP are exposed.

The device isolation layer ST may include an insulating material such as a silicon oxide layer. The stacked patterns STP may be exposed on the device isolation layer ST. That is, the stacked patterns STP may vertically protrude from the device isolation layer ST.

Figure 7A:
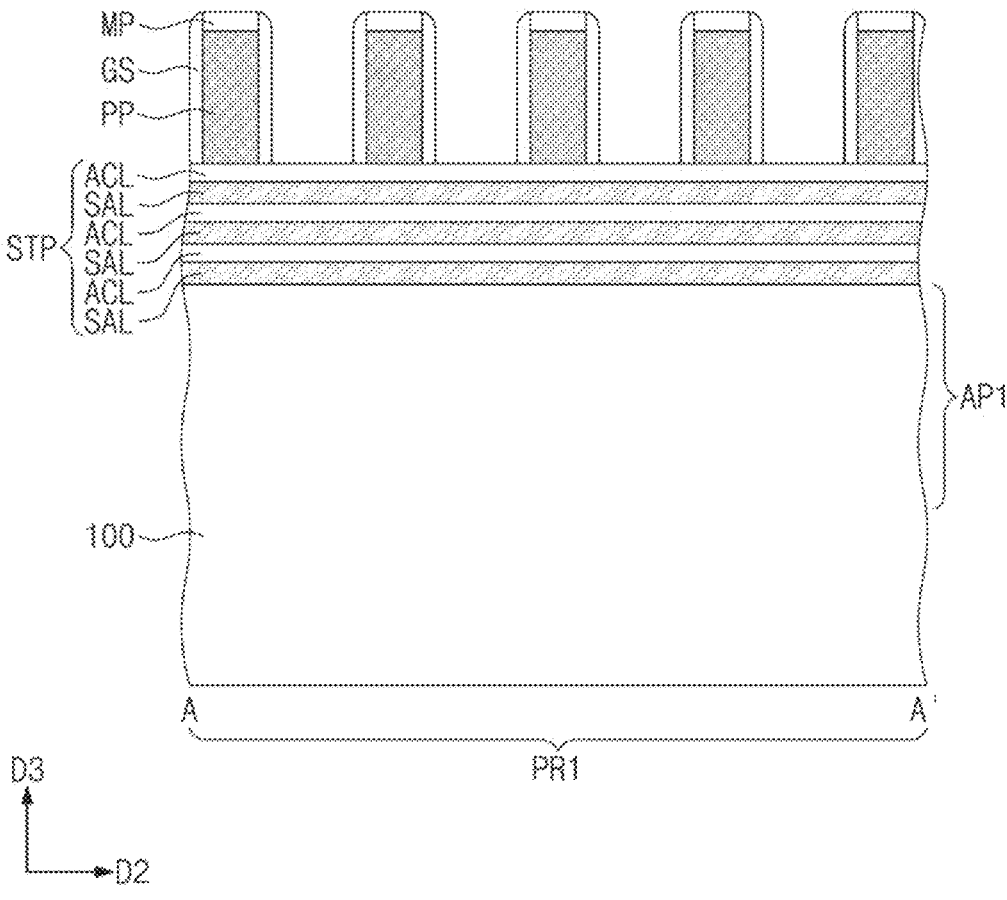
Figure 7B:
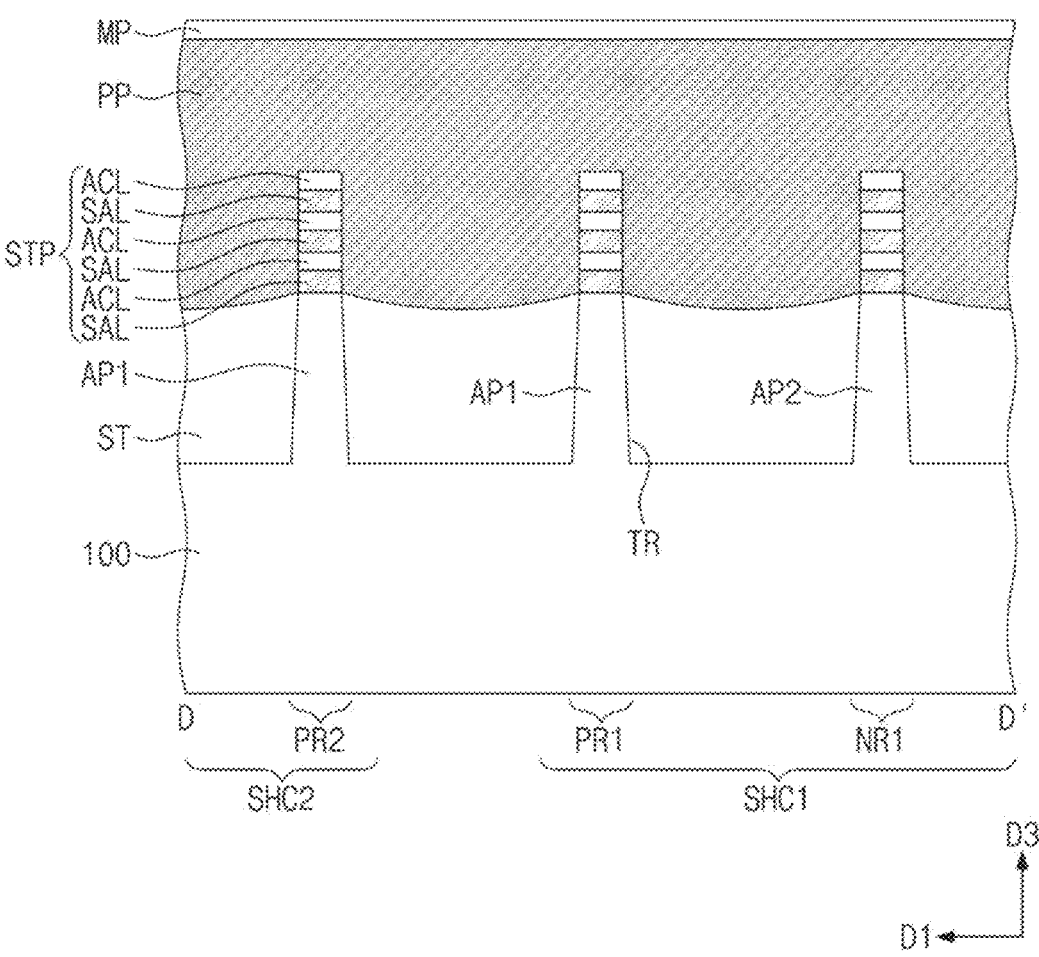

Referring to FIGS. 7A and 7B, sacrificial patterns PP crossing the stacked patterns STP may be formed on the substrate 100. Each of the sacrificial patterns PP may be formed in a line shape or bar shape extending in a first direction D1. The sacrificial patterns PP may be arranged in the second direction D2 by a first pitch.

Forming the sacrificial patterns PP may include forming a sacrificial layer on the entire surface of the substrate 100, forming hard mask patterns MP on the sacrificial layer, and patterning the sacrificial layer using the hard mask patterns MP as an etching mask. The sacrificial layer may include polysilicon.

A pair of gate spacers GS may be formed on both sidewalls of each of the sacrificial patterns PP. Forming the gate spacers GS may include conformally forming a gate spacer layer on the entire surface of the substrate 100 and anisotropically etching the gate spacer layer. The gate spacer layer may include at least one of SiCN, SiCON, and SiN. As another example, the gate spacer layer may be a multi-layer including at least two of SiCN, SiCON, and SiN.

Figure 8A:
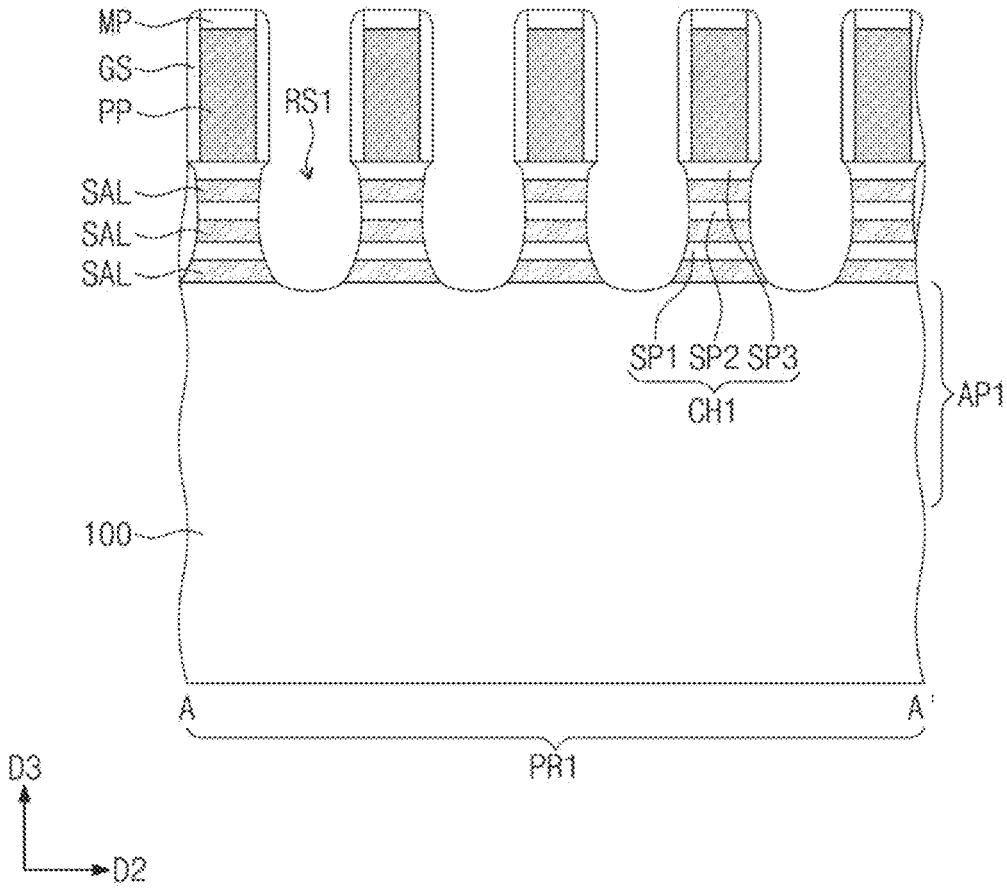
Figure 8B:
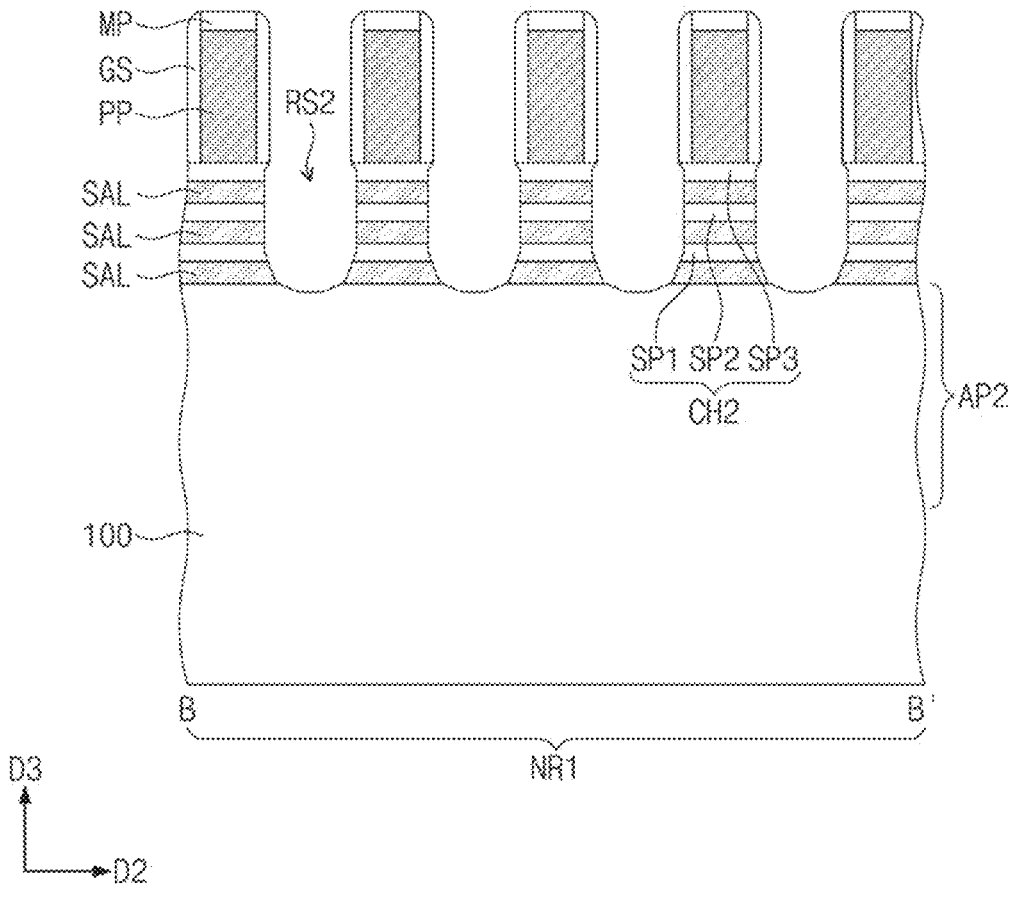

Referring to FIGS. 8A and 8B, first recesses RS1 may be formed in the stacked pattern STP on the first active pattern AP1. Second recesses RS2 may be formed in the stacked pattern STP on the second active pattern AP2. While forming the first and second recesses RS1 and RS2, the device isolation layer ST on both sides of each of the first and second active patterns AP1 and AP2 may be further recessed.

The stacked pattern STP on the first active pattern AP1 may be etched using the hard mask patterns MP and the gate spacers GS as an etch mask, thereby forming the first recesses RS1. The first recess RS1 may be formed between a pair of sacrificial patterns PP. The second recesses RS2 in the stacked pattern STP on the second active pattern AP2 may be formed in the same manner as forming the first recesses RS1.

First to third semiconductor patterns SP1, SP2, and SP3 sequentially stacked between adjacent first recesses RS1 may be formed from the first semiconductor layers ACL, respectively. First to third semiconductor patterns SP1, SP2, and SP3 sequentially stacked between adjacent second recesses RS2 may be formed from the first semiconductor layers ACL, respectively. The first to third semiconductor patterns SP1, SP2, and SP3 between the adjacent first recesses RS1 may constitute a first channel pattern CH1. The first to third semiconductor patterns SP1, SP2, and SP3 between adjacent second recesses RS2 may constitute a second channel pattern CH2.

Figure 9A:
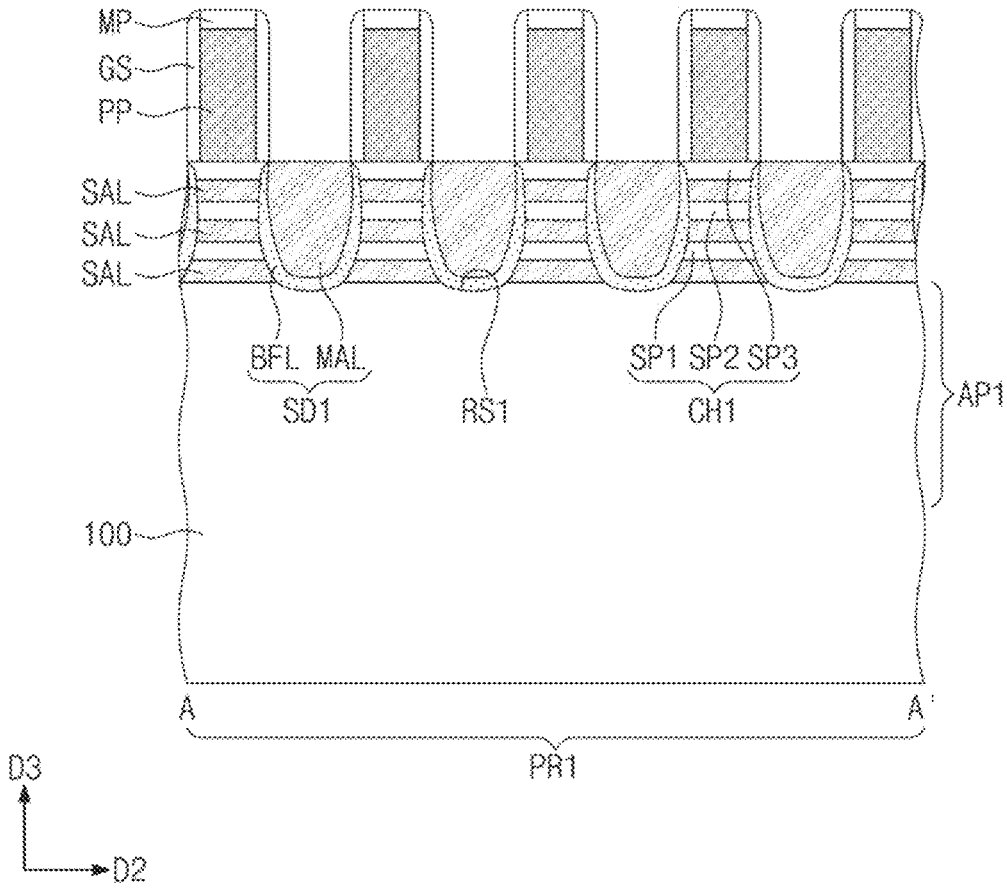
Figure 9B:
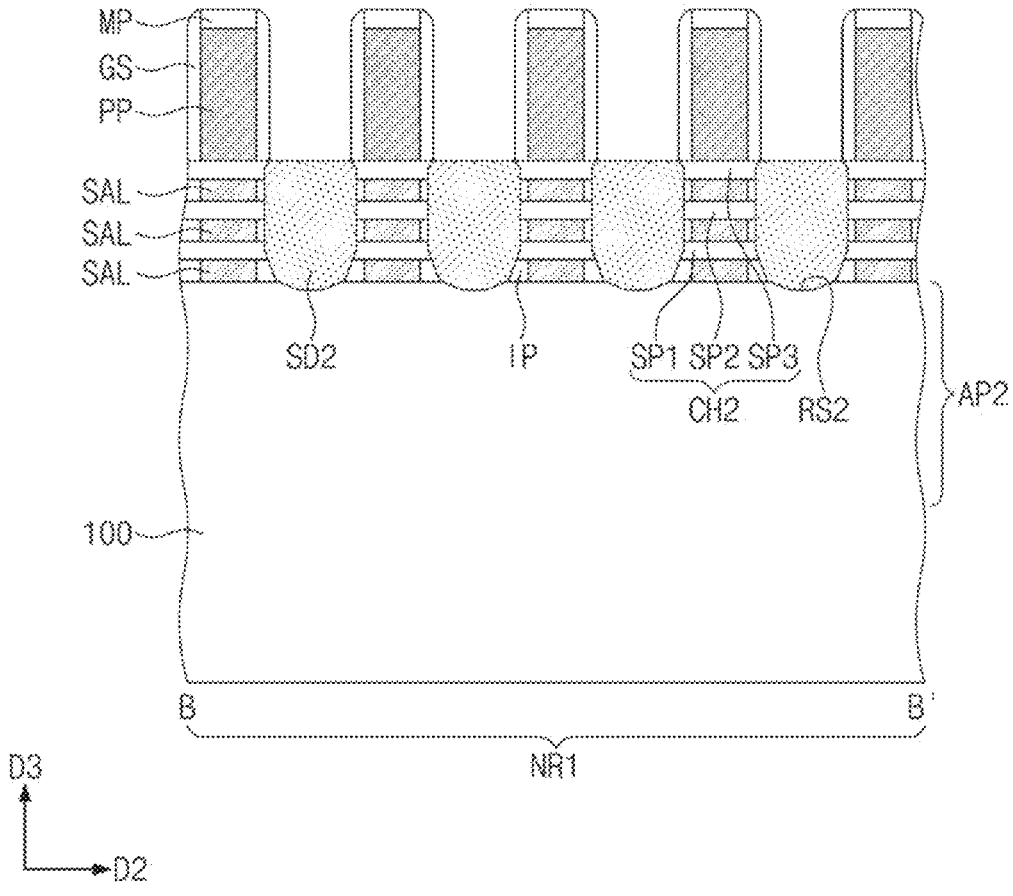
Figure 9C:
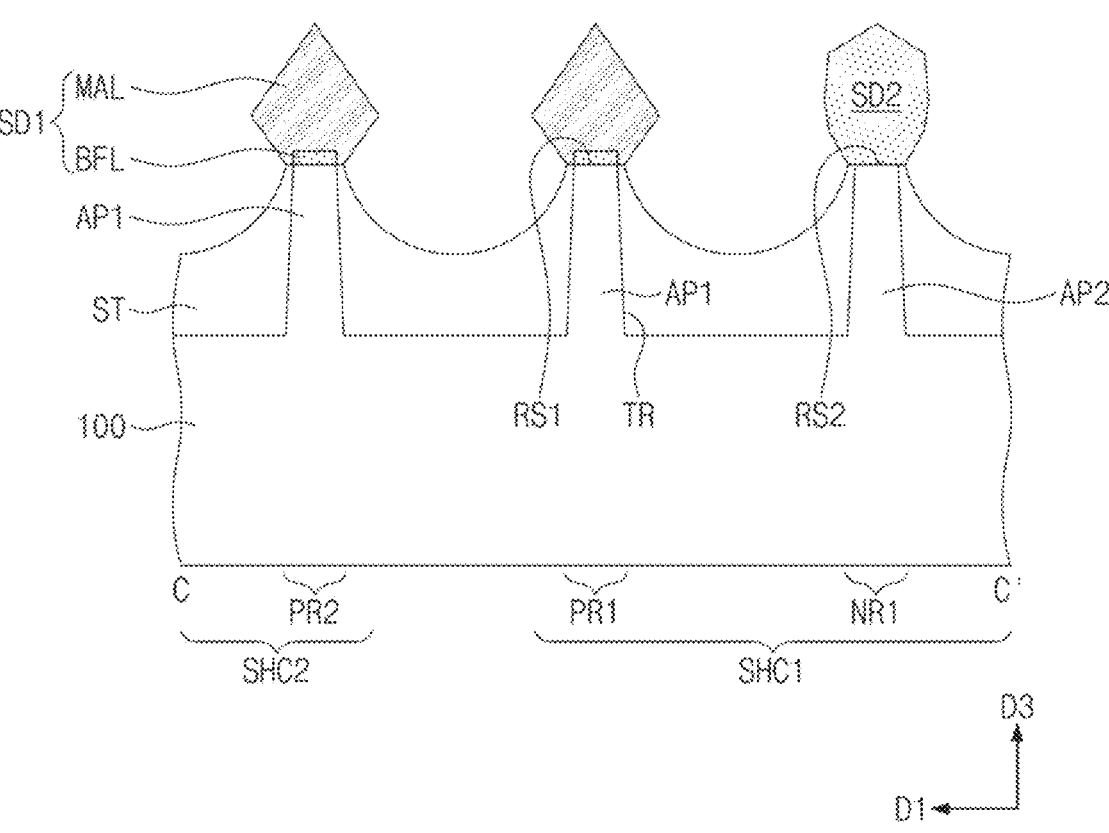

Referring to FIGS. 9A to 9C, first source/drain patterns SD1 may be formed in the first recesses RS1, respectively. A first SEG process may be performed using an inner wall of the first recess RS1 as a seed layer to form a buffer layer BFL. The buffer layer BFL may be grown using the substrate 100 and the first to third semiconductor patterns SP1, SP2, and SP3 exposed by the first recess RS1 as seeds. For example, the first SEG process may include a chemical vapor deposition (CVD) process or a molecular beam epitaxy (MBE) process.

The buffer layer BFL may include a semiconductor element (e.g., SiGe) having a greater lattice constant than a lattice constant of a semiconductor element of the substrate 100. The buffer layer BFL may contain germanium (Ge) at a relatively low concentration. In another embodiment of the disclosure, the buffer layer BFL may contain only silicon (Si) excluding germanium (Ge). A concentration of germanium (Ge) in the buffer layer BFL may be about 0 at % to about 10 at %.

A second SEG process may be performed on the buffer layer BFL to a main layer MAL. The main layer MAL may be formed to completely or almost completely fill the first recess RS1. The main layer MAL may contain germanium (Ge) at a relatively high concentration. For example, a concentration of germanium (Ge) in the main layer MAL may be 30 at % to 70 at %.

In one embodiment of the disclosure, a third SEG process may be performed on the main layer MAL to form a capping layer. The capping layer may include silicon (Si). A concentration of silicon (Si) in the capping layer may be 98 at % to 100 at %.

While forming the buffer layer BFL and the main layer MAL, impurities (e.g., boron, gallium, or indium) that cause the first source/drain pattern SD1 to have a p-type may be injected in-situ. As another example, impurities may be implanted into the first source/drain pattern SD1 after the first source/drain pattern SD1 is formed.

Second source/drain patterns SD2 may be formed in the second recesses RS2, respectively. An SEG process may be performed using an inner wall of the second recess RS2 as a seed layer to form the second source/drain pattern SD2. For example, the second source/drain pattern SD2 may include the same semiconductor element (e.g., Si) as the substrate 100.

While forming the second source/drain pattern SD2 impurities (e.g., phosphorus, arsenic, or antimony) that cause the second source/drain pattern SD2 to have an n-type may be injected in-situ. As another example, impurities may be implanted into the second source/drain pattern SD2 after the second source/drain pattern SD2 is formed.

In one embodiment of the disclosure, before forming the second source/drain pattern SD2, a portion of the second semiconductor layer SAL exposed through the second recess RS2 may be replaced with an insulating material to form an inner spacer IP. As a result, the inner spacers IP may be respectively formed between the second source/drain pattern SD2 and the second semiconductor layers SAL.

Figure 10A:
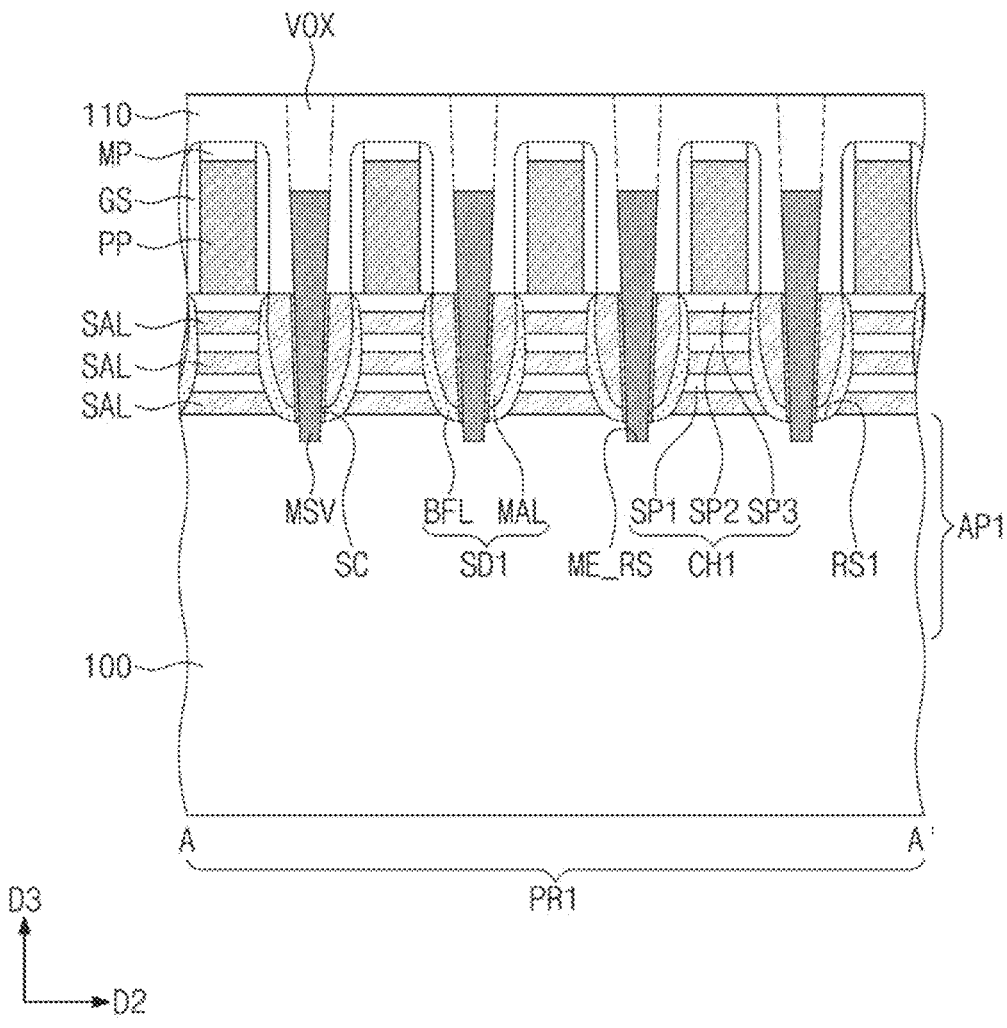
Figure 10B:
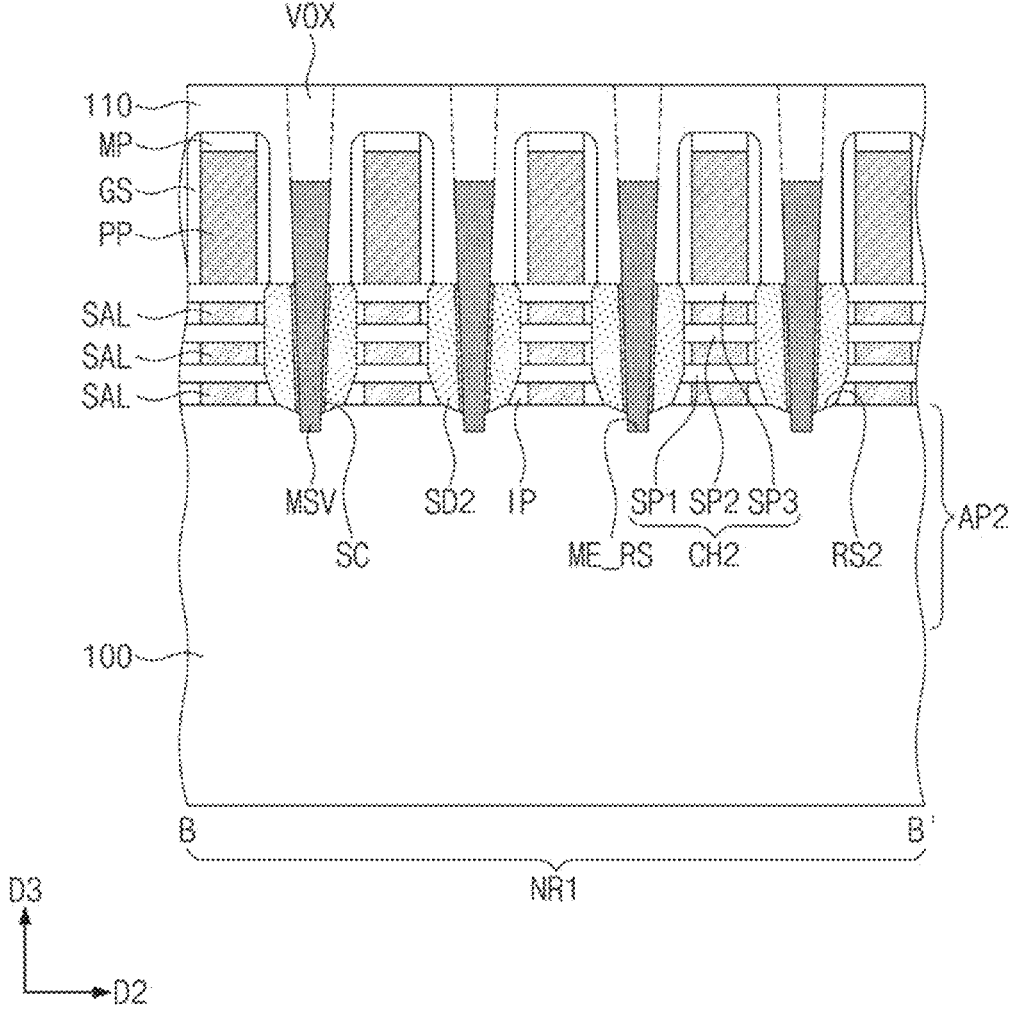
Figure 10C:
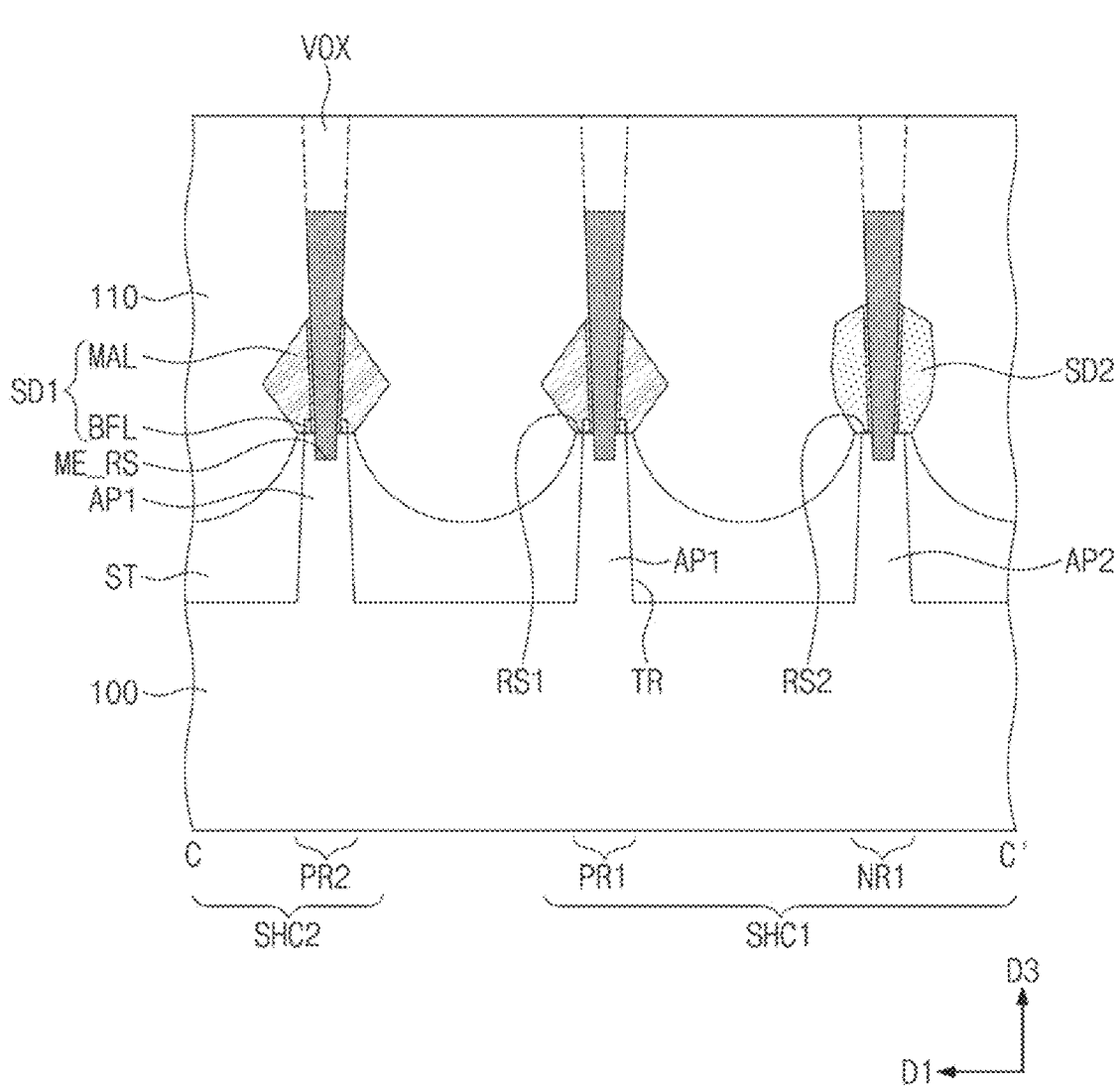

Referring to FIGS. 10A to 10C, a first interlayer insulating layer 110 covering the first and second source/drain patterns SD1 and SD2, the hard mask patterns MP, and the gate spacers GS may be formed. For example, the first interlayer insulating layer 110 may include a silicon oxide layer.

Hard mask patterns may be formed on the first interlayer insulating layer 110 and the first interlayer insulating layer 110 may be etched using the hard mask patterns as an etch mask, thereby forming via recesses ME_RS. The via recess ME_RS may be formed between a pair of sacrificial patterns PP. The via recess ME_RS may pass through a center of the first and second source/drain patterns SD1 and SD2. In addition, the via recess ME_RS may extend to upper portions of the first and second active patterns AP1 and AP2. That is, a bottom surface of the via recess ME_RS may be lower than upper surfaces of the first and second active patterns AP1 and AP2.

A liner layer may be formed from the bottom surface of the via recess ME_RS to lower surfaces of the first and second source/drain patterns SD1 and SD2. That is, the liner layer may be conformally formed to cover a lower portion of the via recess ME_RS. The liner layer may include silicon oxide, silicon nitride, or silicon oxynitride.

A through pattern MSV may be formed in each of the via recesses ME_RS. Forming the through pattern MSV may include conformally filling the via recess ME_RS with metal materials to form metal via patterns, etching an upper portion of the metal via pattern, and forming a via insulating pattern VOX on the etched metal via pattern. An upper surface of the via insulating pattern VOX may be coplanar with an upper surface of the first interlayer insulating layer 110. The via insulating pattern VOX may include at least one of silicon oxide, silicon nitride, and silicon oxynitride. The via insulating pattern VOX may include the same material as the first interlayer insulating layer 110.

The through pattern MSV may be formed in a self-alignment manner through the sacrificial patterns PP and the gate spacer GS. An upper surface of the through pattern MSV may be lower than an upper surface of the sacrificial pattern PP. A bottom surface of the through pattern MSV may be lower than lower surfaces of the first and second source/drain patterns SD1 and SD2. A silicide layer SC may be formed on both sides of the through pattern MSV. That is, the silicide layer SC may be interposed between the through pattern MSV and the first and second source/drain patterns SD1 and SD2.

Referring to FIGS. 11A to 11D, the first interlayer insulating layer 110 may be planarized until upper surfaces of the sacrificial patterns PP are exposed. Planarization of the first interlayer insulating layer 110 may be performed using an etch back or chemical mechanical polishing (CMP) process. During the planarization process, all of the hard mask patterns MP may be removed. As a result, the upper surface of the first interlayer insulating layer 110 may be coplanar with the upper surfaces of the sacrificial patterns PP and the upper surfaces of the gate spacers GS.

A region of the sacrificial pattern PP may be selectively opened using photolithography. For example, the region of the sacrificial pattern PP on third and fourth boundaries BD3 and BD4 of a first single height cell SHC1 may be selectively opened. The open region of the sacrificial pattern PP may be selectively etched and removed. An insulating material may be filled in a space where the sacrificial pattern PP is remove to form a gate cutting pattern CT (refer to FIG. 11D).

The exposed sacrificial patterns PP may be selectively removed. By removing the sacrificial patterns PP, an outer region ORG exposing the first and second channel patterns CH1 and CH2 may be formed (refer to FIG. 11D). Removing the sacrificial patterns PP may include wet etching using an etchant that selectively etches the polysilicon.

Figure 11A:
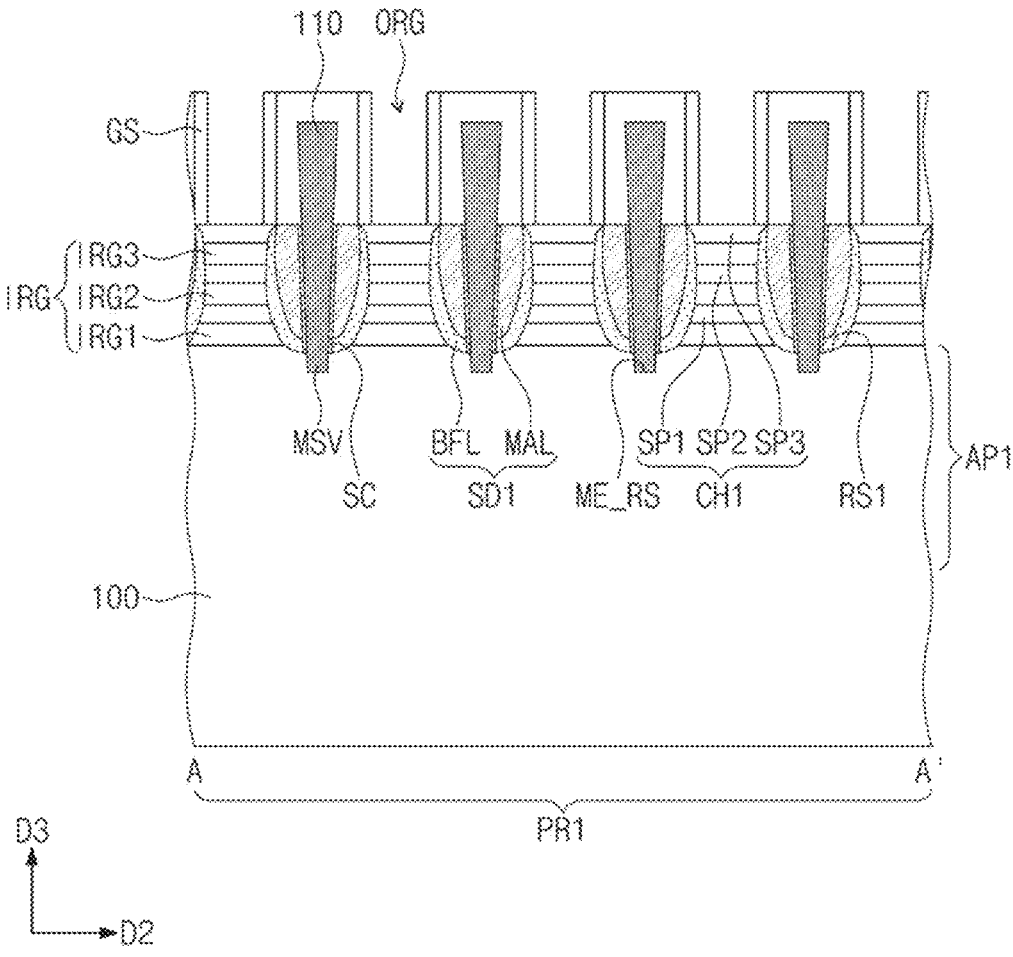
Figure 11B:
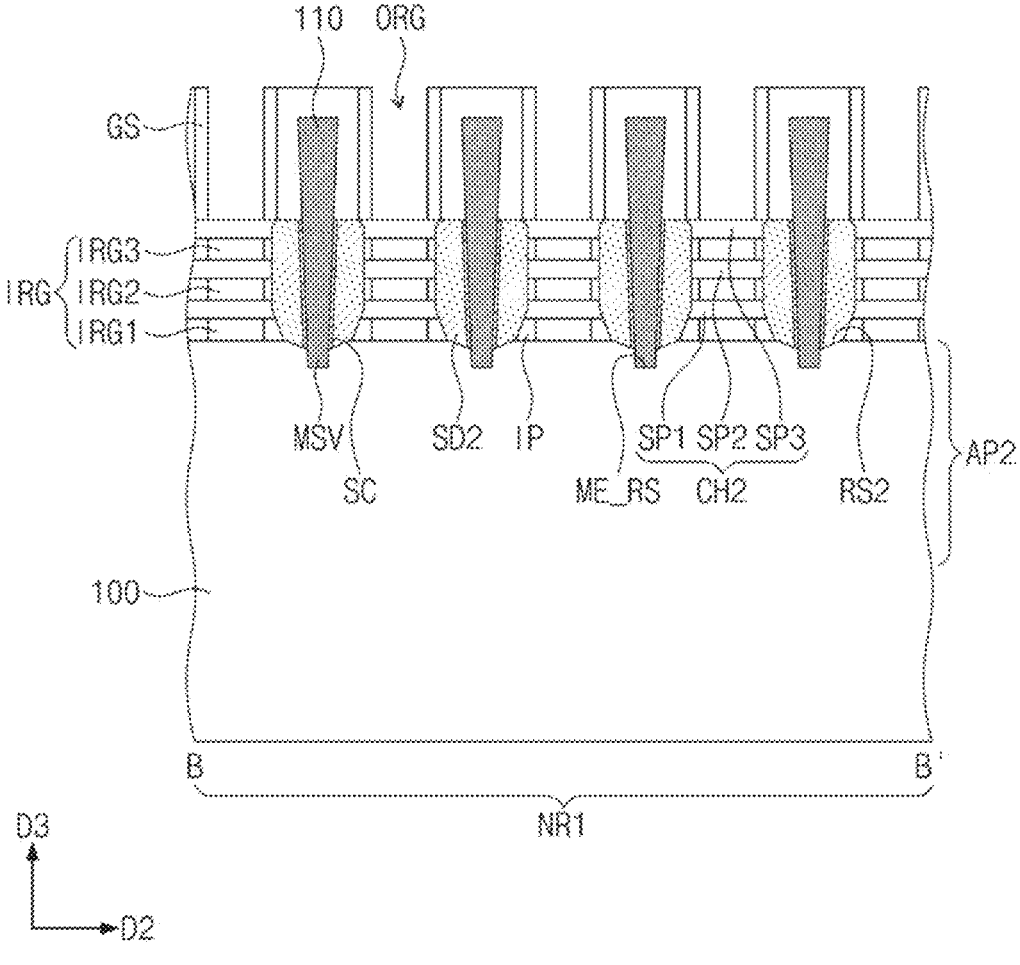
Figure 11C:
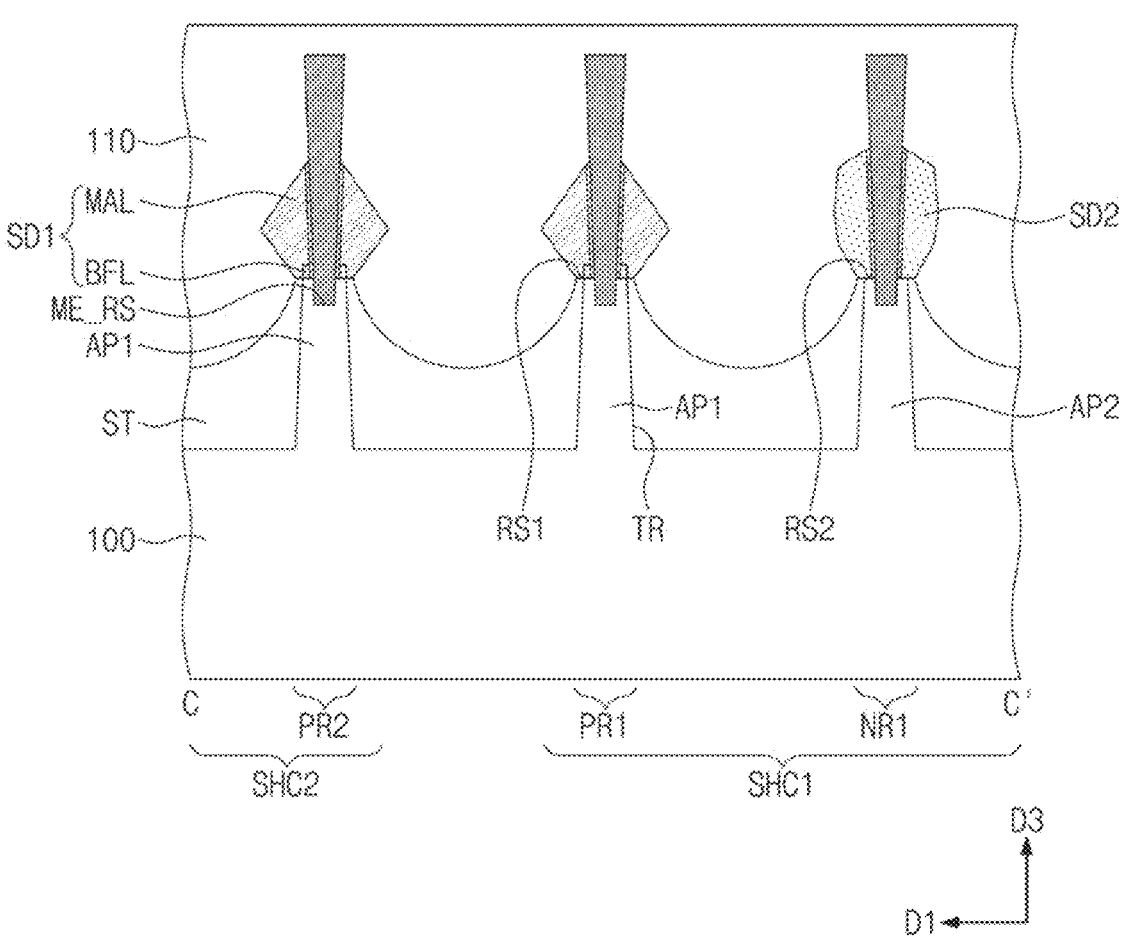
Figure 11D:
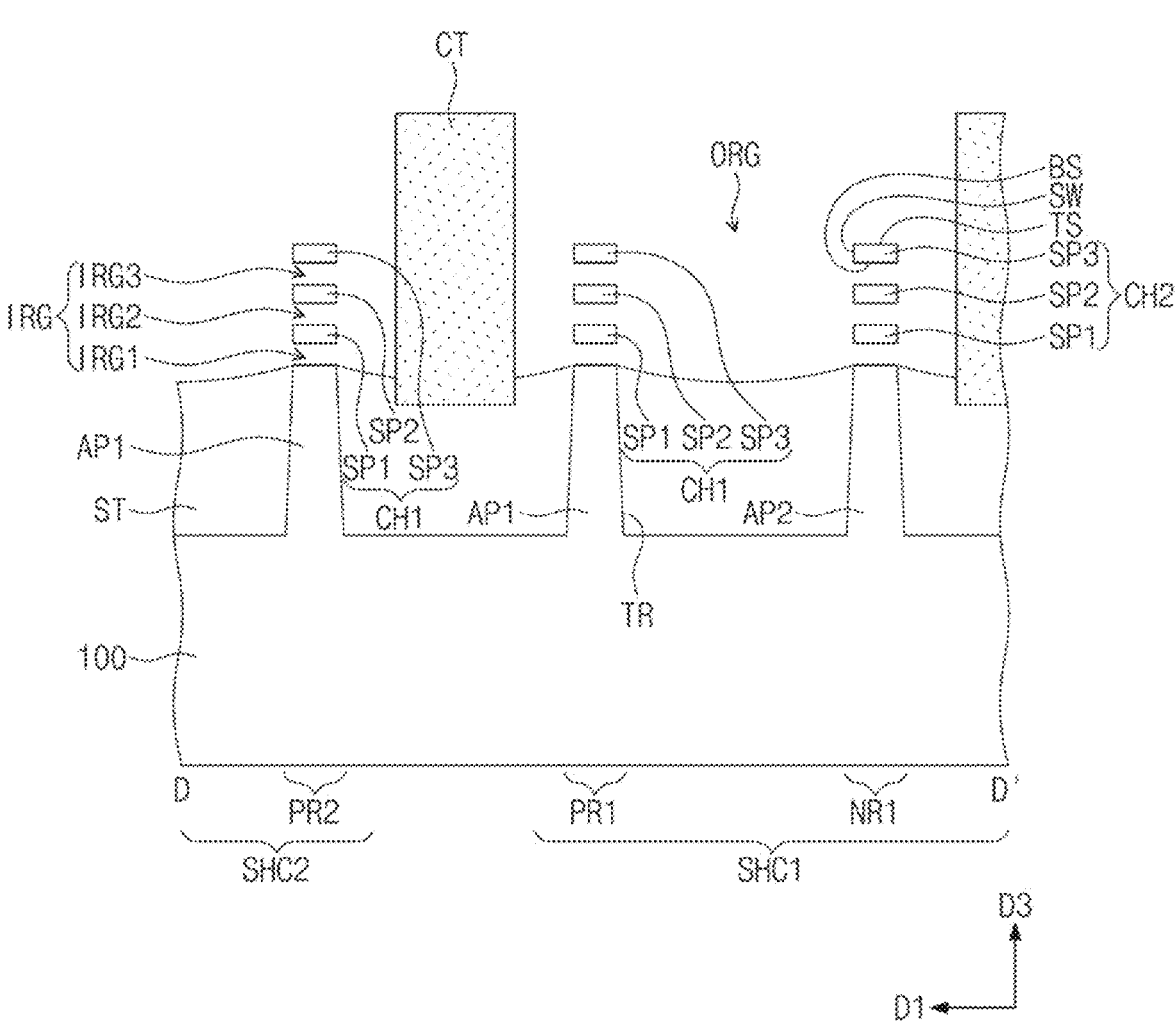
Figure 12A:
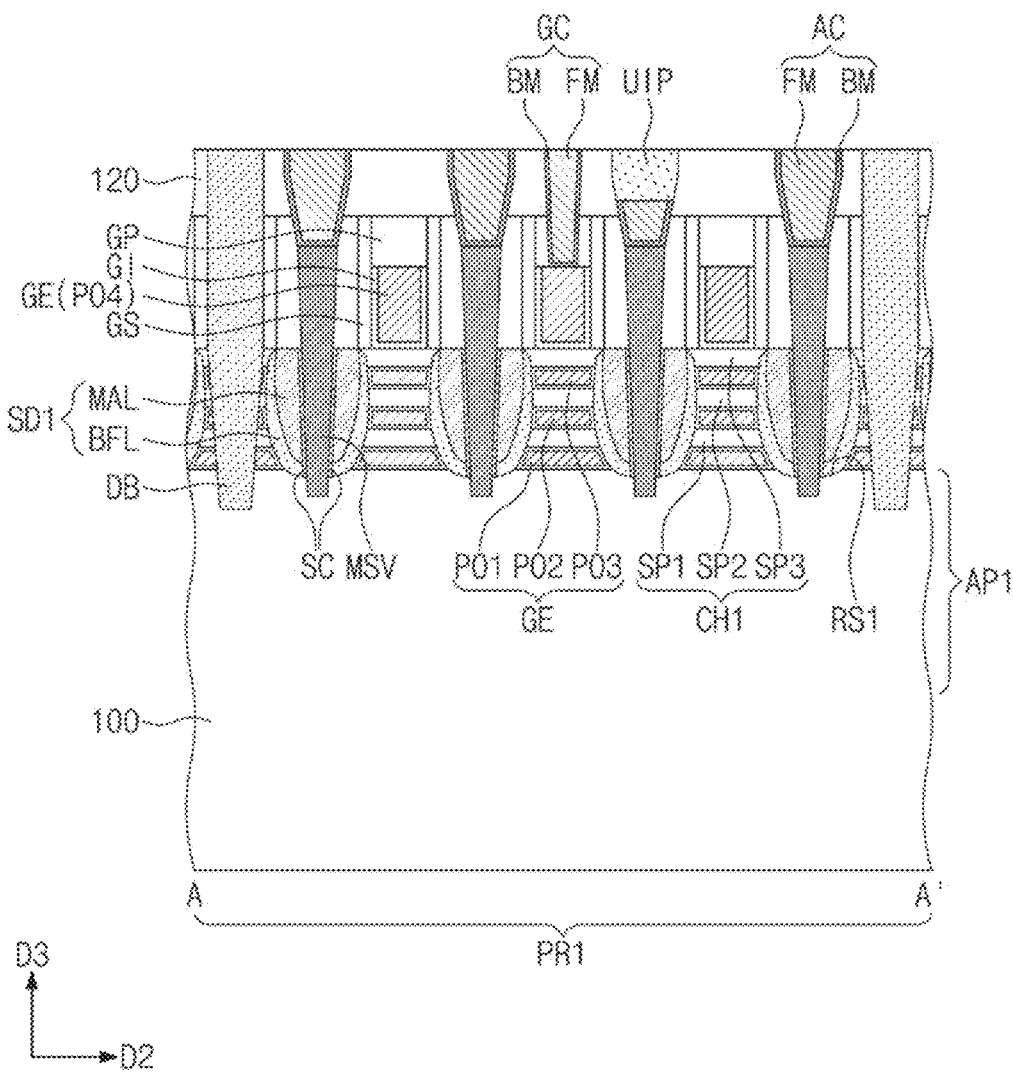
Figure 12B:
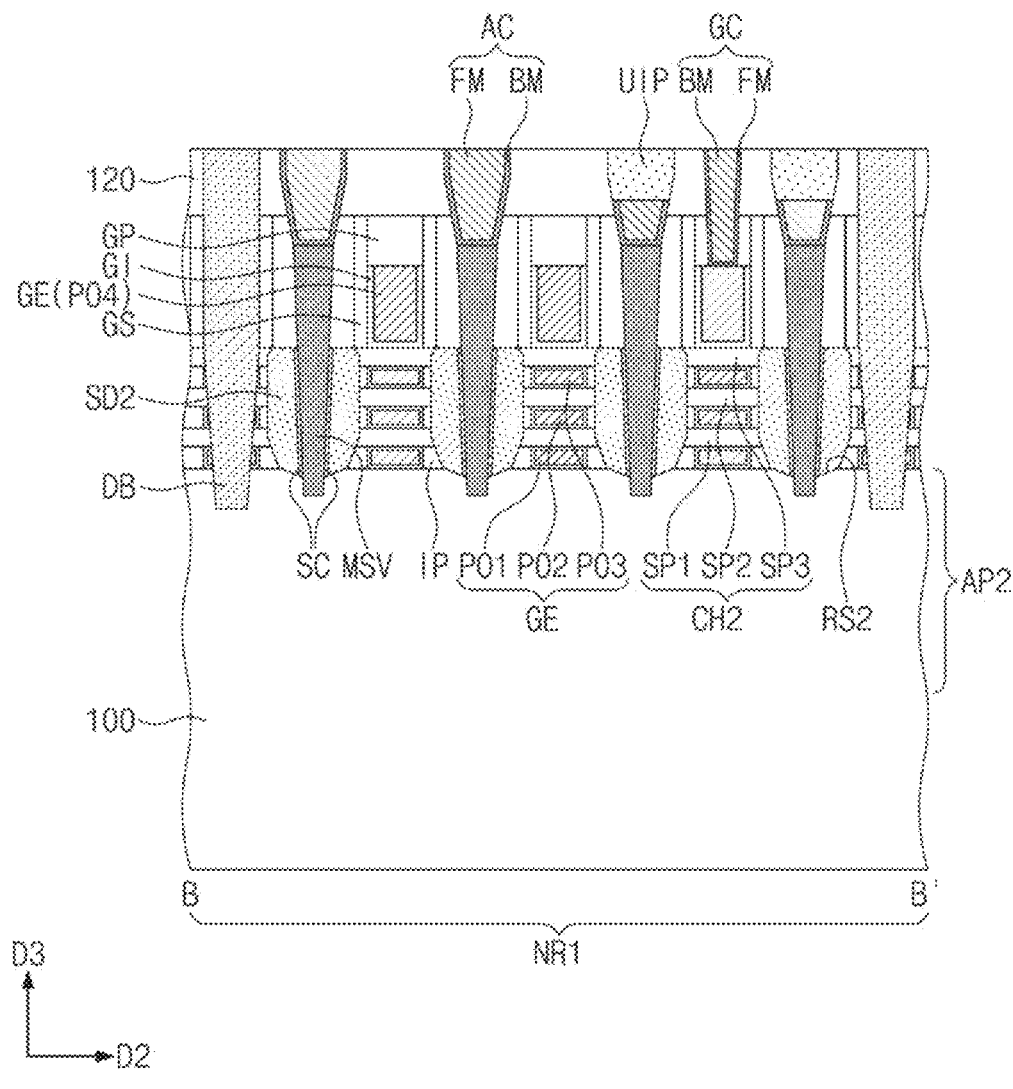
Figure 12C:
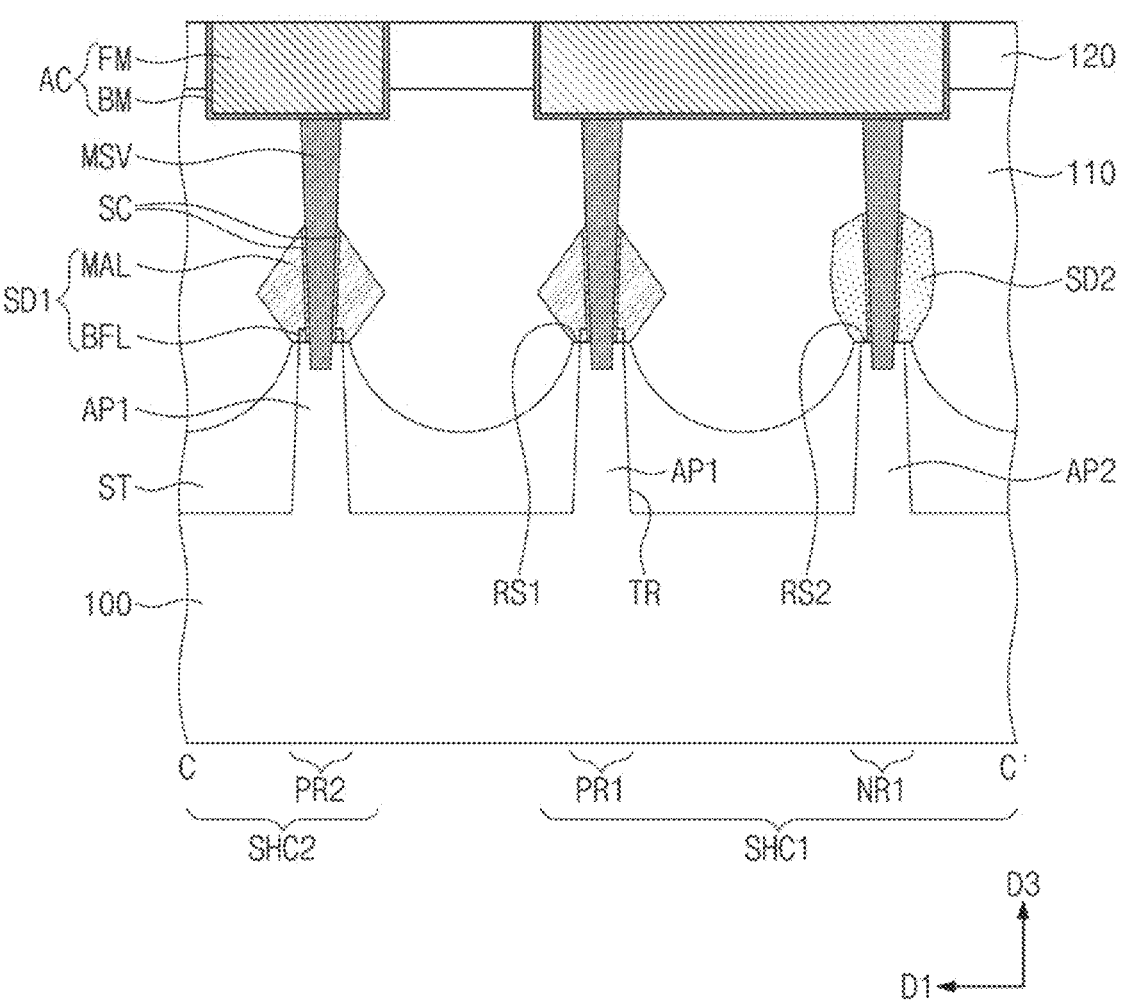
Figure 12D:
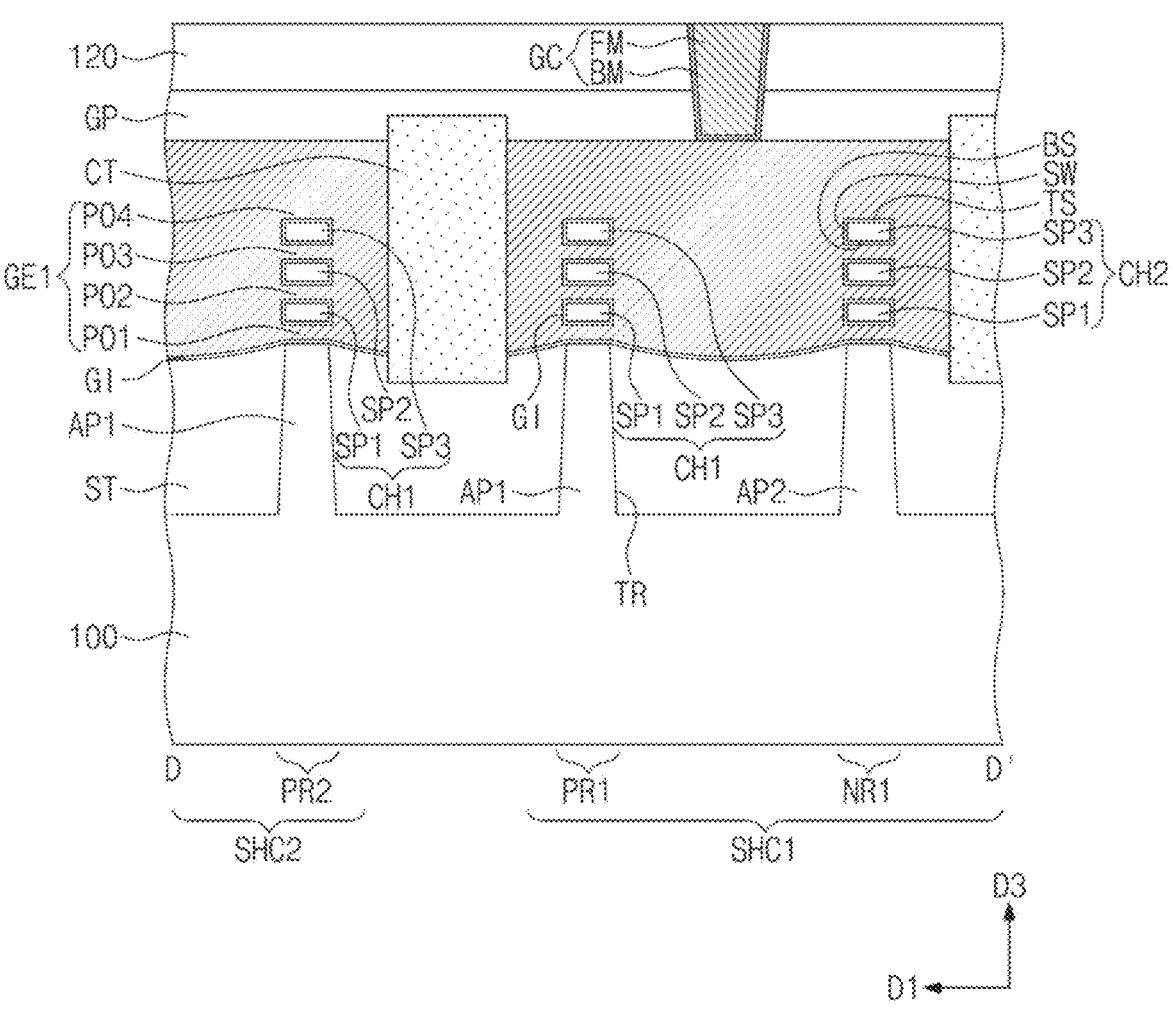

The second semiconductor layers SAL exposed through the outer region ORG may be selectively removed to form inner regions IRG (refer to FIG. 11D). An etching process for selectively etching the second semiconductor layers SAL may be performed to remove only the second semiconductor layers SAL while leaving the first to third semiconductor patterns SP1, SP2, and SP3 intact. The etching process may have a high etching rate for silicon-germanium having a relatively high germanium concentration. For example, the etching process may have a high etching rate for silicon-germanium having a germanium concentration greater than about 10 at %.

During the etching process, the second semiconductor layers SAL on the first and second PMOSFET regions PR1 and PR2 and the first and second NMOSFET regions NR1 and NR2 may be completely removed. The etching process may be wet etching. The etching material used in the etching process may quickly remove the second semiconductor layer SAL having a relatively high germanium concentration. The first source/drain pattern SD1 on the first and second PMOSFET regions PR1 and PR2 may be protected during the etching process due to the buffer layer BFL having a relatively low germanium concentration.

Referring back to FIG. 11D, the second semiconductor layers SAL may be selectively removed, and thus the first to third semiconductor patterns SP1, SP2, and SP3 stacked on the first and second active patterns AP1 and AP2 may remain, respectively. First to third inner regions IRG1, IRG2, and IRG3 may be respectively formed through regions where the second semiconductor layers SAL are removed.

The first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and third semiconductor pattern SP3.

Referring to FIGS. 12A to 12D, a gate insulating layer GI may be conformally formed on the exposed first to third semiconductor patterns SP1, SP2, and SP3. A gate electrode GE may be formed on the gate insulating layer GI. The gate electrode GE may include first to third inner electrodes PO1, PO2, and PO3 respectively formed in the first to third inner regions IRG1, IRG2, and IRG3, and an outer electrode PO4 formed in the outer region ORG.

As the gate electrode GE is recessed, a height thereof may be reduced. While the gate electrode GE is recessed, upper portions of the first and second gate cutting patterns CT1 and CT2 may also be slightly recessed. A gate capping pattern GP may be formed on the recessed gate electrode GE.

A second interlayer insulating layer 120 may be formed on the first interlayer insulating layer 110. The second interlayer insulating layer 120 may include a silicon oxide layer. Active contacts AC may be formed that penetrate the second interlayer insulating layer 120 and extend into the first interlayer insulating layer 110 to be electrically connected to the through patterns MSV. The active contacts AC and through patterns MSV may be self-aligned. A gate contact GC electrically connected to the gate electrode GE may be formed through the second interlayer insulating layer 120 and the gate capping pattern GP.

Forming each of the active contact AC and the gate contact GC may include forming a barrier pattern BM and forming a conductive pattern FM on the barrier pattern BM. The barrier pattern BM may be conformally formed and may include a metal layer/metal nitride layer. The conductive pattern FM may include a low-resistance metal.

A pair of separation structures DB may be formed on both sides of each of the first and second single height cells SHC1 and SHC2. The separation structure DB may extend from the second insulating interlayer 120 into the active pattern AP1 or AP2 through the gate electrode GE. The separation structure DB may include an insulating material such as a silicon oxide layer or a silicon nitride layer.

Figure 13A:
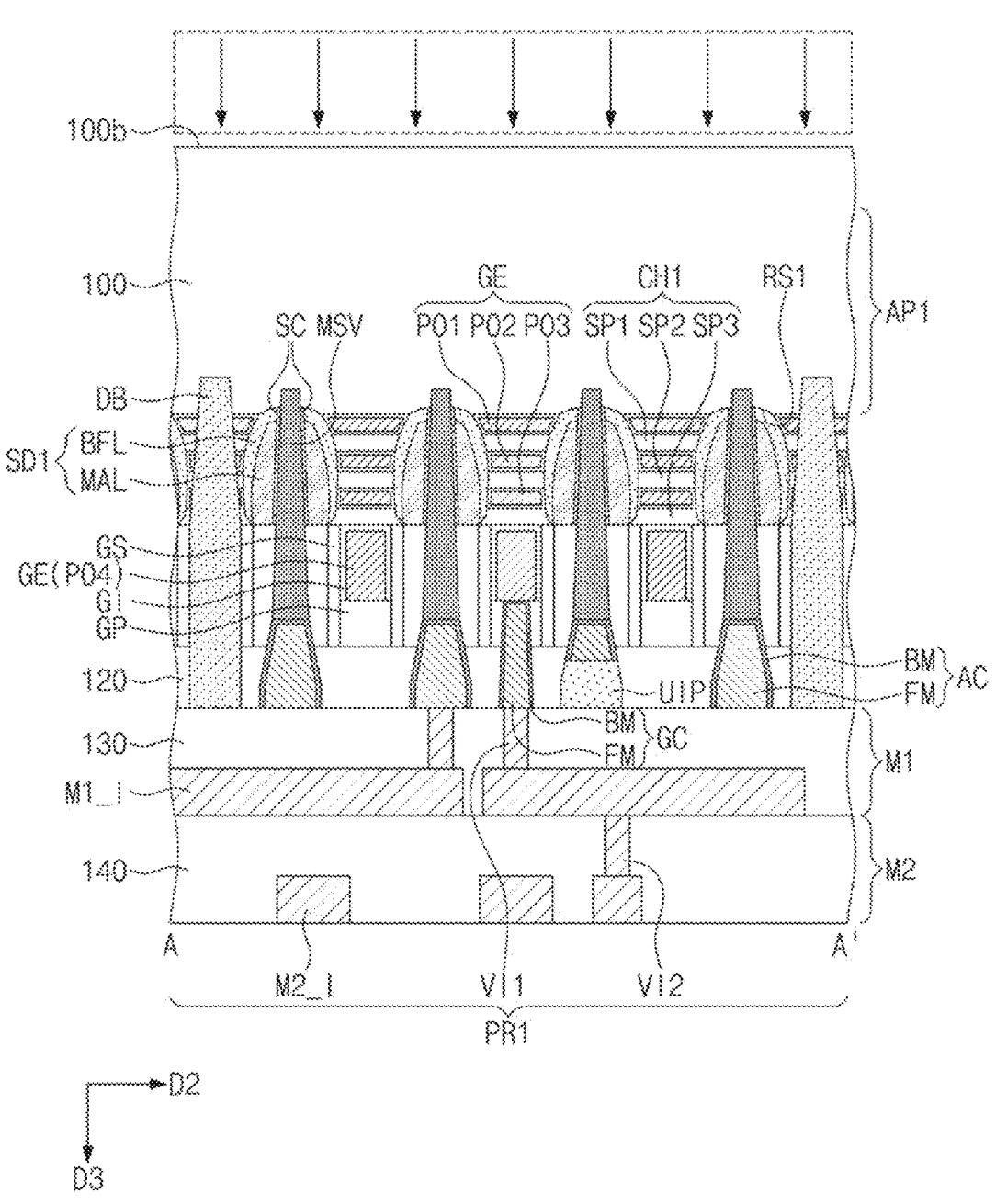
Figure 13B:
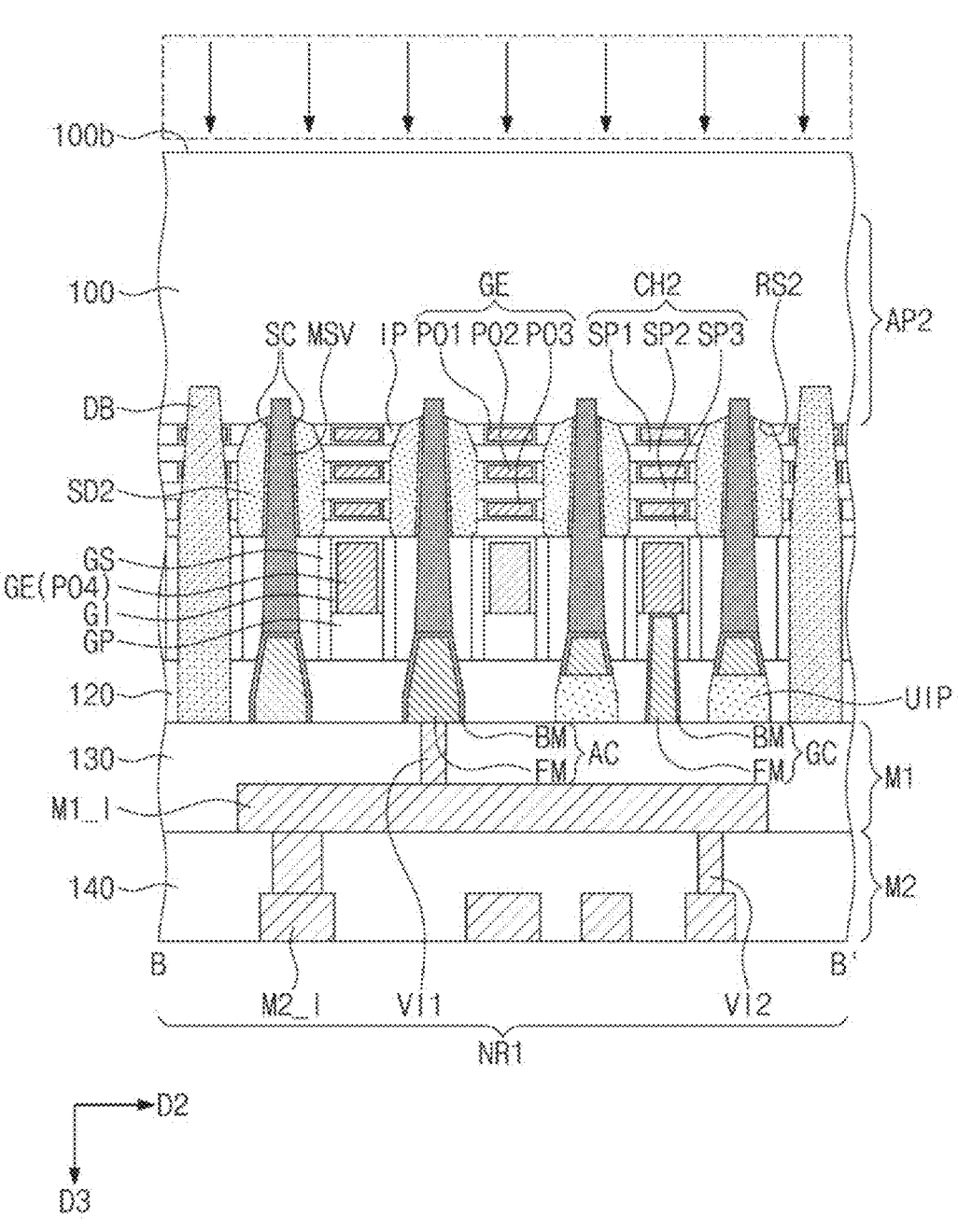
Figure 13C:
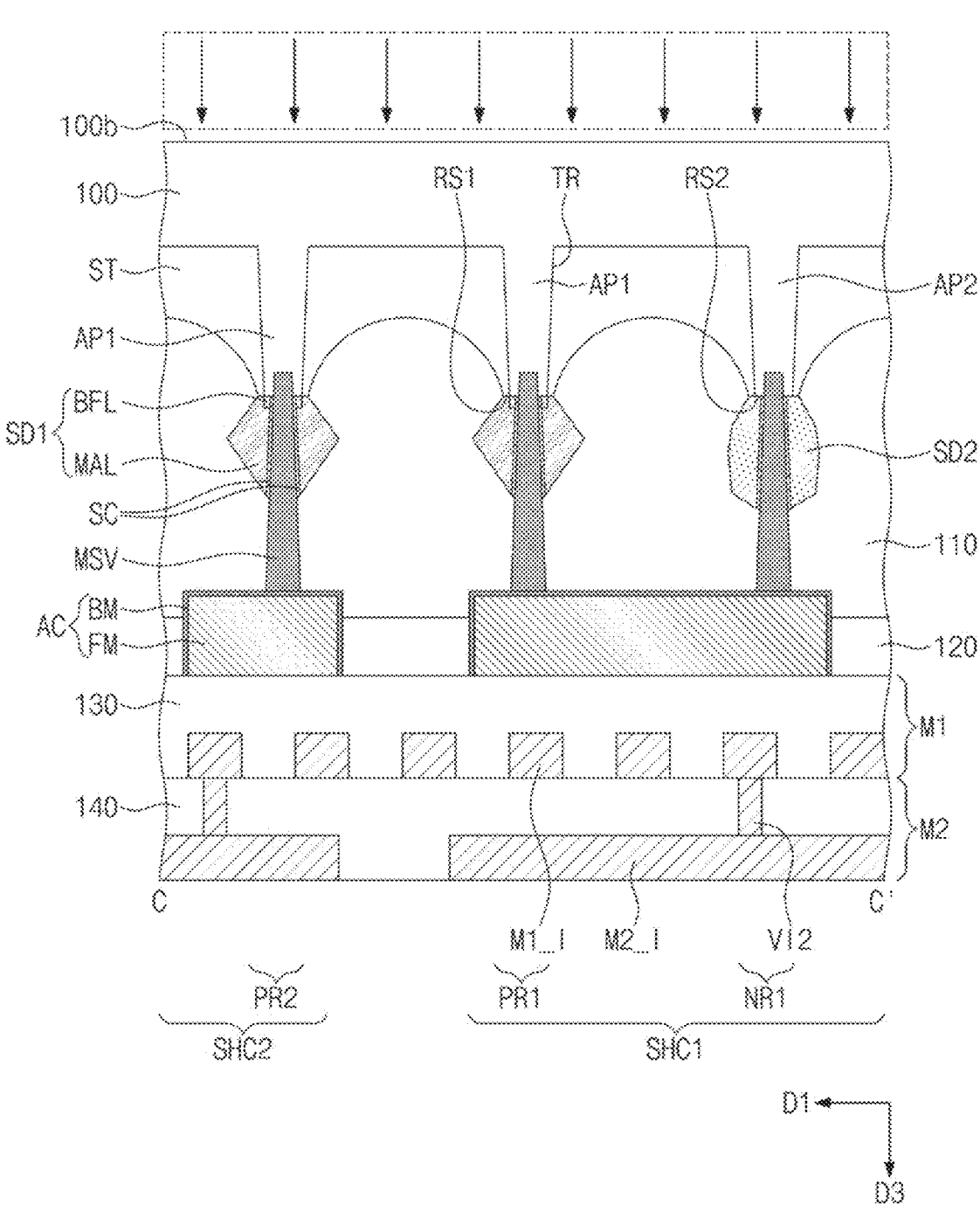

Referring to FIGS. 13A to 13C, a third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

After a back-end of line (BEOL) process is completed, the substrate 100 may be turned over so that a bottom surface 100b of the substrate 100 is exposed. A planarization process may be performed on the bottom surface 100b of the substrate 100 to reduce a thickness of the substrate 100.

Figure 14A:
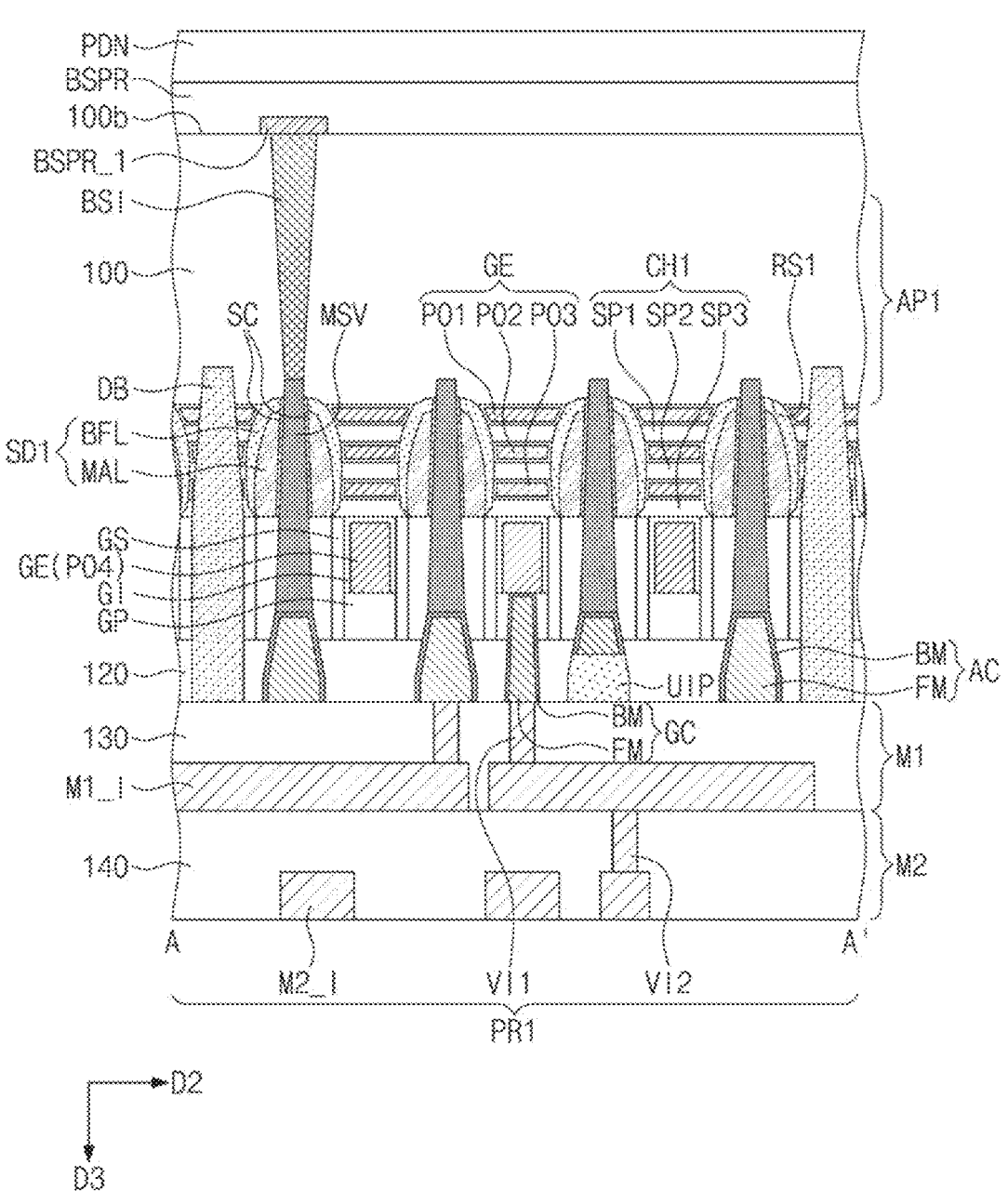
Figure 14B:
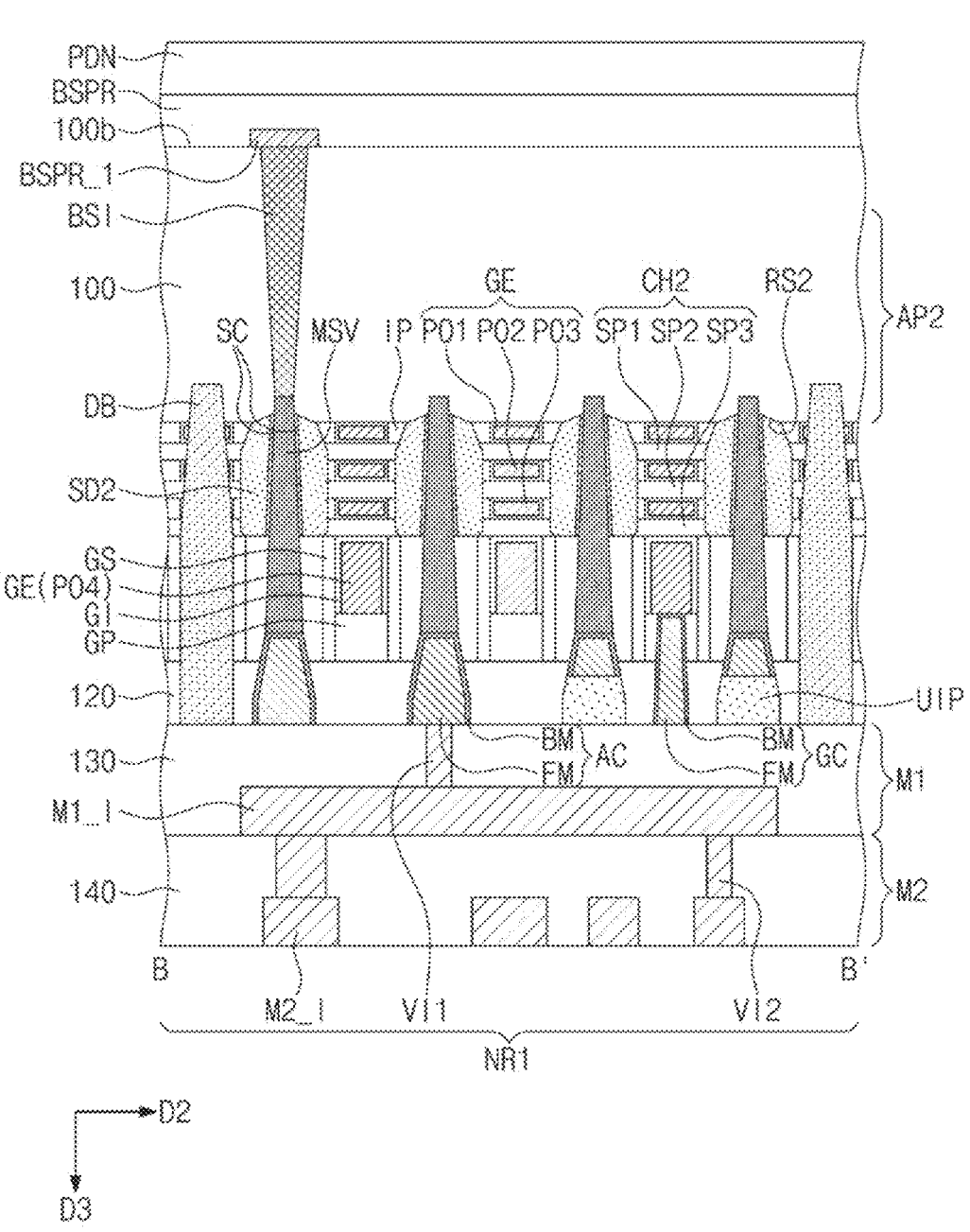
Figure 14C:
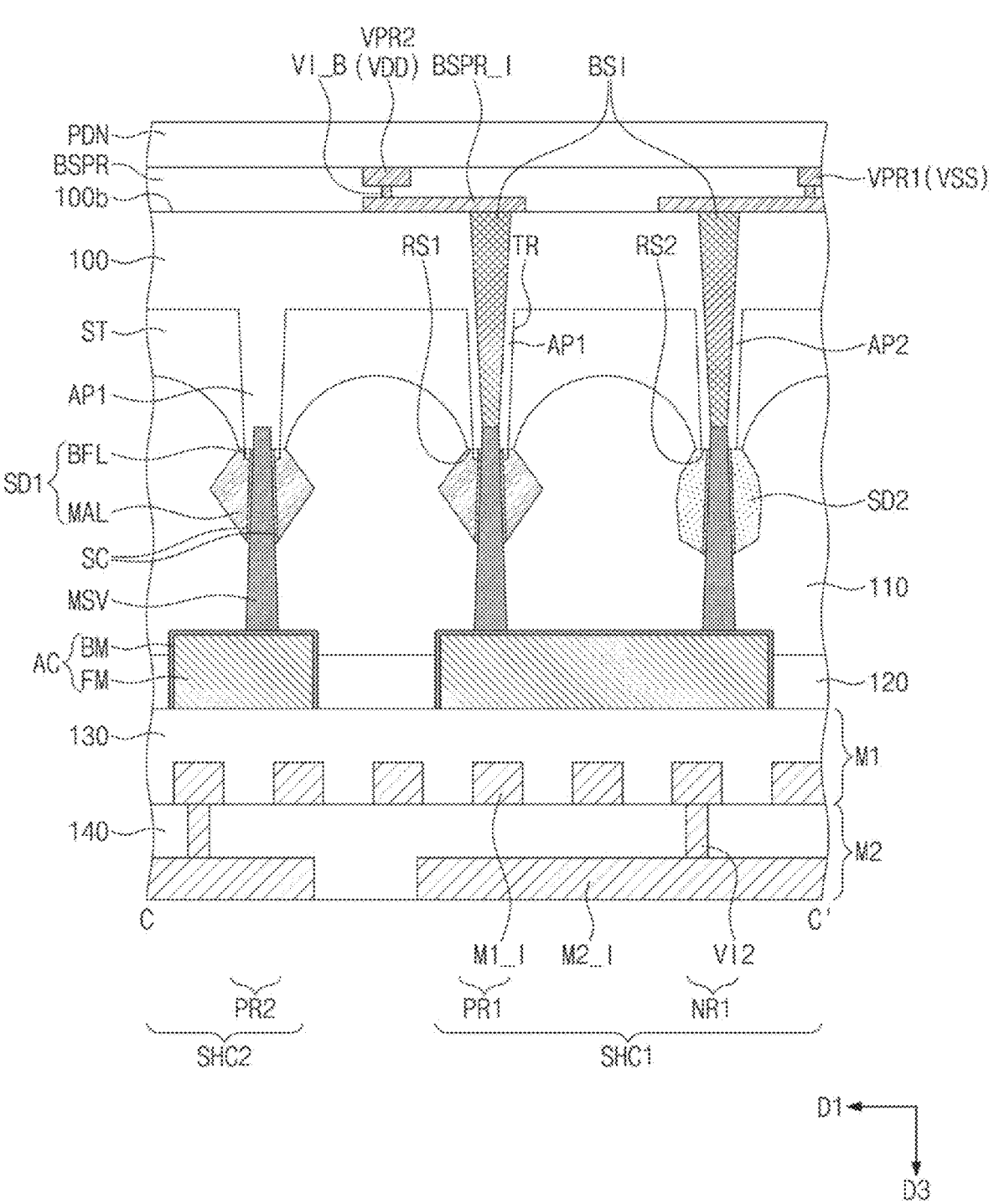

Referring to FIGS. 14A to 14C, mask patterns may be formed on the bottom surface 100b of the substrate 100 and the substrate 100 (i.e., first and second active patterns AP1 and AP2) may be etched using the mask patterns as an etching mask to form buried connectors BSI. The buried connector BSI may be formed to contact a bottom surface of the through pattern MSV. That is, the buried connector BSI may be self-aligned through the through pattern MSV.

The buried connector BSI and the through pattern MSV may be individually formed through different processes. The buried connector BSI and the through pattern MSV may be self-aligned. The buried connector BSI and the through pattern MSV may include a metal material, and thus contact resistance at an interface therebetween may be reduced. As a result, a semiconductor device according to the manufacturing method of the disclosure may improve both reliability and electrical characteristics.

Forming the buried connector BSI may include forming a trench region by etching the substrate 100, uniformly depositing insulating materials on both sidewalls of the trench region, and conformally filling metal materials in the trench region and on the insulating materials.

Forming the trench region may include etching the liner layer LIN (in FIG. 15A) covering the lower portion of the substrate 100 and the through pattern MSV. Accordingly, the buried connectors BSI may contact a bottom surface of the through pattern MSV and be electrically connected. Depositing the insulating materials uniformly is to form a buried spacer BSSP (in FIG. 5A) provided on both sidewalls of the buried connector BSI. The insulating material may be silicon oxide, silicon nitride or silicon oxynitride. The buried connector BSI may include a metal material. For example, the buried connector BSI may include copper, molybdenum, or ruthenium. The buried connector BSI and the through pattern MSV may include the same or different metal materials.

The buried connector BSI and the bottom surface 100b of the substrate 100 may be coplanar with each other. A backside interconnection layer BSPR may be formed on the coplanar surface. The backside interconnection layer BSPR may be formed by performing a patterning process. The backside interconnection layer BSPR may include first to third lower power wirings VPR1, VPR2, and VPR3 (in FIG. 4) and a plurality of metal wirings BSPR_I electrically connected thereto. The backside interconnection layer BSPR may further include a rear via VI_B connecting the first to third lower power wirings VPR1, VPR2, and VPR3 (in FIG. 4) and the metal wirings BSPR_I. The BSPR may include wirings for routing between cells.

A power transmission network layer PDN may be formed on the backside interconnection layer BSPR. The power transmission network layer PDN may apply a source voltage or a drain voltage to the lower power wirings VPR1, VPR2, and VPR3 (in FIG. 4).

Figure 15A:
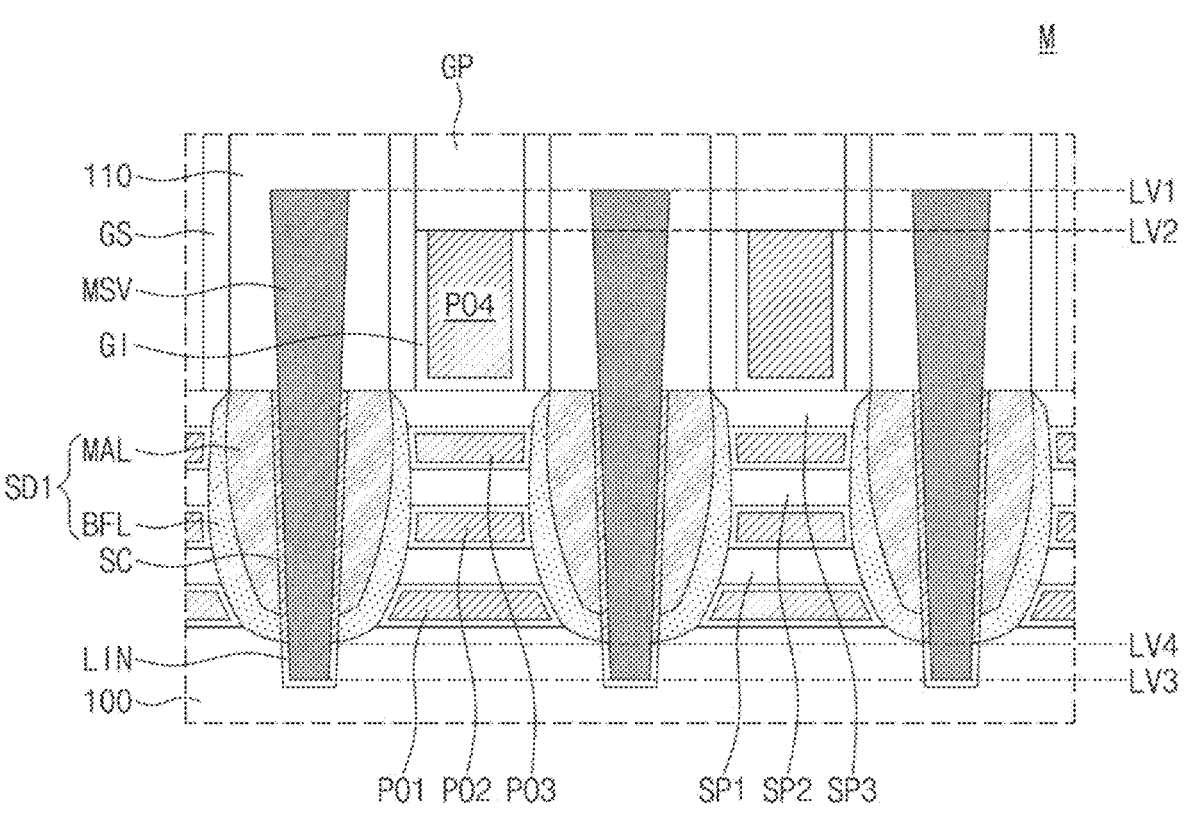
FIGS. 15A, 15B and 15C are enlarged views illustrating embodiments of region 'M' of FIG. 5A according to embodiments of the disclosure.
Figure 15A:
Figure 15B:
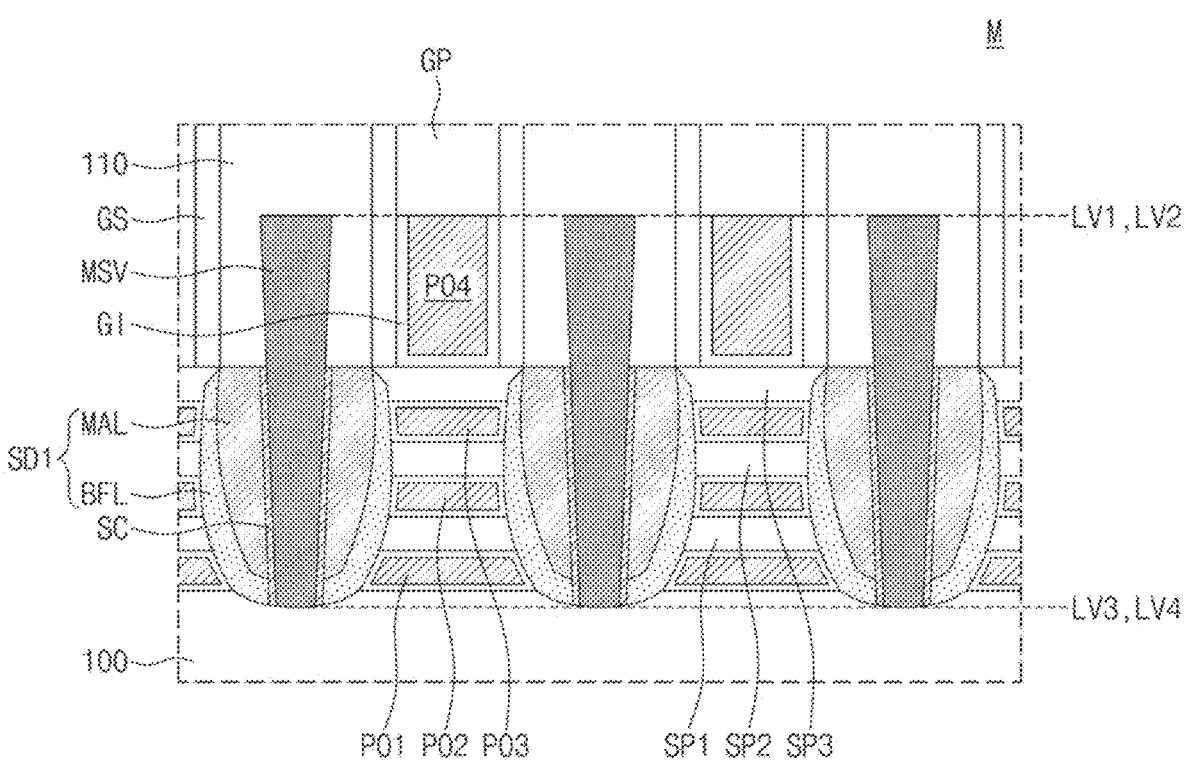
Figure 15B:
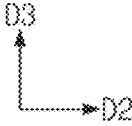
Figure 15C:
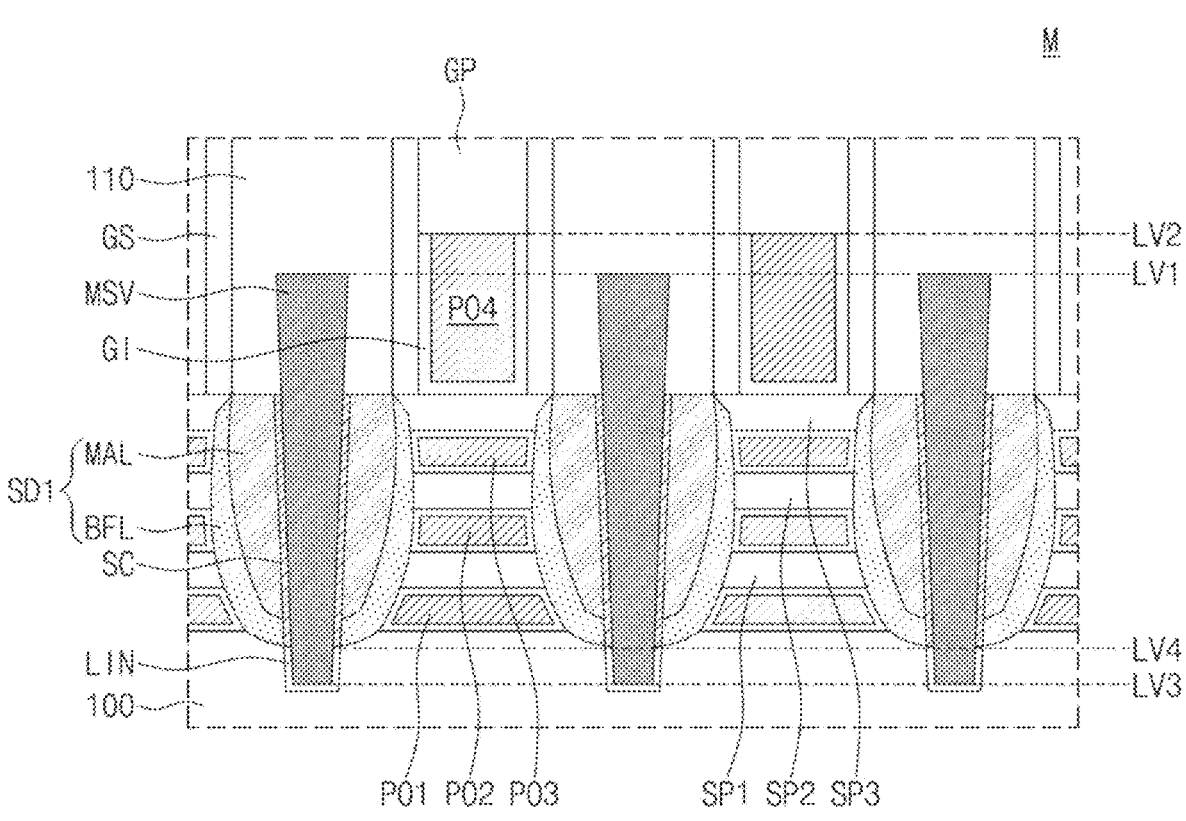
Figure 15C:
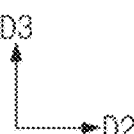
Figure 16A:
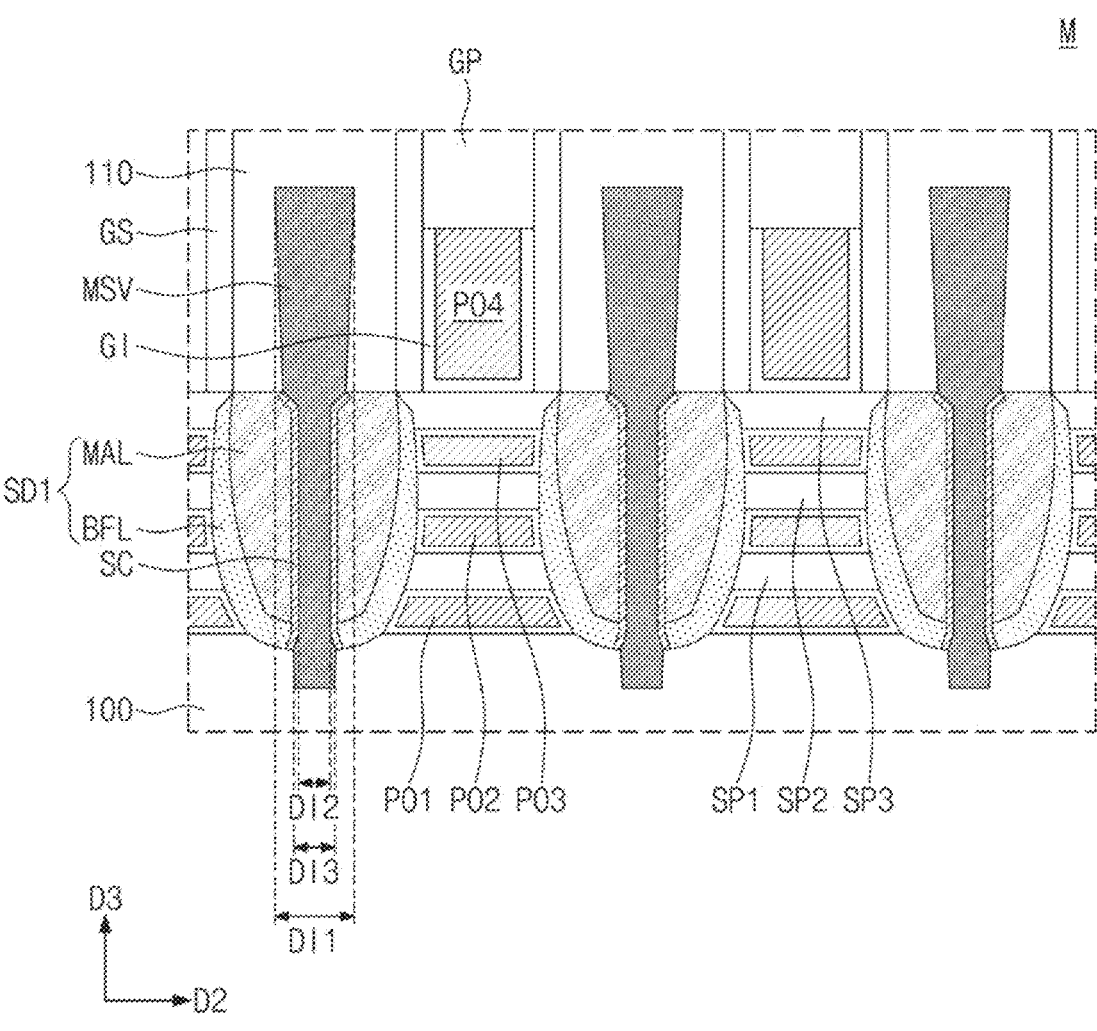
FIGS. 16A and 16B are enlarged views illustrating other embodiments of FIG. 15A, according to embodiments of the disclosure.
Figure 16B:
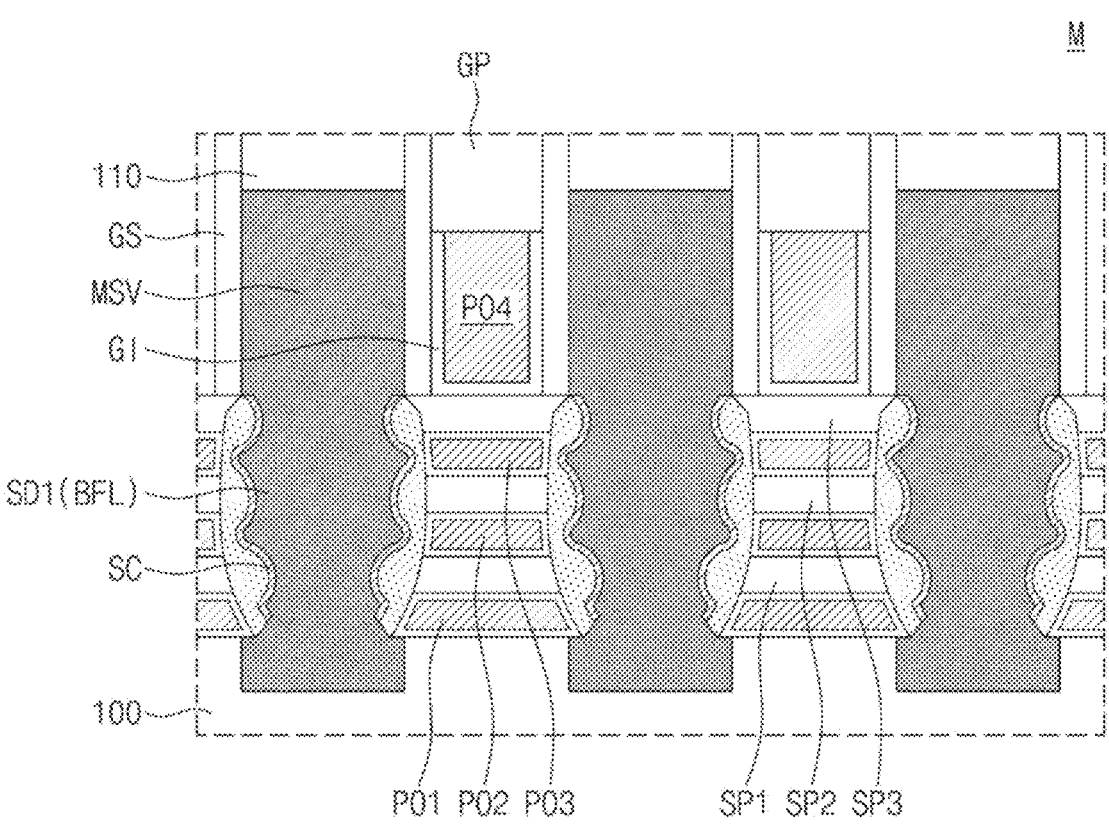
Figure 16B:
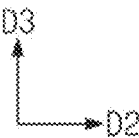

FIGS. 15A, 15B and 15C are enlarged views illustrating embodiments of region 'M' of FIG. 5A according to embodiments of the disclosure. FIGS. 16A and 16B are enlarged views illustrating other embodiments of FIG. 15A, according to embodiments of the disclosure.

Referring to FIGS. 15A through 16B, the through pattern MSV, the metal-compound semiconductor layer SC, and the first source/drain pattern SD1 will be described in more detail. Referring to FIG. 15A, the through pattern MSV may pass through the first source/drain pattern SD1. The through pattern MSV may pass through a center of the first source/drain pattern SD1. A center line of the through pattern MSV and a center line of the first source/drain pattern SD1 may be collinear.

The through pattern MSV may extend in the third direction D3 from the first source/drain pattern SD1. That is, the through pattern MSV may extend up to the first interlayer insulating layer 110 in the third direction D3 and extend downward to the substrate 100 (i.e., the first active pattern AP1 in FIG. 5A). A height level of an upper surface of the through pattern MSV in the third direction D3 may be defined as a first level LV1. A height level of a bottom surface of the through pattern MSV in the third direction D3 may be defined as a third level LV3.

A height level of an upper surface of the outer electrode PO4 of the gate electrode GE in the third direction may be defined as a second level LV2. An upper surface of the outer electrode PO4 may be coplanar with an upper surface of the gate insulating layer GI surrounding the outer electrode PO4. The coplanar surface may contact a lower surface of the gate capping pattern GP. The first level LV1 may be higher than the second level LV2.

A height level of the lower surface of the first source/drain pattern SD1 in the third direction D3 may be defined as a fourth level LV4. A lower surface of the first source/drain pattern SD1 may be a lower surface of the buffer layer BFL. That is, the fourth level LV4 may be a height level of the lower surface of the buffer layer BFL in the third direction D3. The fourth level LV4 may be lower than a lower surface of the first semiconductor pattern SP1. The fourth level LV4 may be lower than the lower surface of the first inner electrode PO1 among the gate electrodes GE. The third level LV3 may be lower than the fourth level LV4. That is, the upper surface of the through pattern MSV may be higher than the upper surface of the outer electrode PO4, and the lower surface of the through pattern MSV may be lower than the lower surface of the first source/drain pattern SD1.

A metal-compound semiconductor layer SC may be provided on both sides of the through pattern MSV. The metal-compound semiconductor layer SC may be a silicide layer SC. The silicide layer SC may be interposed between the side surface of the through pattern MSV and the first source/drain pattern SD1. In detail, the silicide layer SC may be interposed between a side surface of the through pattern MSV and portions of the main layer MAL and the buffer layer BFL. The silicide layer SC may include at least one of titanium-silicide, tantalum-silicide, tungsten-silicide, nickel-silicide, and cobalt-silicide. A thickness of the silicide layer SC may be about 5 Å to about 20 Å.

The through pattern MSV may include a metal material. For example, the through pattern MSV may include at least one metal of aluminum, copper, tungsten, molybdenum, and cobalt. The through pattern MSV may include at least one of titanium, tantalum, nickel, and platinum.

A liner layer LIN may be provided to surround a lower portion of the through pattern MSV. The liner layer LIN may conformally cover portions of the bottom and side surfaces of the through pattern MSV. The liner layer LIN may cover the lower portion of the through pattern MSV and may extend to the lower surface of the first source/drain pattern SD1. The liner layer LIN may include silicon oxide, silicon nitride, or silicon oxynitride. A thickness of the liner layer LIN may be about 5 Å to about 20 Å. The thickness of the liner layer may be the same as that of the silicide layer. The liner layer LIN may insulate the lower portion of the through pattern MSV from the substrate 100 (i.e., the first active pattern AP1 in FIG. 5A). When the through pattern MSV and the buried connector BSI (in FIG. 5A) are electrically connected, the liner layer LIN may not be interposed therebetween.

A planar shape of the through pattern MSV may be circular, elliptical or polygonal. For example, the planar shape of the through pattern MSV may have a circular shape, and the through pattern MSV may have a cylindrical or cylindrical shape. Accordingly, a cross-sectional area of the silicide layer SC interposed between the through pattern MSV and the first source/drain pattern SD1 may be increased. Contact resistance of the through pattern MSV may be reduced, and electrical characteristics of the semiconductor device may be improved.

Referring to FIGS. 5A and 15A, the through pattern MSV and the buried connector BSI according to embodiments may be individually formed through different processes. The through pattern MSV may be self-aligned through the gate electrode GE and the gate spacer GS. The buried connector BSI may be self-aligned through the through pattern MSV. Accordingly, misalignment between the through pattern MSV and the buried connector BSI may be prevented, and reliability of the semiconductor device may be improved.

The through pattern MSV and the buried connector BSI may include the same or different metal materials. A metal-compound semiconductor layer may not be interposed between the through pattern MSV and the buried connector BSI which have metal materials. In addition, a contact area between the through pattern MSV and the buried connector BSI may be maximized, thereby reducing contact resistance therebetween. As a result, embodiments of the disclosure may improve both reliability and electrical characteristics of a semiconductor device.

Referring to FIG. 15B, the first level LV1 may be the same as the second level LV2. The third level LV3 may be the same as the fourth level LV4. That is, the upper surface of the through pattern MSV and the upper surface of the outer electrode PO4 may have the same height level in the third direction D3, and the lower surface of the through pattern MSV and the lower surface of the first source/drain pattern SD1 may have the same height level in the third direction D3. There may be no liner layer LIN because a portion of the through pattern MSV may be provided inside the first source/drain pattern SD1.

Referring to FIG. 15C, the first level LV1 may be a level lower than the second level LV2. The third level LV3 may be a lower level than the fourth level LV4. That is, the upper surface of the through pattern MSV may be lower than the upper surface of the outer electrode PO4, and the lower surface of the through pattern MSV may be lower than the lower surface of the first source/drain pattern SD1. The liner layer LIN may cover the lower portion of the through pattern MSV.

Referring to FIG. 16A, the through pattern MSV may be formed while the SEG process of the main layer MAL is stopped. That is, the through pattern MSV may be formed in a state in which the main layer MAL is not completely merged. A planar shape of the through pattern MSV in the second direction D2 may be circular, elliptical, or polygonal. For example, a planar shape of the through pattern MSV in the second direction D2 may have a circular shape, and the through pattern MSV may have a dumbbell shape. The silicide layer SC may be interposed between the through pattern MSV and the first source/drain pattern SD1.

A first diameter DI1 may be defined as a diameter of a cross-section of the through pattern MSV provided in the first interlayer insulating layer 110 in the second direction D2. A second diameter DI2 may be defined as a diameter of a cross-section of the through pattern MSV provided in the first source/drain pattern SD1 in the second direction D2. A third diameter DI3 may be defined as a diameter of a cross-section of the through pattern MSV provided in the substrate 100 in the second direction D2.

The first diameter DI1 and the third diameter DI3 may be larger than the second diameter DI2. The first diameter DI1 may be the same as the third diameter DI3. A diameter of a cross-section of the through pattern MSV between the first interlayer insulating layer 110 and the first source/drain pattern SD1 in the second direction D2 may decrease toward the substrate 100. A diameter of a cross-section of the through pattern MSV between the first source/drain pattern SD1 and the substrate 100 in the second direction D2 may decrease toward the first interlayer insulating layer 110. Thus, the through pattern MSV may have a dumbbell shape.

Referring to FIG. 16B, the through pattern MSV may be formed in a state in which the SEG process of the buffer layer BFL is not sufficiently performed. That is, the through pattern MSV may be formed in a state in which the buffer layer BFL has not sufficiently grown using the first to third semiconductor patterns SP1 to SP3 as seed layers. The silicide layer SC may be interposed between the through pattern MSV and the first source/drain pattern SD1. An inner surface of the through pattern MSV may have a wavy profile, and accordingly, the silicide layer SC may also have a wavy profile.

A planar shape of a portion of the through pattern MSV in the second direction D2 may be circular, elliptical, or polygonal. In this case, a diameter of the portion of the through pattern MSV may be greater than the first to third diameters DI1, DI2, and DI3 (in FIG. 16A). This is to allow the through pattern MSV to contact the buffer layer BFL, which is not sufficiently grown.

Figure 17A:
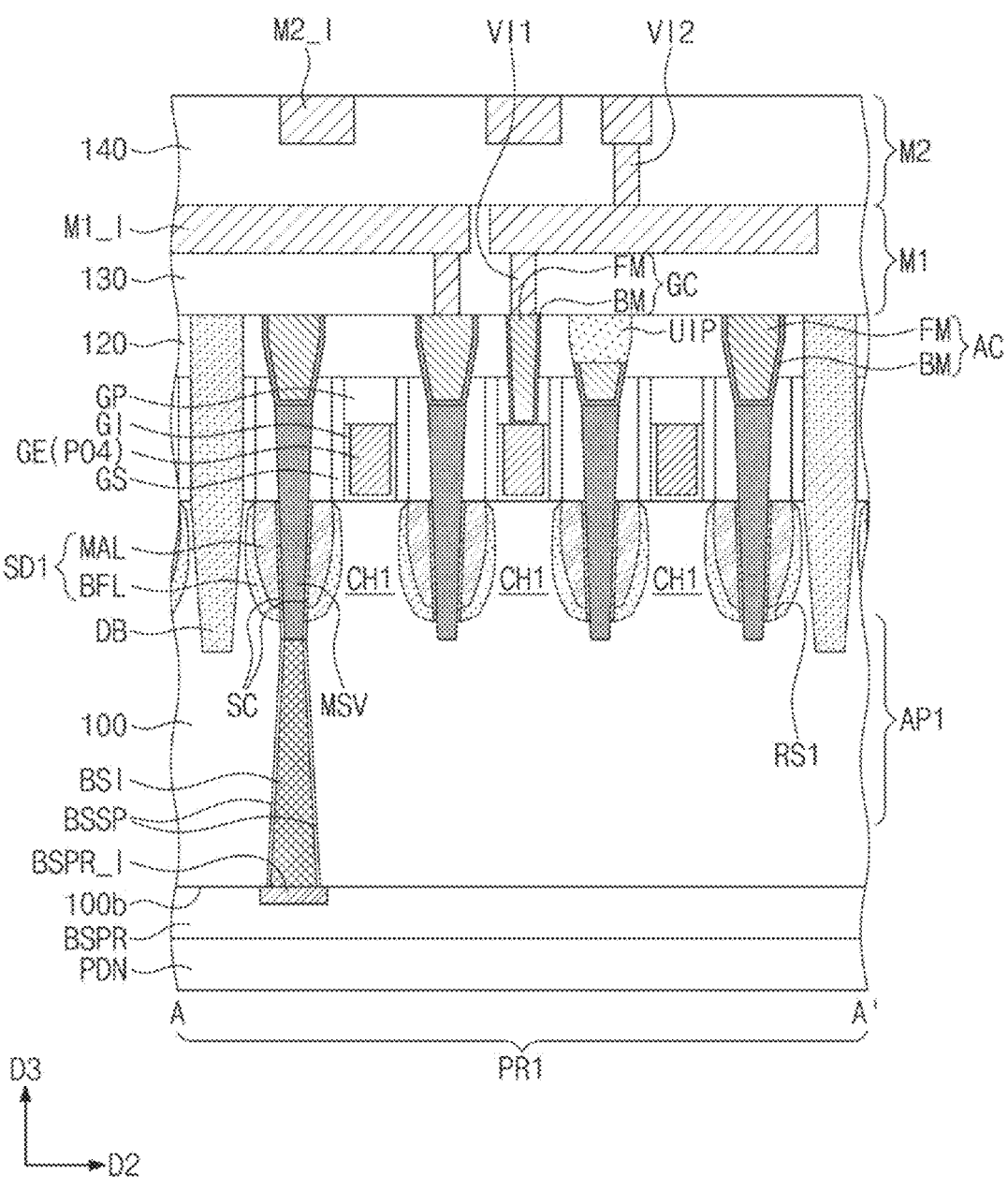
FIGS. 17A, 17B and 17C are cross-sectional views illustrating a semiconductor device according to an embodiment of the disclosure.
Figure 17B:
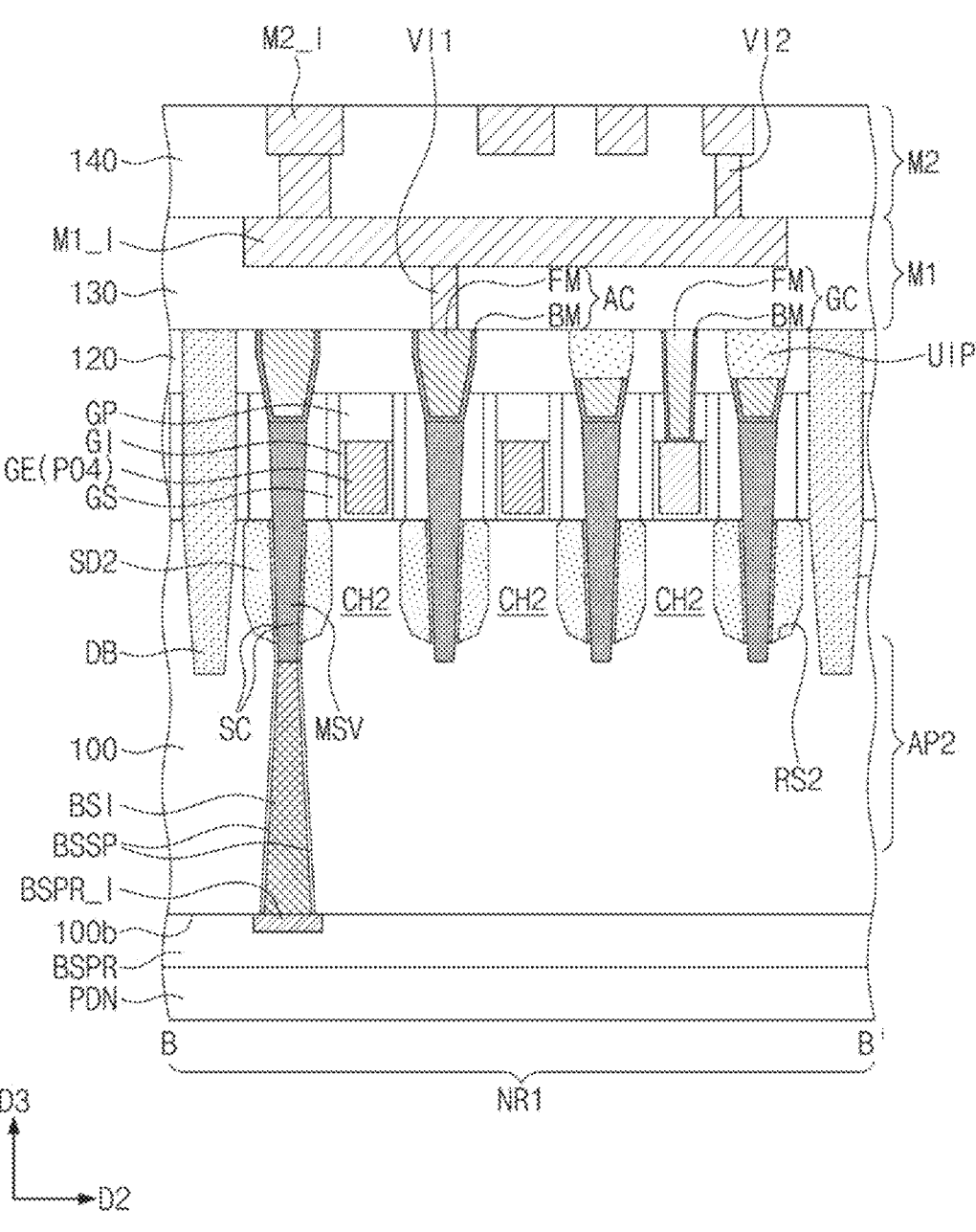
Figure 17C:
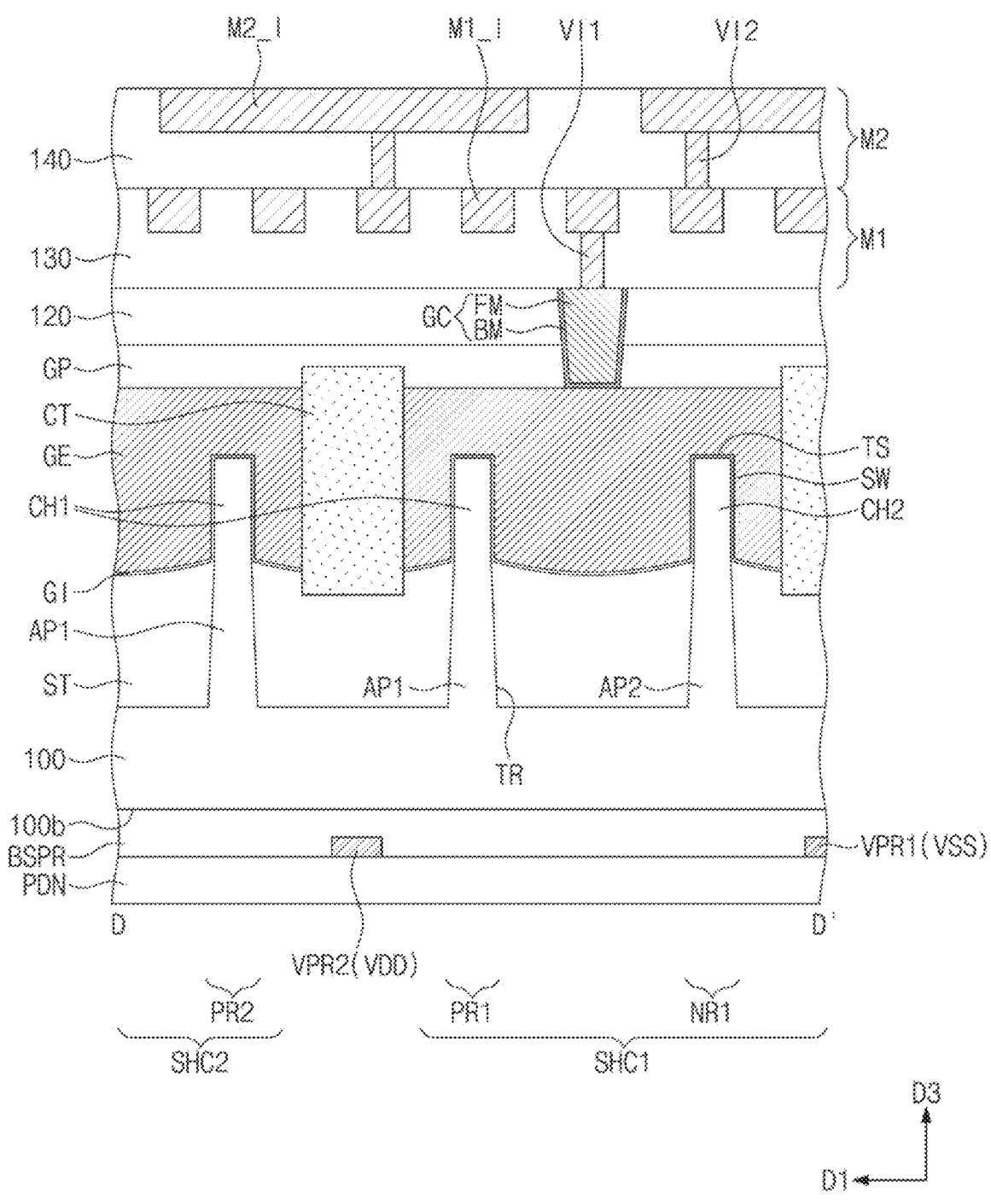

FIGS. 17A, 17B and 17C are cross-sectional views illustrating a semiconductor device according to an embodiment of the disclosure. FIGS. 17A to 17C are cross-sectional views taken along lines A-A', B-B', and D-D' of FIG. 4 to illustrate a semiconductor device according to another embodiment of the disclosure. Referring to FIGS. 4 and 17A to 17C, a device isolation layer ST may define a first active pattern AP1 and a second active pattern AP2 on a substrate 100. The first active pattern AP1 may be defined on each of first PMOSFET region PR1 and second PMOSFET region PR2, and the second active pattern AP2 may be defined on each of first NMOSFET region NR1 and second NMOSFET region NR2.

The device isolation layer ST may cover lower sidewalls of each of the first and second active patterns AP1 and AP2. An upper portion of each of the first and second active patterns AP1 and AP2 may protrude above the device isolation layer ST (refer to FIG. 17C).

The first active pattern AP1 may include first source/drain patterns SD1 and a first channel pattern CH1 therebetween. The second active pattern AP2 may include second source/drain patterns SD2 and a second channel pattern CH2 therebetween.

Referring to FIG. 17C, each of the first and second channel patterns CH1 and CH2 may not include the stacked first to third semiconductor patterns SP1, SP2, and SP3 previously described with reference to FIGS. 5A to 5D. Each of the first and second channel patterns CH1 and CH2 may have a semiconductor pillar shape protruding above the device isolation layer ST.

A gate electrode GE may be provided on an upper surface TS and both sidewalls SW of each of the first and second channel patterns CH1 and CH2. That is, a transistor according to the present embodiment may be a three-dimensional field effect transistor (e.g., FinFET) in which the gate electrode GE surrounds the channel in three-dimensional.

A first interlayer insulating layer 110 and a second interlayer insulating layer 120 may be provided on the entire surface of the substrate 100. Active contacts AC may penetrate the second interlayer insulating layer 120 to be connected to a through pattern MSV in the first interlayer insulating layer 110, respectively. A gate contact GC may penetrate the second interlayer insulating layer 120 and a gate capping pattern GP to be connected to the gate electrode GE. A detailed description of the active contacts AC and gate contacts GC may be substantially the same as that previously described with reference to FIGS. 4 and 5A to 5D, and repeated descriptions may be omitted.

A third interlayer insulating layer 130 may be provided on the second interlayer insulating layer 120. A fourth interlayer insulating layer 140 may be provided on the third interlayer insulating layer 130. A first metal layer M1 may be provided in the third interlayer insulating layer 130. A second metal layer M2 may be provided in the fourth interlayer insulating layer 140. A detailed description of the first metal layer M1 and the second metal layer M2 may be substantially the same as that previously described with reference to FIGS. 4 and 5A to 5D.

First to third lower power wirings VPR1, VPR2, and VPR3 may be provided on a lower portion of the substrate 100. A backside interconnection layer BSPR may be provided on a bottom surface 100*b* of the substrate 100. A power transmission network layer PDN may be provided on a bottom surface of the backside interconnection layer BSPR. A detailed description of the first to third lower power wirings VPR1, VPR2, and VPR3 and the power transmission network layer PDN may be substantially the same as that described above with reference to FIGS. 4 and 5A to 5D.

In the three-dimensional field effect transistor according to the disclosure, the through pattern may be inserted into the source/drain pattern, thereby reducing the contact resistance between the source/drain pattern and the through pattern. The buried connector may be formed on the lower surface of the through pattern, thereby reducing the contact resistance between the buried connector and the through pattern. In addition, the active contact may be self-aligned on the through pattern, and thus the efficiency of the process of manufacturing the semiconductor device may be improved. According to the disclosure, the contact resistance between the through pattern and the source/drain pattern and between the through pattern and the buried connector may be reduced and the self-aligned active contact may be provided, thereby improving the electrical characteristics and reliability of the semiconductor device.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor device comprising:
    a substrate comprising an active pattern;
    a channel pattern on the active pattern, the channel pattern comprising a plurality of semiconductor patterns that are spaced apart from each other and are vertically stacked;
    a source/drain pattern connected to the plurality of semiconductor patterns;
    a through pattern penetrating from a top surface of the source/drain pattern to a bottom surface of the source/drain pattern;
    an interlayer insulating layer on the source/drain pattern;
    a metal-semiconductor compound layer between the source/drain pattern and the through pattern;
    a gate electrode on the plurality of semiconductor patterns, the gate electrode comprising:
        inner electrodes between adjacent semiconductor patterns of the plurality of semiconductor patterns; and
        an outer electrode on an uppermost semiconductor pattern of the plurality of semiconductor patterns;
    an active contact on the through pattern; and
    a first metal layer on the active contact, the first metal layer comprising a power wiring and first wirings connected to the active contact,
    wherein the top surface of the through pattern is lower than an upper surface of the interlayer insulating layer.

2. The semiconductor device of claim 1, further comprising:
    a buried connector connected to the bottom surface of the through pattern;
    buried spacers on sides of the buried connector;
    a backside interconnection layer on a lower surface of the buried connector and a bottom surface of the substrate; and
    a power transmission network layer on a bottom surface of the backside interconnection layer.

3. The semiconductor device of claim 1, wherein a first level of the top surface of the through pattern is the same as a second level of an upper surface of the outer electrode in a first direction, and wherein a third level of the bottom surface of the through pattern is the same as a fourth level of a lower surface of the source/drain pattern in the first direction.

4. The semiconductor device of claim 1, wherein a first level of the top surface of the through pattern is lower than a second level of an upper surface of the outer electrode, and wherein a third level of the bottom surface of the through pattern is lower than a fourth level of a lower surface of the source/drain pattern.

5. The semiconductor device of claim 1, wherein the through pattern comprises a first portion, a second portion, and a third portion, and wherein a first diameter of the first portion and a third diameter of the third portion are larger than a second diameter of the second portion.

6. The semiconductor device of claim 1, wherein an inner surface of the through pattern comprises a wavy profile, and wherein the metal-semiconductor compound layer comprises a wavy profile.

7. The semiconductor device of claim 1, wherein the through pattern comprises a metal material, and wherein the metal material comprises aluminum, copper, tungsten, molybdenum, cobalt, titanium, tantalum, nickel, platinum, or a combination thereof.

8. The semiconductor device of claim 1, wherein the metal-semiconductor compound layer comprises a silicide layer, and wherein the silicide layer comprises titanium-silicide, tantalum-silicide, tungsten-silicide, nickel-silicide, cobalt-silicide, or a combination thereof.

9. The semiconductor device of claim 1, wherein the metal-semiconductor compound layer has a thickness of about 5 Å to about 20 Å.

10. The semiconductor device of claim 1, further comprising a liner layer at least partially surrounding a lower portion of the through pattern, wherein the liner layer at least partially covers a bottom surface of the through pattern and a side surface of the through pattern, and wherein the liner layer extends to a lower layer of the source/drain pattern.

11. The semiconductor device of claim 10, wherein the liner layer has a thickness of about 5 Å to about 20 Å.

12. A semiconductor device comprising:

a substrate comprising an active pattern;

a channel pattern on the active pattern, the channel pattern comprising a plurality of semiconductor patterns that are spaced apart from each other and are vertically stacked;

a source/drain pattern connected to the plurality of semiconductor patterns;

a through pattern penetrating the source/drain pattern;

a metal-semiconductor compound layer between the source/drain pattern and the through pattern;

an active contact on the through pattern; and a buried connector in the substrate and connected to the through pattern, wherein the active contact is aligned with the through pattern and is connected to an upper surface of the through pattern, and wherein the buried connector is aligned with the through pattern and is connected to a bottom surface of the through pattern.

13. The semiconductor device of claim 12, wherein a width of the active contact decreases toward the through pattern.

14. The semiconductor device of claim 12, wherein a width of the buried connector increases toward a bottom surface of the substrate.

15. The semiconductor device of claim 12, wherein the through pattern and the active contact are self-aligned.

16. The semiconductor device of claim 12, wherein the buried connector comprises a metal material, and wherein the metal material comprises copper, molybdenum, ruthenium, or a combination thereof.

17. The semiconductor device of claim 12, wherein the active contact comprises a barrier pattern and a conductive pattern on the barrier pattern, wherein the barrier pattern comprises a metal layer or a metal nitride layer, and wherein the conductive pattern comprises a low-resistance metal material.

18. A semiconductor device comprising:

a substrate comprising an active region;

a device isolation layer defining an active pattern on the active region;

a source/drain pattern on the active pattern;

a channel pattern on the active pattern, the channel pattern comprising a plurality of semiconductor patterns that are spaced apart from each other and are vertically stacked;

a gate electrode on the plurality of semiconductor patterns, the gate electrode comprising:

inner electrodes between adjacent semiconductor patterns of the plurality of semiconductor patterns, and an outer electrode on an uppermost semiconductor pattern of the plurality of semiconductor patterns;

a gate insulating layer between the adjacent semiconductor patterns and the gate electrode;

a gate spacer on a sidewall of the gate electrode;

a gate capping pattern on an upper surface of the gate electrode;

a gate cutting pattern penetrating the gate electrode;

a through pattern penetrating the source/drain pattern and connected to the source/drain pattern;

a metal-semiconductor compound layer between the source/drain pattern and the through pattern;

an interlayer insulating layer at least partially covering the source/drain pattern, the gate capping pattern, and the through pattern;

an active contact penetrating the interlayer insulating layer such that the active contact is connected to the through pattern;

a gate contact penetrating the interlayer insulating layer and the gate capping pattern such that the gate contact is connected to the gate electrode;

a first metal layer on the interlayer insulating layer, the first metal layer comprising:

a power wiring; and first wirings connected to the active contact and the gate contact, respectively;

a second metal layer on the first metal layer, the second metal layer comprising second wirings connected to the first metal layer;

a buried connector extending from the through pattern toward a bottom surface of the substrate;

buried spacers on sides of the buried connector;

a backside interconnection layer on the bottom surface of the substrate, the backside interconnection layer being connected to the buried connector; and a power transmission network layer on a bottom surface of the backside interconnection layer, wherein the active contact, the through pattern, and the buried connector are aligned with each other in a direction perpendicular to a surface of the substrate.

19. The semiconductor device of claim 18, wherein a first height level of an upper surface of the through pattern in a first direction is higher than a second height level of an upper surface of the outer electrode in the first direction, and wherein a third height level of a lower surface of the through pattern in the first direction is lower than a fourth height level of a lower surface of the source/drain pattern in the first direction.

20. The semiconductor device of claim 18, wherein a cross-section of the through pattern is circular or elliptical, and wherein the through pattern has a cylindrical shape.

\* \* \* \* \*